US011808891B2

(12) United States Patent
Hall et al.

(10) Patent No.: US 11,808,891 B2
(45) Date of Patent: *Nov. 7, 2023

(54) INTEGRATED LIDAR ILLUMINATION POWER CONTROL

(71) Applicant: VELODYNE LIDAR USA, INC., San Jose, CA (US)

(72) Inventors: David S. Hall, San Jose, CA (US); Raymond Liou, Cupertino, CA (US); Oren Milgrome, Richmond, CA (US); Marius Paul Dumitrean, San Jose, CA (US)

(73) Assignee: Velodyne Lidar USA, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/510,710

(22) Filed: Jul. 12, 2019

(65) Prior Publication Data

US 2020/0191915 A1    Jun. 18, 2020

Related U.S. Application Data

(63) Continuation of application No. 15/941,302, filed on Mar. 30, 2018, now Pat. No. 10,386,465.
(Continued)

(51) Int. Cl.
*G01S 7/481* (2006.01)
*G01S 7/484* (2006.01)
(Continued)

(52) U.S. Cl.
CPC ............ *G01S 7/484* (2013.01); *G01S 7/4814* (2013.01); *H01L 23/528* (2013.01);
(Continued)

(58) Field of Classification Search
CPC ........ G01S 7/484; G01S 7/4814; G01S 17/42; H01L 29/2003; H01L 27/0605;
(Continued)

(56) References Cited

U.S. PATENT DOCUMENTS 3,064,252 A    11/1962   Varela
3,373,441 A    3/1968    Zadig
(Continued)

FOREIGN PATENT DOCUMENTS

CA    2089105 A1    8/1994
CH    641583 A5     2/1984
(Continued)

OTHER PUBLICATIONS

Inter Parties Review Petition for Inter Partes Review of U.S. Pat. No. 7,969,558 (Claims 1-4, 8, and 9) (IPR No. 2018-00255, *Quanergy Systems, Inc. v. Velodyne Lidar, Inc.*) (Nov. 29, 2017), 67 pages. (IPR No. 2018-00255).
(Continued)

*Primary Examiner* — Daniel L Murphy
(74) *Attorney, Agent, or Firm* — Kilpatrick Townsend & Stockton LLP

(57) ABSTRACT

Methods and systems for performing three dimensional LIDAR measurements with an integrated LIDAR measurement device are described herein. In one aspect, a Gallium Nitride (GaN) based illumination driver integrated circuit (IC), an illumination source, and a return signal receiver IC are mounted to a common substrate. The illumination driver IC provides a pulse of electrical power to the illumination source in response to a pulse trigger signal received from the return signal receiver IC. In another aspect, the GaN based illumination driver IC controls the amplitude, ramp rate, and duration of the pulse of electrical power based on command signals communicated from the return signal receiver IC to
(Continued)

the illumination driver IC. In a further aspect, illumination driver IC reduces the amount of electrical power consumed by the illumination driver IC during periods of time when the illumination driver IC is not providing electrical power to the illumination source.

19 Claims, 15 Drawing Sheets

Related U.S. Application Data

(60) Provisional application No. 62/480,119, filed on Mar. 31, 2017.

(51) Int. Cl.
    H01L 23/528      (2006.01)
    H01L 27/06      (2006.01)
    H01L 29/20      (2006.01)
    *H05K 1/18*      (2006.01)
    *G01S 17/42*      (2006.01)

(52) U.S. Cl.
    CPC ...... H01L 27/0605 (2013.01); H01L 27/0629 (2013.01); H01L 29/2003 (2013.01); *G01S 17/42* (2013.01); *H05K 1/181* (2013.01); *H05K 2201/10015* (2013.01); *H05K 2201/10022* (2013.01); *H05K 2201/10106* (2013.01); *H05K 2201/10121* (2013.01); *H05K 2201/10151* (2013.01); *H05K 2201/10166* (2013.01)

(58) Field of Classification Search
CPC ... H01L 23/528; H01L 27/0629; H05K 1/181; H05K 2201/10151; H05K 2201/10166; H05K 2201/10121; H05K 2201/10022; H05K 2201/10015; H05K 2201/10106
USPC .......................................................... 356/5.05
See application file for complete search history.

(56) References Cited

U.S. PATENT DOCUMENTS

| | | |
|---|---|---|
| 3,551,845 A | 12/1970 | Zelina |
| 3,636,250 A | 1/1972 | Haeff |
| 3,686,514 A | 8/1972 | Dube et al. |
| 3,730,633 A | 5/1973 | Kennedy |
| 3,781,111 A | 12/1973 | Fletcher et al. |
| 3,862,415 A | 1/1975 | Harnden, Jr. et al. |
| 3,897,150 A | 7/1975 | Bridges et al. |
| 3,921,081 A * | 11/1975 | Lane ............... H03K 7/08 327/175 |
| 4,179,216 A | 12/1979 | Theurer et al. |
| 4,199,697 A | 4/1980 | Edwards |
| 4,201,442 A | 5/1980 | McMahon et al. |
| 4,212,534 A | 7/1980 | Bodlaj |
| 4,220,103 A | 9/1980 | Kasahara et al. |
| 4,327,437 A | 4/1982 | Frosch et al. |
| 4,477,184 A | 10/1984 | Endo |
| 4,516,837 A | 5/1985 | Soref et al. |
| 4,634,272 A | 1/1987 | Endo |
| 4,656,462 A | 4/1987 | Araki et al. |
| 4,681,433 A | 7/1987 | Aeschlimann |
| 4,700,301 A | 10/1987 | Dyke |
| 4,730,932 A | 3/1988 | Iga et al. |
| 4,742,337 A | 5/1988 | Haag |
| 4,834,531 A | 5/1989 | Ward |
| 4,862,257 A | 8/1989 | Ulich |
| 4,895,440 A | 1/1990 | Cain et al. |
| 4,896,343 A | 1/1990 | Saunders |
| 4,902,126 A | 2/1990 | Koechner |
| 4,916,536 A | 4/1990 | Kerr et al. |
| 4,944,036 A | 7/1990 | Hyatt |
| 4,952,911 A | 8/1990 | D'Ambrosia et al. |
| 4,967,183 A | 10/1990 | D'Ambrosia et al. |
| 5,004,916 A | 4/1991 | Collins, Jr. |
| 5,006,721 A | 4/1991 | Cameron et al. |
| 5,023,888 A | 6/1991 | Bayston |
| 5,026,156 A | 6/1991 | Bayston et al. |
| 5,033,819 A | 7/1991 | Tanaka |
| 5,059,008 A | 10/1991 | Flood et al. |
| 5,175,694 A | 12/1992 | Amato |
| 5,177,768 A | 1/1993 | Crespo et al. |
| 5,210,586 A | 5/1993 | Grage et al. |
| 5,212,533 A | 5/1993 | Shibuya et al. |
| 5,241,315 A | 8/1993 | Spinhirne |
| 5,241,481 A | 8/1993 | Olsen |
| 5,249,157 A | 9/1993 | Taylor |
| 5,291,261 A | 3/1994 | Dahl et al. |
| 5,309,212 A | 5/1994 | Clark |
| 5,314,037 A | 5/1994 | Shaw et al. |
| 5,319,201 A | 6/1994 | Lee |
| 5,357,331 A * | 10/1994 | Flockencier .......... G01S 7/4812 356/5.08 |
| 5,365,218 A | 11/1994 | Otto |
| 5,463,384 A | 10/1995 | Juds |
| 5,465,142 A | 11/1995 | Krumes et al. |
| 5,515,156 A | 5/1996 | Yoshida et al. |
| 5,546,188 A | 8/1996 | Wangler et al. |
| 5,563,706 A | 10/1996 | Shibuya et al. |
| 5,572,219 A | 11/1996 | Silverstein et al. |
| 5,638,163 A | 6/1997 | Nourrcier, Jr. |
| 5,691,687 A | 11/1997 | Kumagai et al. |
| 5,710,417 A | 1/1998 | Joseph et al. |
| 5,742,384 A | 4/1998 | Farmer |
| 5,745,050 A | 4/1998 | Nakagawa |
| 5,757,472 A | 5/1998 | Wangler et al. |
| 5,757,501 A | 5/1998 | Hipp |
| 5,757,677 A | 5/1998 | Lennen |
| 5,789,739 A | 8/1998 | Schwarz |
| 5,793,163 A | 8/1998 | Okuda |
| 5,793,491 A | 8/1998 | Wangler et al. |
| 5,805,468 A | 9/1998 | Blohbaum |
| 5,808,728 A | 9/1998 | Uehara |
| 5,847,815 A | 12/1998 | Albouy et al. |
| 5,847,817 A | 12/1998 | Zediker et al. |
| 5,877,688 A | 3/1999 | Morinaka et al. |
| 5,889,479 A | 3/1999 | Tabel |
| 5,895,984 A | 4/1999 | Renz |
| 5,903,355 A | 5/1999 | Schwarz |
| 5,903,386 A | 5/1999 | Mantravadi et al. |
| 5,923,910 A | 7/1999 | Nakahara et al. |
| 5,942,688 A | 8/1999 | Kimura et al. |
| 5,949,530 A | 9/1999 | Wetteborn |
| 5,953,110 A | 9/1999 | Burns |
| 5,991,011 A | 11/1999 | Damm |
| 6,034,803 A | 3/2000 | Sullivan et al. |
| 6,043,868 A | 3/2000 | Dunne |
| 6,069,565 A | 5/2000 | Stern et al. |
| 6,088,085 A | 7/2000 | Wetteborn |
| 6,091,071 A | 7/2000 | Franz et al. |
| 6,100,539 A | 8/2000 | Blumcke et al. |
| 6,137,566 A | 10/2000 | Leonard et al. |
| 6,153,878 A | 11/2000 | Jakob et al. |
| 6,157,294 A | 12/2000 | Urai et al. |
| 6,201,236 B1 | 3/2001 | Juds |
| 6,259,714 B1 | 7/2001 | Kinbara |
| 6,297,844 B1 | 10/2001 | Schatz et al. |
| 6,321,172 B1 | 11/2001 | Jakob et al. |
| 6,327,806 B1 | 12/2001 | Paige |
| 6,329,800 B1 | 12/2001 | May |
| 6,335,789 B1 | 1/2002 | Kikuchi |
| 6,365,429 B1 | 4/2002 | Kneissl et al. |
| 6,396,577 B1 | 5/2002 | Ramstack |
| 6,420,698 B1 | 7/2002 | Dimsdale |
| 6,441,363 B1 | 8/2002 | Cook, Jr. et al. |
| 6,441,889 B1 | 8/2002 | Patterson |
| 6,442,476 B1 | 8/2002 | Poropat |
| 6,473,079 B1 | 10/2002 | Kacyra et al. |
| 6,504,712 B2 | 1/2003 | Hashimoto et al. |
| 6,509,958 B2 | 1/2003 | Pierenkemper |

(56) References Cited

U.S. PATENT DOCUMENTS

| | | | |
|---|---|---|---|
| 6,593,582 B2 | 7/2003 | Lee et al. |
| 6,621,764 B1 | 9/2003 | Smith |
| 6,636,300 B2 | 10/2003 | Doemens et al. |
| 6,646,725 B1 | 11/2003 | Eichinger et al. |
| 6,650,402 B2 | 11/2003 | Sullivan et al. |
| 6,664,529 B2 | 12/2003 | Pack et al. |
| 6,665,063 B2 | 12/2003 | Jamieson et al. |
| 6,670,905 B1 | 12/2003 | Orr |
| 6,682,478 B2 | 1/2004 | Nakamura |
| 6,687,033 B2 | 2/2004 | Pierenkemper |
| 6,687,373 B1 | 2/2004 | Yeh et al. |
| 6,710,324 B2 | 3/2004 | Hipp |
| 6,742,707 B1 | 6/2004 | Tsikos et al. |
| 6,747,747 B2 | 6/2004 | Hipp |
| 6,759,649 B2 | 7/2004 | Hipp |
| 6,789,527 B2 | 9/2004 | Sauler et al. |
| 6,798,527 B2 | 9/2004 | Fukumoto et al. |
| 6,812,450 B2 | 11/2004 | Hipp |
| 6,876,790 B2 | 4/2005 | Lee |
| 6,879,419 B2 | 4/2005 | Richman et al. |
| 6,969,558 B2 | 11/2005 | Walston et al. |
| 7,030,968 B2 | 4/2006 | D'Aligny et al. |
| 7,041,962 B2 | 5/2006 | Dollmann et al. |
| 7,089,114 B1 | 8/2006 | Huang |
| 7,106,424 B2 | 9/2006 | Meneely et al. |
| 7,129,971 B2 | 10/2006 | McCutchen |
| 7,130,672 B2 | 10/2006 | Pewzner et al. |
| 7,131,586 B2 | 11/2006 | Tsikos et al. |
| 7,190,465 B2 | 3/2007 | Froehlich et al. |
| 7,240,314 B1 | 7/2007 | Leung |
| 7,248,342 B1 | 7/2007 | Degnan |
| 7,281,891 B2 | 10/2007 | Smith et al. |
| 7,295,298 B2 | 11/2007 | Willhoeft et al. |
| 7,313,424 B2 | 12/2007 | Mayevsky et al. |
| 7,315,377 B2 | 1/2008 | Holland et al. |
| 7,319,777 B2 | 1/2008 | Morcom |
| 7,345,271 B2 | 3/2008 | Boehlau et al. |
| 7,358,819 B2 | 4/2008 | Rollins |
| 7,373,473 B2 | 5/2008 | Bukowski et al. |
| 7,388,655 B2 | 6/2008 | Mori |
| 7,408,462 B2 | 8/2008 | Pirkl et al. |
| 7,477,360 B2 | 1/2009 | England et al. |
| 7,480,031 B2 | 1/2009 | Mack |
| 7,544,945 B2 | 6/2009 | Tan et al. |
| 7,570,793 B2 | 8/2009 | Lages et al. |
| 7,583,364 B1 | 9/2009 | Mayor et al. |
| 7,589,826 B2 | 9/2009 | Mack et al. |
| 7,619,477 B2 | 11/2009 | Segarra |
| 7,623,222 B2 | 11/2009 | Benz et al. |
| 7,640,068 B2 | 12/2009 | Johnson et al. |
| 7,642,946 B2 | 1/2010 | Wong et al. |
| 7,684,590 B2 | 3/2010 | Kampchen et al. |
| 7,697,581 B2 | 4/2010 | Walsh et al. |
| 7,741,618 B2 | 6/2010 | Lee et al. |
| 7,746,271 B2 | 6/2010 | Furstenberg |
| 7,868,665 B2 | 1/2011 | Tumer et al. |
| 7,944,548 B2 | 5/2011 | Eaton |
| 7,969,558 B2 * | 6/2011 | Hall ..................... G01S 7/4813 356/5.01 |
| 8,031,331 B2 | 10/2011 | Meier et al. |
| 8,042,056 B2 | 10/2011 | Wheeler et al. |
| 8,072,582 B2 | 12/2011 | Meneely |
| 8,077,047 B2 | 12/2011 | Humble et al. |
| 8,107,056 B1 | 1/2012 | Riza |
| 8,139,685 B2 | 3/2012 | Simic et al. |
| 8,203,702 B1 | 6/2012 | Kane et al. |
| 8,274,037 B2 | 9/2012 | Ritter et al. |
| 8,310,653 B2 | 11/2012 | Ogawa et al. |
| 8,451,432 B2 | 5/2013 | Crawford et al. |
| 8,519,378 B2 | 8/2013 | Hiruma et al. |
| 8,605,262 B2 | 12/2013 | Campbell et al. |
| 8,675,181 B2 | 3/2014 | Hall |
| 8,736,818 B2 | 5/2014 | Weimer et al. |
| 8,767,190 B2 | 7/2014 | Hall |
| 8,875,409 B2 | 11/2014 | Kretschmer et al. |
| 8,976,340 B2 | 3/2015 | Gilliland et al. |
| 8,995,478 B1 | 3/2015 | Kobtsev et al. |
| 9,059,562 B2 | 6/2015 | Priest et al. |
| 9,063,549 B1 | 6/2015 | Pennecot et al. |
| 9,069,061 B1 | 6/2015 | Harwit |
| 9,069,080 B2 | 6/2015 | Stettner et al. |
| 9,086,273 B1 | 7/2015 | Gruver et al. |
| 9,093,969 B2 | 7/2015 | Gebeyehu et al. |
| 9,110,154 B1 | 8/2015 | Bates et al. |
| 9,128,190 B1 | 9/2015 | Ulrich et al. |
| 9,151,940 B2 | 10/2015 | Chuang et al. |
| 9,191,260 B1 | 11/2015 | Grund |
| 9,194,701 B2 | 11/2015 | Bosch |
| RE45,854 E | 1/2016 | Gittinger et al. |
| 9,239,959 B1 | 1/2016 | Evans et al. |
| 9,246,041 B1 | 1/2016 | Clausen et al. |
| 9,250,327 B2 | 2/2016 | Kelley et al. |
| 9,285,477 B1 | 3/2016 | Smith et al. |
| 9,286,538 B1 | 3/2016 | Chen et al. |
| 9,310,197 B2 | 4/2016 | Gogolla et al. |
| 9,383,753 B1 | 7/2016 | Templeton et al. |
| 9,453,914 B2 | 9/2016 | Stettner et al. |
| 9,529,079 B1 | 12/2016 | Droz et al. |
| 9,634,156 B2 * | 4/2017 | Pavlov ..................... H01L 21/04 |
| 9,660,639 B2 * | 5/2017 | Roberts ................. H03K 17/162 |
| 9,735,885 B1 | 8/2017 | Sayyah et al. |
| 9,772,607 B2 | 9/2017 | Decoux et al. |
| 9,778,362 B2 | 10/2017 | Rondeau et al. |
| RE46,672 E | 1/2018 | Hall |
| 9,964,632 B1 | 5/2018 | Droz et al. |
| 9,983,297 B2 | 5/2018 | Hall et al. |
| 9,989,629 B1 | 6/2018 | LaChapelle |
| 10,003,168 B1 | 6/2018 | Villeneuve |
| 10,018,726 B2 | 7/2018 | Hall et al. |
| 10,048,374 B2 | 8/2018 | Hall et al. |
| 10,094,925 B1 | 10/2018 | LaChapelle |
| 10,109,183 B1 | 10/2018 | Franz et al. |
| 10,120,079 B2 | 11/2018 | Pennecot et al. |
| 10,126,412 B2 | 11/2018 | Eldada et al. |
| 10,132,928 B2 | 11/2018 | Eldada et al. |
| 10,244,187 B2 | 3/2019 | Stettner et al. |
| 10,309,213 B2 | 6/2019 | Barfoot et al. |
| 10,330,780 B2 | 6/2019 | Hall et al. |
| 10,386,465 B2 * | 8/2019 | Hall ..................... H01L 29/2003 |
| 10,393,874 B2 * | 8/2019 | Schmidtke ............ G01S 7/4811 |
| 10,393,877 B2 | 8/2019 | Hall et al. |
| 10,436,904 B2 | 10/2019 | Moss et al. |
| 10,545,222 B2 * | 1/2020 | Hall ..................... G01S 7/4876 |
| RE47,942 E | 4/2020 | Hall |
| 10,613,203 B1 | 4/2020 | Rekow et al. |
| 10,627,490 B2 | 4/2020 | Hall et al. |
| 10,627,491 B2 | 4/2020 | Hall et al. |
| 10,712,434 B2 * | 7/2020 | Hall ..................... G01S 7/4865 |
| 10,754,034 B1 | 8/2020 | Chamberlain et al. |
| 10,782,392 B2 | 9/2020 | Ishikawa et al. |
| 10,983,218 B2 | 4/2021 | Hall et al. |
| 11,073,617 B2 | 7/2021 | Hall et al. |
| 11,137,480 B2 | 10/2021 | Hall et al. |
| 2001/0011289 A1 | 8/2001 | Davis et al. |
| 2001/0017718 A1 | 8/2001 | Ikeda et al. |
| 2001/0035946 A1 | 11/2001 | Nakase et al. |
| 2002/0003617 A1 | 1/2002 | Doemens et al. |
| 2002/0060784 A1 | 5/2002 | Pack et al. |
| 2002/0109074 A1 * | 8/2002 | Uchida ............. H01L 31/02327 250/214.1 |
| 2002/0117545 A1 | 8/2002 | Tsikos et al. |
| 2002/0175294 A1 | 11/2002 | Lee et al. |
| 2003/0041079 A1 | 2/2003 | Bellemore et al. |
| 2003/0043363 A1 | 3/2003 | Jamieson et al. |
| 2003/0043364 A1 | 3/2003 | Jamieson et al. |
| 2003/0057533 A1 | 3/2003 | Lemmi et al. |
| 2003/0066977 A1 | 4/2003 | Hipp et al. |
| 2003/0076485 A1 | 4/2003 | Ruff et al. |
| 2003/0090646 A1 | 5/2003 | Riegl et al. |
| 2003/0163030 A1 | 8/2003 | Arriaga |
| 2004/0021852 A1 | 2/2004 | DeFlumere |
| 2004/0066500 A1 | 4/2004 | Gokturk et al. |
| 2004/0134879 A1 | 7/2004 | Kochergin et al. |
| 2004/0150810 A1 | 8/2004 | Muenter et al. |

(56) References Cited

U.S. PATENT DOCUMENTS

| | | |
|---|---|---|
| 2004/0213463 A1 | 10/2004 | Morrison |
| 2004/0240706 A1 | 12/2004 | Wallace et al. |
| 2004/0240710 A1 | 12/2004 | Lages et al. |
| 2004/0247157 A1 | 12/2004 | Lages et al. |
| 2005/0023353 A1 | 2/2005 | Tsikos et al. |
| 2005/0168720 A1 | 8/2005 | Yamashita et al. |
| 2005/0211893 A1 | 9/2005 | Paschalidis |
| 2005/0232466 A1 | 10/2005 | Kampchen et al. |
| 2005/0246065 A1 | 11/2005 | Ricard |
| 2005/0248749 A1 | 11/2005 | Kiehn et al. |
| 2005/0279914 A1 | 12/2005 | Dimsdale et al. |
| 2006/0007350 A1 | 1/2006 | Gao et al. |
| 2006/0027404 A1 | 2/2006 | Foxlin |
| 2006/0073621 A1 | 4/2006 | Kneissel et al. |
| 2006/0089765 A1 | 4/2006 | Pack et al. |
| 2006/0100783 A1 | 5/2006 | Haberer et al. |
| 2006/0115113 A1 | 6/2006 | Lages et al. |
| 2006/0132635 A1 | 6/2006 | Land |
| 2006/0176697 A1 | 8/2006 | Arruda |
| 2006/0186326 A1 | 8/2006 | Ito |
| 2006/0197867 A1 | 9/2006 | Johnson et al. |
| 2006/0231771 A1 | 10/2006 | Lee et al. |
| 2006/0290920 A1 | 12/2006 | Kampchen et al. |
| 2007/0035624 A1 | 2/2007 | Lubard et al. |
| 2007/0071056 A1 | 3/2007 | Chen |
| 2007/0121095 A1 | 5/2007 | Lewis |
| 2007/0181810 A1 | 8/2007 | Tan et al. |
| 2007/0201027 A1 | 8/2007 | Doushkina et al. |
| 2007/0219720 A1 | 9/2007 | Trepagnier et al. |
| 2007/0241955 A1 | 10/2007 | Brosche |
| 2007/0272841 A1 | 11/2007 | Wiklof |
| 2008/0002176 A1 | 1/2008 | Krasutsky |
| 2008/0009965 A1 | 1/2008 | Bruemmer et al. |
| 2008/0013896 A1 | 1/2008 | Salzberg et al. |
| 2008/0074640 A1 | 3/2008 | Walsh et al. |
| 2008/0079371 A1 | 4/2008 | Kang et al. |
| 2008/0136626 A1 | 6/2008 | Hudson et al. |
| 2008/0154495 A1 | 6/2008 | Breed |
| 2008/0170826 A1 | 7/2008 | Schaafsma |
| 2008/0186501 A1 | 8/2008 | Xie |
| 2008/0302971 A1 | 12/2008 | Hyde et al. |
| 2009/0010644 A1 | 1/2009 | Varshneya et al. |
| 2009/0026503 A1 | 1/2009 | Tsuda |
| 2009/0085901 A1 | 4/2009 | Antony |
| 2009/0122295 A1 | 5/2009 | Eaton |
| 2009/0142053 A1 | 6/2009 | Varshneya et al. |
| 2009/0168045 A1 | 7/2009 | Lin et al. |
| 2009/0218475 A1 | 9/2009 | Kawakami et al. |
| 2009/0245788 A1 | 10/2009 | Varshneya et al. |
| 2009/0299633 A1 | 12/2009 | Hawes et al. |
| 2009/0323737 A1 | 12/2009 | Ensher et al. |
| 2010/0006760 A1 | 1/2010 | Lee et al. |
| 2010/0020306 A1 | 1/2010 | Hall |
| 2010/0045965 A1 | 2/2010 | Meneely |
| 2010/0046953 A1 | 2/2010 | Shaw et al. |
| 2010/0067070 A1 | 3/2010 | Mamada et al. |
| 2010/0073780 A1 | 3/2010 | Ito |
| 2010/0074532 A1 | 3/2010 | Gordon et al. |
| 2010/0134596 A1 | 6/2010 | Becker |
| 2010/0188722 A1 | 7/2010 | Yamada et al. |
| 2010/0198487 A1 | 8/2010 | Vollmer et al. |
| 2010/0204964 A1 | 8/2010 | Pack et al. |
| 2010/0239139 A1 | 9/2010 | Hunt et al. |
| 2010/0258708 A1 | 10/2010 | Meyers et al. |
| 2010/0265077 A1 | 10/2010 | Humble et al. |
| 2010/0271615 A1 | 10/2010 | Sebastian et al. |
| 2010/0302528 A1 | 12/2010 | Hall |
| 2011/0028859 A1 | 2/2011 | Chian |
| 2011/0040482 A1 | 2/2011 | Brimble et al. |
| 2011/0176183 A1 | 7/2011 | Ikeda et al. |
| 2011/0211188 A1 | 9/2011 | Juenemann et al. |
| 2011/0216304 A1 | 9/2011 | Hall |
| 2011/0228068 A1 | 9/2011 | Park |
| 2011/0228073 A1 | 9/2011 | Lee et al. |
| 2011/0235018 A1 | 9/2011 | Mori et al. |
| 2011/0280265 A1* | 11/2011 | Desbiens .............. H01S 5/0428 372/38.02 |
| 2011/0305250 A1 | 12/2011 | Chann et al. |
| 2012/0038903 A1 | 2/2012 | Weimer et al. |
| 2012/0173185 A1 | 7/2012 | Taylor et al. |
| 2012/0195597 A1 | 8/2012 | Malaney |
| 2012/0287417 A1 | 11/2012 | Mimeault |
| 2013/0024176 A2 | 1/2013 | Woodford |
| 2013/0038915 A1 | 2/2013 | Kusaka et al. |
| 2013/0050144 A1 | 2/2013 | Reynolds |
| 2013/0050486 A1 | 2/2013 | Omer et al. |
| 2013/0070239 A1 | 3/2013 | Crawford et al. |
| 2013/0093583 A1 | 4/2013 | Shapiro |
| 2013/0094960 A1 | 4/2013 | Bowyer et al. |
| 2013/0151198 A1 | 6/2013 | Brown |
| 2013/0168673 A1 | 7/2013 | Yu et al. |
| 2013/0206967 A1 | 8/2013 | Shpunt et al. |
| 2013/0241761 A1 | 9/2013 | Cooper et al. |
| 2013/0242283 A1 | 9/2013 | Bailey et al. |
| 2013/0258312 A1 | 10/2013 | Lewis |
| 2013/0286404 A1 | 10/2013 | Cenko et al. |
| 2013/0300479 A1 | 11/2013 | Thibault |
| 2013/0314711 A1 | 11/2013 | Cantin et al. |
| 2013/0336375 A1 | 12/2013 | Ranki et al. |
| 2013/0342366 A1 | 12/2013 | Kiefer et al. |
| 2014/0043309 A1 | 2/2014 | Go et al. |
| 2014/0063189 A1 | 3/2014 | Zheleznyak et al. |
| 2014/0063483 A1 | 3/2014 | Li |
| 2014/0071234 A1 | 3/2014 | Millett |
| 2014/0078519 A1 | 3/2014 | Steffey et al. |
| 2014/0104592 A1 | 4/2014 | Tien et al. |
| 2014/0152975 A1 | 6/2014 | Ko |
| 2014/0176657 A1 | 6/2014 | Nemoto |
| 2014/0240317 A1 | 8/2014 | Go et al. |
| 2014/0240721 A1 | 8/2014 | Herschbach |
| 2014/0253369 A1 | 9/2014 | Kelley et al. |
| 2014/0259715 A1 | 9/2014 | Engel |
| 2014/0267848 A1 | 9/2014 | Wu |
| 2014/0274093 A1 | 9/2014 | Abdelmonem |
| 2014/0293263 A1 | 10/2014 | Justice et al. |
| 2014/0347650 A1 | 11/2014 | Bosch |
| 2015/0002852 A1 | 1/2015 | de Groot et al. |
| 2015/0015895 A1 | 1/2015 | Bridges et al. |
| 2015/0035437 A1 | 2/2015 | Panopoulos et al. |
| 2015/0055117 A1 | 2/2015 | Pennecot et al. |
| 2015/0101234 A1 | 4/2015 | Priest et al. |
| 2015/0116695 A1 | 4/2015 | Bartolome et al. |
| 2015/0131080 A1 | 5/2015 | Retterath et al. |
| 2015/0144806 A1 | 5/2015 | Jin et al. |
| 2015/0185325 A1 | 7/2015 | Park et al. |
| 2015/0202939 A1 | 7/2015 | Stettner et al. |
| 2015/0219764 A1 | 8/2015 | Lipson |
| 2015/0219765 A1 | 8/2015 | Mead et al. |
| 2015/0226853 A1 | 8/2015 | Seo et al. |
| 2015/0260843 A1 | 9/2015 | Lewis |
| 2015/0293224 A1 | 10/2015 | Eldada et al. |
| 2015/0293228 A1 | 10/2015 | Retterath et al. |
| 2015/0303216 A1 | 10/2015 | Tamaru |
| 2015/0316368 A1 | 11/2015 | Moench et al. |
| 2015/0346325 A1 | 12/2015 | Giacotto et al. |
| 2016/0003946 A1 | 1/2016 | Gilliland et al. |
| 2016/0009410 A1 | 1/2016 | Derenick et al. |
| 2016/0014309 A1 | 1/2016 | Ellison et al. |
| 2016/0021713 A1 | 1/2016 | Reed |
| 2016/0041266 A1 | 2/2016 | Smits |
| 2016/0049058 A1 | 2/2016 | Allen et al. |
| 2016/0079854 A1 | 3/2016 | Kinzer et al. |
| 2016/0098620 A1 | 4/2016 | Geile |
| 2016/0117431 A1 | 4/2016 | Kim et al. |
| 2016/0154105 A1 | 6/2016 | Sigmund et al. |
| 2016/0161600 A1 | 6/2016 | Eldada et al. |
| 2016/0191173 A1 | 6/2016 | Malaney |
| 2016/0209499 A1 | 7/2016 | Suzuki |
| 2016/0210487 A1 | 7/2016 | Jiang |
| 2016/0245919 A1 | 8/2016 | Kalscheur et al. |
| 2016/0259038 A1 | 9/2016 | Retterath et al. |
| 2016/0279808 A1* | 9/2016 | Doughty .............. G01D 5/34738 |
| 2016/0300484 A1 | 10/2016 | Torbett |
| 2016/0306032 A1 | 10/2016 | Schwarz et al. |

(56) References Cited

U.S. PATENT DOCUMENTS

| | | | |
|---|---|---|---|
| 2016/0313445 A1 | 10/2016 | Bailey et al. |
| 2016/0327646 A1 | 11/2016 | Scheim et al. |
| 2016/0345820 A1 | 12/2016 | Frisken et al. |
| 2016/0363659 A1 | 12/2016 | Mindell et al. |
| 2016/0365846 A1 | 12/2016 | Wyland |
| 2017/0005465 A1 | 1/2017 | Wyland et al. |
| 2017/0026633 A1 | 1/2017 | Riza |
| 2017/0146639 A1 | 5/2017 | Carothers |
| 2017/0146640 A1 | 5/2017 | Hall et al. |
| 2017/0153319 A1 | 6/2017 | Villeneuve et al. |
| 2017/0214861 A1 | 7/2017 | Rachlin et al. |
| 2017/0219695 A1 | 8/2017 | Hall et al. |
| 2017/0219713 A1 | 8/2017 | Gruver et al. |
| 2017/0220876 A1 | 8/2017 | Gao et al. |
| 2017/0242102 A1 | 8/2017 | Dussan et al. |
| 2017/0269198 A1 | 9/2017 | Hall et al. |
| 2017/0269209 A1 | 9/2017 | Hall et al. |
| 2017/0269215 A1 | 9/2017 | Hall et al. |
| 2017/0293810 A1 | 10/2017 | Allen et al. |
| 2017/0299721 A1 | 10/2017 | Eichenholz et al. |
| 2017/0307736 A1 | 10/2017 | Donovan |
| 2017/0328992 A1 | 11/2017 | Baik et al. |
| 2017/0329010 A1 | 11/2017 | Warke et al. |
| 2017/0350983 A1 | 12/2017 | Hall et al. |
| 2018/0019155 A1 | 1/2018 | Tsang et al. |
| 2018/0058197 A1 | 3/2018 | Barfoot et al. |
| 2018/0059219 A1 | 3/2018 | Irish et al. |
| 2018/0074382 A1 | 3/2018 | Lee et al. |
| 2018/0081041 A1 | 3/2018 | Niclass et al. |
| 2018/0100924 A1 | 4/2018 | Brinkmeyer |
| 2018/0106902 A1 | 4/2018 | Mase et al. |
| 2018/0168539 A1 | 6/2018 | Singh et al. |
| 2018/0188360 A1 | 7/2018 | Berger et al. |
| 2018/0261975 A1* | 9/2018 | Pavlov ................ H01S 5/06825 |
| 2018/0267151 A1 | 9/2018 | Hall et al. |
| 2018/0275249 A1 | 9/2018 | Campbell et al. |
| 2018/0284227 A1 | 10/2018 | Hall et al. |
| 2018/0284274 A1 | 10/2018 | LaChapelle |
| 2018/0284741 A1 | 10/2018 | Cella et al. |
| 2018/0321360 A1 | 11/2018 | Hall et al. |
| 2018/0329066 A1 | 11/2018 | Pacala |
| 2018/0364098 A1 | 12/2018 | McDaniel et al. |
| 2019/0001442 A1 | 1/2019 | Unrath et al. |
| 2019/0011563 A1 | 1/2019 | Hall et al. |
| 2019/0056498 A1 | 2/2019 | Sonn et al. |
| 2019/0178991 A1 | 6/2019 | Hall et al. |
| 2019/0258251 A1 | 8/2019 | Ditty et al. |
| 2019/0293764 A1 | 9/2019 | Van Nieuwenhove et al. |
| 2019/0302266 A9 | 10/2019 | Hall et al. |
| 2019/0339365 A1 | 11/2019 | Hall et al. |
| 2019/0361092 A1 | 11/2019 | Hall et al. |
| 2019/0369257 A1 | 12/2019 | Hall et al. |
| 2019/0369258 A1 | 12/2019 | Hall et al. |
| 2020/0025879 A1 | 1/2020 | Pacala et al. |
| 2020/0025896 A1* | 1/2020 | Gunnam ................ G01S 7/4868 |
| 2020/0064452 A1 | 2/2020 | Avlas et al. |
| 2020/0088851 A1* | 3/2020 | Hall ........................ G01S 17/10 |
| 2020/0142070 A1 | 5/2020 | Hall et al. |
| 2020/0144971 A1 | 5/2020 | Pinto et al. |
| 2020/0166613 A1 | 5/2020 | Hall et al. |
| 2020/0191915 A1 | 6/2020 | Hall et al. |
| 2020/0249321 A1 | 8/2020 | Hall et al. |
| 2020/0292678 A1* | 9/2020 | Hall ........................ G01S 7/4865 |
| 2020/0319311 A1 | 10/2020 | Hall et al. |
| 2020/0319343 A1 | 10/2020 | Hall et al. |
| 2020/0348401 A1* | 11/2020 | Hall ........................ G01S 7/487 |
| 2022/0026575 A1 | 1/2022 | Hall et al. |

FOREIGN PATENT DOCUMENTS

| | | |
|---|---|---|
| CN | 1106534 A | 8/1995 |
| CN | 1576123 A | 2/2005 |
| CN | 2681085 Y | 2/2005 |
| CN | 2773714 Y | 4/2006 |
| CN | 103278808 B | 12/2015 |
| CN | 206773192 U | 12/2017 |
| CN | 106443699 B | 2/2019 |
| CN | 106597471 B | 5/2019 |
| CN | 208902906 U | 5/2019 |
| DE | 930909 C | 7/1955 |
| DE | 3134815 A1 | 3/1983 |
| DE | 3216312 A1 | 11/1983 |
| DE | 3216313 A1 | 11/1983 |
| DE | 3701340 A1 | 7/1988 |
| DE | 3741259 A1 | 6/1989 |
| DE | 3808972 A1 | 10/1989 |
| DE | 3821892 C1 | 2/1990 |
| DE | 4040894 C1 | 4/1992 |
| DE | 4115747 A1 | 11/1992 |
| DE | 4124192 A1 | 1/1993 |
| DE | 4127168 A1 | 2/1993 |
| DE | 4137550 A1 | 3/1993 |
| DE | 4215272 A1 | 11/1993 |
| DE | 4243631 A1 | 6/1994 |
| DE | 4340756 A1 | 6/1994 |
| DE | 4411448 A1 | 10/1995 |
| DE | 4412044 A1 | 10/1995 |
| DE | 19512644 A1 | 10/1996 |
| DE | 19512681 A1 | 10/1996 |
| DE | 4345446 C2 | 7/1998 |
| DE | 19727792 A1 | 2/1999 |
| DE | 19741730 A1 | 4/1999 |
| DE | 19741731 A1 | 4/1999 |
| DE | 19752145 A1 | 5/1999 |
| DE | 19717399 A1 | 6/1999 |
| DE | 19757847 A1 | 7/1999 |
| DE | 19757848 A1 | 7/1999 |
| DE | 19757849 A1 | 7/1999 |
| DE | 19757840 C1 | 9/1999 |
| DE | 19815149 A1 | 10/1999 |
| DE | 19828000 A1 | 1/2000 |
| DE | 19902903 C1 | 5/2000 |
| DE | 19911375 A1 | 9/2000 |
| DE | 19919925 A1 | 11/2000 |
| DE | 19927501 A1 | 11/2000 |
| DE | 19936440 A1 | 3/2001 |
| DE | 19953006 A1 | 5/2001 |
| DE | 19953007 A1 | 5/2001 |
| DE | 19953009 A1 | 5/2001 |
| DE | 19953010 A1 | 5/2001 |
| DE | 10025511 C1 | 12/2001 |
| DE | 10110420 A1 | 9/2002 |
| DE | 10114362 A1 | 10/2002 |
| DE | 10127417 A1 | 12/2002 |
| DE | 10128954 A1 | 12/2002 |
| DE | 10141055 A1 | 3/2003 |
| DE | 10143060 A1 | 3/2003 |
| DE | 10146692 A1 | 4/2003 |
| DE | 10148070 A1 | 4/2003 |
| DE | 10151983 A1 | 4/2003 |
| DE | 10162668 A1 | 7/2003 |
| DE | 10217295 A1 | 11/2003 |
| DE | 10222797 A1 | 12/2003 |
| DE | 10229408 A1 | 1/2004 |
| DE | 10244638 A1 | 4/2004 |
| DE | 10244640 A1 | 4/2004 |
| DE | 10244643 A1 | 4/2004 |
| DE | 10258794 A1 | 6/2004 |
| DE | 10303015 A1 | 8/2004 |
| DE | 10331529 A1 | 1/2005 |
| DE | 10341548 A1 | 3/2005 |
| DE | 102004010197 A1 | 9/2005 |
| DE | 102004014041 A1 | 10/2005 |
| DE | 102005050824 A1 | 5/2006 |
| DE | 102005003827 A1 | 7/2006 |
| DE | 102005019233 A1 | 11/2006 |
| DE | 102007013023 A1 | 9/2008 |
| DE | 202015009250 U1 | 1/2017 |
| EP | 0185816 A1 | 7/1986 |
| EP | 0361188 A2 | 4/1990 |
| EP | 0396865 A2 | 11/1990 |
| EP | 0412395 A1 | 2/1991 |
| EP | 0412398 A1 | 2/1991 |
| EP | 0412399 A1 | 2/1991 |

(56) References Cited

FOREIGN PATENT DOCUMENTS

| | | |
|---|---|---|
| EP | 0412400 A1 | 2/1991 |
| EP | 0468175 A2 | 1/1992 |
| EP | 0486430 A2 | 5/1992 |
| EP | 0653720 A2 | 5/1995 |
| EP | 0656868 A1 | 6/1995 |
| EP | 0897120 A2 | 2/1999 |
| EP | 0913707 A1 | 5/1999 |
| EP | 0937996 A2 | 8/1999 |
| EP | 0967492 A1 | 12/1999 |
| EP | 1046938 A2 | 10/2000 |
| EP | 1055937 A2 | 11/2000 |
| EP | 1148345 A1 | 10/2001 |
| EP | 1160718 A2 | 12/2001 |
| EP | 1174733 A2 | 1/2002 |
| EP | 1267177 A1 | 12/2002 |
| EP | 1267178 A1 | 12/2002 |
| EP | 1286178 A2 | 2/2003 |
| EP | 1286181 A1 | 2/2003 |
| EP | 1288677 A2 | 3/2003 |
| EP | 1291673 A2 | 3/2003 |
| EP | 1291674 A2 | 3/2003 |
| EP | 1298012 A2 | 4/2003 |
| EP | 1298453 A2 | 4/2003 |
| EP | 1298454 A2 | 4/2003 |
| EP | 1300715 A2 | 4/2003 |
| EP | 1302784 A2 | 4/2003 |
| EP | 1304583 A2 | 4/2003 |
| EP | 1306690 A2 | 5/2003 |
| EP | 1308747 A2 | 5/2003 |
| EP | 1355128 A1 | 10/2003 |
| EP | 1403657 A1 | 3/2004 |
| EP | 1408318 A1 | 4/2004 |
| EP | 1418444 A1 | 5/2004 |
| EP | 1460454 A2 | 9/2004 |
| EP | 1475764 A2 | 11/2004 |
| EP | 1515157 A1 | 3/2005 |
| EP | 1531342 A1 | 5/2005 |
| EP | 1531343 A1 | 5/2005 |
| EP | 1548351 A2 | 6/2005 |
| EP | 1557691 A1 | 7/2005 |
| EP | 1557692 A1 | 7/2005 |
| EP | 1557693 A1 | 7/2005 |
| EP | 1557694 A1 | 7/2005 |
| EP | 1700763 A2 | 9/2006 |
| EP | 1914564 A1 | 4/2008 |
| EP | 1927867 A1 | 6/2008 |
| EP | 1939652 A1 | 7/2008 |
| EP | 1947377 A1 | 7/2008 |
| EP | 1983354 A1 | 10/2008 |
| EP | 2003471 A1 | 12/2008 |
| EP | 2177931 A2 | 4/2010 |
| EP | 2503360 A1 | 9/2012 |
| GB | 2041687 A | 9/1980 |
| JP | H05240940 A | 9/1993 |
| JP | H03-006407 | 2/1994 |
| JP | H6-288725 A | 10/1994 |
| JP | H07-167609 A | 7/1995 |
| JP | 11264871 | 9/1999 |
| JP | 2001216592 A | 8/2001 |
| JP | 2001-256576 A | 9/2001 |
| JP | 2002-031528 A | 1/2002 |
| JP | 2003-336447 A | 11/2003 |
| JP | 2004-348575 A | 12/2004 |
| JP | 2005-070840 A | 3/2005 |
| JP | 2005-297863 A | 10/2005 |
| JP | 2006-177843 A | 7/2006 |
| JP | 2011-069726 A | 4/2011 |
| JP | 2014-190736 A | 10/2014 |
| JP | 2015-169491 A | 9/2015 |
| WO | WO-1999/003080 A1 | 1/1999 |
| WO | WO-2000/025089 A1 | 5/2000 |
| WO | WO-01/31608 A1 | 5/2001 |
| WO | WO-03/019234 A1 | 3/2003 |
| WO | WO-03/040755 A1 | 5/2003 |
| WO | WO-2004/019293 A2 | 3/2004 |
| WO | WO-2004/036245 A2 | 4/2004 |
| WO | WO-2008/008970 A2 | 1/2008 |
| WO | WO-2009/120706 A2 | 10/2009 |
| WO | WO-2012/153309 A2 | 11/2012 |
| WO | WO-2013/191133 A1 | 12/2013 |
| WO | WO-2015/079300 A1 | 6/2015 |
| WO | WO-2015/104572 A1 | 7/2015 |
| WO | WO-2016/162568 A1 | 10/2016 |
| WO | WO-2017/033419 A1 | 3/2017 |
| WO | WO-2017/089063 A1 | 6/2017 |
| WO | WO-2017/132703 A1 | 8/2017 |
| WO | WO-2017/164989 A1 | 9/2017 |
| WO | WO-2017/165316 A1 | 9/2017 |
| WO | WO-2017/193269 A1 | 11/2017 |
| WO | WO-2018/125823 A1 | 7/2018 |
| WO | WO-2018/196001 A1 | 11/2018 |
| WO | WO-2020001535 A1 * | 1/2020 |

OTHER PUBLICATIONS

Inter Parties Review Replacement Petition for Inter Partes Review of U.S. Pat. No. 7,969,558 (Claims 1-4, 8, and 9), 71 pages. (IPR No. 2018-00255).

Inter Parties Review Patent Owner's Preliminary Response (Public Version—Redacted) (Mar. 7, 2018), 72 pages. (IPR No. 2018-00255).

Inter Parties Review Decision: Institution of Inter Partes Review (May 25, 2018), 11 pages. (IPR No. 2018-00255).

Inter Parties Review Petitioner's Motion to Submit Supplemental Information Pursuant to 37 C.F.R. § 42.123(b) (Aug. 6, 2018), 16 pages. (IPR No. 2018-00255).

Inter Parties Review Decision: Petitioner's Motion to Submit Supplemental Information Pursuant to 37 C.F.R. § 42.123(b) (Aug. 8, 2018), 4 pages. (IPR No. 2018-00255).

Inter Parties Review Patent Owner's Response (Public Version—Redacted) (Sep. 28, 2018), 92 pages. (IPR No. 2018-00255).

Inter Parties Review Patent Owner's Contingent Motion to Amend (Public Version—Redacted) (Sep. 28, 2018), 56 pages. (IPR No. 2018-00255).

Inter Parties Review Petitioner's Unopposed Motion to Submit Replacement Petition and Supplemental Declaration (Nov. 5, 2018), 9 pages. (IPR No. 2018-00255).

Inter Parties Review Petitioner's Reply to Patent Owner's Response (Dec. 21, 2018), 38 pages. (IPR No. 2018-00255).

Inter Parties Review Petitioner Quanergy's Opposition to Patent Owner's Contingent Motion to Amend (Dec. 21, 2018), 35 pages. (IPR No. 2018-00255).

Inter Parties Review Patent Owner's Surreply (Jan. 16, 2019), 50 pages. (IPR No. 2018- 00255).

Inter Parties Review Patent Owner's Reply in Support of Its Contingent Motion to Amend (Jan. 16, 2019), 33 pages. (IPR No. 2018-00255).

Inter Parties Review Petitioner Quanergy's Sur-Surreply (Jan. 30, 2019), 9 pages. (IPR No. 2018-00255).

Inter Parties Review Petitioner Quanergy's Surreply to Patent Owner's Contingent Motion to Amend (Jan. 30, 2019), 17 pages. (IPR No. 2018-00255).

Inter Parties Review Petitioner's Updated Exhibit List (Jan. 30, 2019), 13 pages. (IPR No. 2018-00255).

Inter Parties Review Patent Owner's Updated Exhibit List (Feb. 11, 2019), 21 pages. (IPR No. 2018-00255).

Inter Parties Review Record of Oral Hearing (Feb. 27, 2019), 126 pages. (IPR Nos. 2018-00255 and 2018-00256).

Inter Parties Review Final Written Decision (May 23, 2019), 40 pages. (IPR No. 2018- 00255).

Inter Parties Review Petitioner's Request for Rehearing (Jun. 24, 2019), 20 pages. (IPR No. 2018-00255).

Inter Parties Review Decision Denying Petitioner's Request for Rehearing (May 21, 2020), 26 pages. (IPR No. 2018-00255).

Inter Parties Review Declaration of Dr. James F. Brennan III (Nov. 29, 2017), 172 pages. (IPR Nos. '255 and '256 Exhibit 1002).

(56) References Cited

OTHER PUBLICATIONS

Kilpelä, "Precise pulsed time-of-flight laser range finder for industrial distance measurements," Review of Scientific Instruments (Apr. 2001), 13 pages. (IPR Nos. '255 and '256 Exhibit 1005).
Bordone, et al., "Development of a high-resolution laser radar for 3D imaging in artwork cataloging," Proceedings of SPIE, vol. 5131 (2003), 6 pages. (IPR Nos. '255 and '256 Exhibit 1016).
The American Heritage Dictionary of the English Language, Houghton Mifflin Company, 3d ed. (1996), pp. 1497, 1570, 1697, 1762, and 1804. (IPR Nos. '255 and '256 Exhibit 1018).
Avalanche Photodiode: A User Guide (2011), 8 pages. (IPR Nos. '255 and '256 Exhibit 1019).
Melle, et al., "How to select avalanche photodiodes," Laser Focus World (Oct. 1, 1995), 9 pages. (IPR Nos. '255 and '256 Exhibit 1020).
Aull, et al., "Geiger-Mode Avalanche Photodiodes for Three Dimensional Imaging," Lincoln Laboratory Journal (2002), 16 pages (IPR Nos. '255 and '256 Exhibit 1021), Lincoln Laboratory Journal, vol. 13, No. 2, 2002, pp. 335-350.
Wikipedia, "Laser" (Nov. 10, 2017), 25 pages. (IPR Nos. '255 and '256 Exhibit 1022).
Internet Archive Web Page: Laser Components (2004), 1 page. (IPR Nos. '255 and '256 Exhibit 1023).
Internet Archive Web Page: Laser Components: High Powered Pulsed Laser Diodes 905D3J08-Series (2004), 6 pages. (IPR Nos. '255 and '256 Exhibit 1024).
U.S. District Court, Claim Construction Order, *Quanergy Systems, Inc. v. Velodyne LiDAR, Inc.*, Case No. 5:16-cv-5251-EJD (Oct. 4, 2017), 33 pages. (IPR Nos. '255 and '256 Exhibit 1027).
Internet Archive Webpage: Mercotac 3-Conductor Rotary Electrical Connectors (Mar. 2006), 1 page. (IPR Nos. '255 and '256 Exhibit 1031).
Aood Technology Limited, "*Electrical Slip Rings* vs. *Rotating Electrical Connectors*" (2013), 3 pages. (IPR Nos. '255 and '256 Exhibit 1032).
Yang, et al., "Performance of a large-area avalanche photodiode at low temperature for scintillation detection," Nuclear Instruments and Methods in Physics Research (2003), pp. 388-393 (IPR Nos. '255 and '256 Exhibit 1034).
Thomas, "A procedure for multiple-pulse maximum permissible exposure determination under the Z136.1-2000 American national standard for safe use of lasers," Journal of Laser Applications, Aug. 2001, vol. 13, No. 4, pp. 134-140.
American National Standards Institute, "Procedures for the Development and Coordination of American National Standards" (Mar. 22, 1995), 50 pages. (IPR Nos. '255 and '256 Exhibit 1040).
Inter Parties Review, Declaration of Dr. Sylvia Hall-Ellis (Nov. 29, 2017), 93 pages. (IPR Nos. '255 and '256 Exhibit 1041).
Ogurtsov, et al., "High Accuracy ranging with Yb3+ -doped fiber-ring frequency-shifted feedback laser with phase-modulated seed," Optics Communications (2006), pp. 266-273. (IPR Nos. '255 and '256 Exhibit 1042).
Ou-Yang, et al., "High-dynamic-range laser range finders based on a novel multimodulated frequency method," Optical Engineering (Dec. 2006), 6 pages. (IPR Nos. '255 and '256 Exhibit 1043).
Tarakanov, et al., "Picosecond pulse generation by internal gain switching in laser diodes," Journal of Applied Physics 95:223 (Mar. 2004), pp. 2223-2229. (IPR Nos. '255 and '256 Exhibit 1044).
Japanese Patent Office, Petitioner's Translation of Mizuno Japanese Patent Publication No. H3-6407 (1991), 15 pages. (IPR Nos. '255 and '256 Exhibit 1058).
Inter Parties Review, Redlined Supplemental Declaration of Dr. James F. Brennan III (2018), 171 pages. (IPR Nos. '255 and '256 Exhibit 1062).
Inter Parties Review, Declaration of James F. Brennan, III in Support of Petitioner's Replies and Oppositions to Motions to Amend (Dec. 21, 2018), 93 pages. (IPR Nos. '255 and '256 Exhibit 1063).
Inter Parties Review, Deposition Transcript of J. Gary Eden, Ph.D (taken Nov. 27, 2018), 285 pages. (IPR Nos. '255 and '256 Exhibit 1064).
Inter Parties Review, Declaration of Sylvia Hall-Ellis (Dec. 21, 2018), 146 pages. (IPR Nos. '255 and '256 Exhibit 1065).
Inter Parties Review, Chris Butler Affidavit and Exhibit (Dec. 18, 2018), 33 pages. (IPR Nos. '255 and '256 Exhibit 1066).
Inter Parties Review, Chris Butler Affidavit and Exhibit (Dec. 20, 2018), 52 pages. (IPR Nos. '255 and '256 Exhibit 1067).
Robots for Roboticists, Lidar Fundamentals, http://robotsforroboticists.com/lidar- fundamentals/ (May 5, 2014), 6 pages. (IPR Nos. '255 and '256 Exhibit 1068).
Alhashimi, et al., Statistical Modeling and Calibration of Triangulation Lidars, SCITEPRESS—Science and Technology Publications (2016), pp. 308-317. (IPR Nos. '255 and '256 Exhibit 1069).
USGS, EROS CalVal Center of Excellence (ECCOE), https://calval.cr.usgs.gov/wordpress/wpcontent/uploads/JACIE_files/JACIE06/Files/312Habib.pdf (Dec. 21, 2018), 3 pages. (IPR Nos. '255 and '256 Exhibit 1071).
Merriam, How to Use Lidar with the raspberry PI, Hackaday, https://hackaday.com/2016/01/22/how-to-use-lidar-with-the-raspberry-pi/ (Jan. 22, 2016), 13 pages. (IPR Nos. '255 and '256 Exhibit 1072).
Acuity Laser, Principles Of Measurement Used By Laser Sensors, https://www.acuitylaser.com/measurement-principles (2018), 4 pages. (IPR Nos. '255 and '256 Exhibit 1075).
Inter Parties Review, Listing of Labelled Substitute Claims (2018), 17 pages. (IPR Nos. '255 and '256 Exhibit 1076).
Fuerstenberg, et al., Multilayer Laserscanner for Robust Object Tracking and Classification in Urban Traffic Scenes, 9th World Congress on Intelligent Transport Systems (2002), 14 pages (IPR Nos. '255 and '256 Exhibit 1079), pp. 1-10.
Janocha, Actuators: Basics and Applications, Springer (2004), pp. 85-153. (IPR Nos. '255 and '256 Exhibit 1080).
Sick, Sick ToF sensors at close range, https://web.archive.org/web/20040607070720/ http:/www.sick.de:80/de/products/categories/industrial/distancesensors/dme2000/en.html (Jun. 7, 2004), 2 pages. (IPR Nos. '255 and '256 Exhibit 1082).
Daido, Daido steel drilling equipment page, https://web.archive.org/web/20050406120958/ http:/www.daido.co.jp:80/english/products/applipro/energy/dri.html (Apr. 6, 2005), 1 page. (IPR Nos. '255 and '256 Exhibit 1083).
Daido, Daido steel petroleum components, https://web.archive.org/web/20050406121643/ http:/www.daido.co.jp:80/english/products/applipro/energy/petro.htm (Apr. 6, 2005), 1 page. (IPR Nos. '255 and '256 Exhibit 1084).
Daido, Daido steel rebar page, https://web.archive.org/web/20051201010951/ http:/www.daido.co.jp:80/products/stainless/ik_shokai.html (Dec. 1, 2005), 2 pages. (IPR Nos. '255 and '256 Exhibit 1086).
Daido, Daido Special Steel Co. home page, https://web.archive.org/web/20051227070229/http:/daido.co.jp/ (Dec. 27, 2005), 1 page. (IPR Nos. '255 and '256 Exhibit 1087).
Canbus, https://web.archive.org/web/20040520021138/http:/canbus.us:80/ (May 20, 2004), 3 pages. (IPR Nos. '255 and '256 Exhibit 1088).
Esacademy, Betting on CAN, https://web.archive.org/web/20040609170940/ http:/www.esacademy.com:80/faq/docs/bettingcan/traditional.htm (Jun. 9, 2004), 1 page. (IPR Nos. '255 and '256 Exhibit 1089).
Velodyne, Velodyne HDL-64E user manual, https://web.archive.org/web/20081117092628/ http://www.velodyne.com/lidar/products/manual/HDL-64E%20Manual.pdf (Nov. 17, 2008), 23 pages. (IPR Nos. '255 and '256 Exhibit 1090).
Velodyne, Velodyne—High Definition Lidar—Overview https://web.archive.org/web/20071107104255/ http://www.velodyne.com:80/lidar/products/overview.aspx (Nov. 7, 2007), 1 page. (IPR Nos. '255 and '256 Exhibit 1091).
Darpa, 2005 DARPA Challenge Info page https://web.archive.org/web/20051214033009/ http:/www.darpa.mil:80/grandchallenge/ (Nov. 17, 2005), 1 page. (IPR Nos. '255 and '256 Exhibit 1092).

(56) References Cited

OTHER PUBLICATIONS

Darpa, 2005 DARPA Team Papers https://web.archive.org/web/20051213010211/ http:/www.darpa.mil:80/grandchallenge/techpapers.html (Dec. 13, 2005), 2 pages. (IPR Nos. '255 and '256 Exhibit 1093).
Darpa, PDF found on Team DAD paper URL, https://web.archive.org/web/20051213015642/ http:/www.darpa.mil:80/grandchallenge/TechPapers/TeamDAD.pdf (Aug. 6, 2005), pp. 1-12. (IPR Nos. '255 and '256 Exhibit 1094).
Ibeo, Ibeo time of flight with moving graphic, (Jan. 8, 2004), 1 page. (IPR Nos. '255 and '256 Exhibit 1095).
Ibeo, Ibeo multilayer technology page with moving graphic, Archive.org (Jan. 8, 2004), 1 page. (IPR Nos. '255 and '256 Exhibit 1096).
Ibeo, Ibeo multilayer tech, (Jan. 8, 2004), 1 page. (IPR Nos. '255 and '256 Exhibit 1097).
Ibeo, Ibeo Time of Flight, (Jan. 8, 2004), 1 page. (IPR Nos. '255 and '256 Exhibit 1098).
Ibeo, Ibeo Alasca, https://web.archive.org/web/20031001091407/ http:/www.ibeoas.de:80/html/prod/prod_alasca.html (Oct. 1, 2003), 1 page. (IPR Nos. '255 and '256 Exhibit 1099).
Ibeo, Ibeo products page, https://web.archive.org/web/20040606115118/ http:/www.ibeoas.de:80/html/prod/prod.html (Jun. 6, 2004), 1 page. (IPR Nos. '255 and '256 Exhibit 1100).
Ibeo, Ibeo multitarget capability, https://web.archive.org/web/20040323030746/ http:/www.ibeoas.de:80/html/knho/knho_senstech_mlc.html (Mar. 23, 2004), 1 page. (IPR Nos. '255 and '256 Exhibit 1101).
Ibeo, Ibeo home page, https://web.archive.org/web/20040202131331/ http:/www.ibeo-as.de:8 (Feb. 2, 2004), 1 page. (IPR Nos. '255 and '256 Exhibit 1102).
Ibeo, Ibeo about page, https://web.archive.org/web/20040606111631/ http:/www.ibeoas.de:80/html/about/about (Jun. 6, 2004), 1 page. (IPR Nos. '255 and '256 Exhibit 1103).
Ibeo, Ibeo history, https://web.archive.org/web/20040807161657/ http:/www.ibeoas.de:80/html/about/ab_history.html (Aug. 7, 2004), 1 page. (IPR Nos. '255 and '256 Exhibit 1104).
Ibeo, Ibeo Roadmap, https://web.archive.org/web/20041209032449/ http:/www.ibeoas.de:80/html/prod/prod_roadmap.html (Dec. 9, 2004), 1 page. (IPR Nos. '255 and '256 Exhibit 1105).
Velodyne, Velodyne HDL Applications, https://web.archive.org/web/20080716041931/ http://www.velodyne.com:80/lidar/technology/applications.aspx (Jul. 16, 2008), 1 page. (IPR Nos. '255 and '256 Exhibit 1106).
Ibeo, Ibeo data sheet re available products, https://web.archive.org/web/20041209025137/ http://www.ibeoas.de:80/html/prod/prod_dataprices.html (Dec. 9, 2004), 2 pages. (IPR Nos. '255 and '256 Exhibit 1107).
Ibeo, Ibeo Available products, https://web.archive.org/web/20041011011528/ http://www.ibeoas.de:80/html/prod/prod.html (Oct. 11, 2004), 1 page. (IPR Nos. '255 and '256 Exhibit 1108).
Ibeo, Ibeo publications page, https://web.archive.org/web/20031208175052/ http://www.ibeoas.de:80/html/public/public.html (Dec. 8, 2003), 2 pages. (IPR Nos. '255 and '256 Exhibit 1109).
Ibeo, Ibeo Motiv sensor, https://web.archive.org/web/20040113062910/ http://www.ibeoas.de:80/html/rd/rd_rs_motiv.htm (Jan. 13, 2004), 1 page. (IPR Nos. '255 and '256 Exhibit 1110).
Ibeo, Ibeo LD Multilayer data sheet, https://web.archive.org/web/20031003201743/ http://www.ibeoas.de:80/html/prod/prod_Id_multi.html (Oct. 3, 2003), 1 page. (IPR Nos. '255 and '256 Exhibit 1111).
Velodynelidar, Data to Improve the Cost, Convenience and Safety of Motor Vehicles, https://velodynelidar.com/industry.html (2018), 6 pages. (IPR Nos. '255 and '256 Exhibit 1125).
Inter Parties Review, Quanergy Systems Inc.'s Invalidity Contentions and Production of Documents Pursuant to Patent Local Rules 3-3 and 3-4, *Quanergy Systems, Inc.* v. *Velodyne LiDAR, Inc.*, Case No. 5:16-cv-5251-EJD (Mar. 27, 2017), 24 pages. (IPR Nos. '255 and '256 Exhibit 1126).
Inter Parties Review, Quanergy Invalidity Contentions Claim Chart, U.S. Pat. No. 7,969,558 (Mizuno), *Quanergy Systems, Inc.* v. *Velodyne LiDAR, Inc.*, Case No. 5:16-cv-5251-EJD (Mar. 27, 2017), 17 pages. (IPR Nos. '255 and '256 Exhibit 1127).
Inter Parties Review, Quanergy Invalidity Contentions Claim Chart, U.S. Pat. No. 7,969,558 (PILAR), *Quanergy Systems, Inc.* v. *Velodyne LiDAR, Inc.*, Case No. 5:16-cv-5251-EJD (Mar. 27, 2017), 13 pages. (IPR Nos. '255 and '256 Exhibit 1128).
Richmond et al., Polarimetric Imaging Laser Radar (PILAR) Program. In Advanced Sensory Payloads for UAV, Meeting Proceedings RTO-MP-SET-092, Paper 19. Neuilly-sur-Seine, France: RTO (May 1, 2005), 35 pages. (IPR Nos. '255 and '256 Exhibit 1129).
Frost et al., Driving the Future of Autonomous Navigation—Whitepaper for Analysis of LIDAR technology for advanced safety, https://velodynelidar.com/docs/papers/FROST-ON-LiDAR.pdf (2016), 30 pages. (IPR Nos. '255 and '256 Exhibit 1130).
Irdajp.org, IrDA Infrared Data Association, http://www.irdajp.org/irdajp.info (2018), 3 pages. (IPR Nos. '255 and '256 Exhibit 1134).
Zappa, et al, SPADA: Single-Photon Avalanche Diode Arrays, IEEE Photonics Technology Letters, vol. 17, No. 3 (Mar. 2005), 9 pages. (IPR Nos. '255 and '256 Exhibit 1135).
Dehong, et al., Design and Implementation of LiDAR Navigation System Based On Triangulation Measurement, 29th Chinese Control and Decision Conference (CCDC) (May 2017), 59 pages. (IPR Nos. '255 and '256 Exhibit 1136).
Strata-gee.com, Velodyne President Calls Strata-gee to Set the Record Straight, https://www.strata-gee.com/velodyne-president-calls-strata-gee-setrecord-straight/ (Jun. 26, 2014), 6 pages. (IPR Nos. '255 and '256 Exhibit 1137).
Taylor, An Introduction to Error Analysis—The Study of Uncertainties in Physical Measurements, Oxford University Press (1982), pp. 81-137. (IPR Nos. '255 and '256 Exhibit 1138).
American Petroleum Institute, "Specification for Line Pipe," API Specification 5L, 43rd Ed. (2004), 166 pages. (IPR Nos. '255 and '256 Exhibit 1139).
Beer, et al., Mechanics of Materials, McGraw Hill Companies, 4th Ed. (2006), pp. 750 and 752. (IPR Nos. '255 and '256 Exhibit 1140).
National Highway Traffic Safety Administration (NHTSA), Dot, Final Rule Federal Motor Vehicle Safety Standards; Tire Pressure Monitoring Systems Controls and Displays (2005), 222 pages. (IPR Nos. '255 and '256 Exhibit 1141).
American National Standard for Safe Use of Lasers, Ansi Z136.1-2014, Laser Institute of America (Dec. 10, 2013), pp. 27-34 and 216-219. (IPR Nos. '255 and '256 Exhibit 1142).
Business Wire, Press Release Distribution webpage, https://services.businesswire.com/press-release-distribution (Dec. 21, 2018), 2 pages. (IPR Nos. '255 and '256 Exhibit 1143).
Inter Parties Review, Deposition Transcript of J. Gary Eden, Ph.D (taken on Jan. 22, 2019), 368 pages. (IPR Nos. '255 and '256 Exhibit 1150).
Inter Parties Review, Eden Deposition Exhibit 1—Unmanned Vehicles Come of Age: The DARPA Grand Challenge (2006), pp. 26-29. (IPR Nos. '255 and '256 Exhibit 1151).
Inter Parties Review, Eden Deposition Exhibit 2—Driver Reaction Time in Crash Avoidance Research: validation of a Driving Simulator Study on a Test Track; Article in Human Factors and Ergonomics Society Annual Meeting Proceedings, Jul. 2000, 5 pages. (IPR Nos. '255 and '256 Exhibit 1152).
Inter Parties Review, Eden Deposition Exhibit 3—Axis of Rotation diagram (Jan. 22, 2019), 1 page. (IPR Nos. '255 and '256 Exhibit 1153).
Inter Parties Review, Eden Deposition Exhibit 4—Parallel Line and Plane—from Wolfram MathWorld (http://mathworld.wolfram.com/ParallelLineandPlane.html) (Jan. 22, 2019), 1 page. (IPR Nos. '255 and '256 Exhibit 1154).
Inter Parties Review, Eden Deposition Exhibit 5—Quasi-3D Scanning with Laserscanners: Introduction from 2D to 3D (2001), 7 pages. (IPR Nos. '255 and '256 Exhibit 1155).
Inter Parties Review, Eden Deposition Exhibit 6—L-Gage LT3 Long-Range Time-of-Flight Laser Distance-Gauging Sensors (2002), 12 pages. (IPR Nos. '255 and '256 Exhibit 1156).
Inter Parties Review, Eden Deposition Exhibit 7—About Ibeo: Our Mission (https://www.ibeoas.com/aboutibeo) (Jan. 21, 2019), 10 pages. (IPR Nos. '255 and '256 Exhibit 1157).

(56) References Cited

OTHER PUBLICATIONS

Inter Parties Review, Eden Deposition Exhibit 8—Automotive Industry; Explore Our Key Industries (https://velodynelidar.com/industry.html) (2019), 6 pages. (IPR Nos. '255 and '256 Exhibit 1158).
Inter Parties Review, Eden Deposition Exhibit 9—Leddar Tech, Solid-State LiDARs: Enabling the Automotive Industry Towards Autonomous Driving (2018), 6 pages. (IPR Nos. '255 and '256 Exhibit 1159).
Inter Parties Review, Eden Deposition Exhibit 10—Are processor algorithms key to safe self-driving cars? —EDN Asia (https://www.ednasia.com/news/article/areprocessor-algorithms-key-to-safe-self-driving-cars) (Jul. 7, 2016), 7 pages. (IPR Nos. '255 and '256 Exhibit 1160).
Inter Parties Review, Eden Deposition Exhibit 11—Steve Taranovich's profile (https://www.edn.com/user/steve.taranovich) (Jan. 22, 2019), 4 pages. (IPR Nos. '255 and '256 Exhibit 1161).
Inter Parties Review, Eden Deposition Exhibit 12—Instrumentation and Control (http://www.Instrumentation.co.za/article.aspx?pklarticleid=1664) (Feb. 2002), 4 pages. (IPR Nos. '255 and '256 Exhibit 1162).
Inter Parties Review, Eden Deposition Exhibit 13—IBEO on board: ibeo Lux 4L / ibeo Lux 8L / ibeo Lux HD Data Sheet (Jul. 2017), 2 pages. (IPR Nos. '255 and '256 Exhibit 1163).
Inter Parties Review, Quanergy's Objected-to Demonstrative Slides of Patent Owner (2019), 16 pages. (IPR Nos. '255 and '256 Exhibit 1164).
Inter Parties Review, Declaration of J. Gary Eden, Ph.D. in Support of Patent Owner's Preliminary Responses (Public Version—Redacted) (Mar. 7, 2018), 120 pages. (IPR Nos. '255 and '256 Exhibit 2003).
American National Standard for Safe Use of Lasers, Laser Institute of America (Jun. 28, 2000), 184 pages. (IPR Nos. '255 and '256 Exhibit 2005).
Hamatsu, Opto-Semiconductor Handbook, Si APD, MMPC (Chapter 3), ("APD Handbook"), available at https://www.hamamatsu.com/us/en/hamamatsu/overview/bsd/solid_state_division/related_documents.html (2014), 25 pages. (IPR Nos. '255 and '256 Exhibit 2006).
Berkovic et al., Optical Methods for Distance and Displacement Measurements, Advances in Optics and Photonics (Sep. 11, 2012), pp. 441-471. (IPR Nos. '255 and '256 Exhibit 2007).
Inter Parties Review, Excerpt from Stephan Lugomer, Laser Technology, Laser Driven Processes, Prentice-Hall (1990), pp. 302-311. (IPR Nos. '255 and '256 Exhibit 2008).
Inter Parties Review, Excerpt from James T. Luxon and David E. Parker, Industrial Lasers and Their Applications, Prentice-Hall (1985), pp. 56, 68-70, 124-125, 145, 150-151, and 154-159. (IPR Nos. '255 and '256 Exhibit 2009).
Inter Parties Review, Excerpt from Raymond T. Measures, Laser Remote Sensing, Fundamentals and Applications (1992), pp. 205 and 213-214. (IPR Nos. '255 and '256 Exhibit 2010).
Inter Parties Review, Excerpt from Peter W. Milonni and Joseph Eberly, Lasers (1988), pp. 585-589. (IPR Nos. '255 and '256 Exhibit 2011).
Inter Parties Review, Excerpt from William V. Smith, Laser Applications (1970), pp. 23-27. (IPR Nos. '255 and '256 Exhibit 2012).
Velodyne Lidar, Webserver User Guide VLP-16 & HDL-32E (63-6266 Rev A) (Nov. 2015), 32 pages. (IPR Nos. '255 and '256 Exhibit 2013).
Inter Parties Review, Excerpt from Beautiful Data, Edited by Toby Segaran and Jeff Hammerbacher (Jul. 2009), pp. 150-153. (IPR Nos. '255 and '256 Exhibit 2014).
Inter Parties Review, Excerpts of Deposition of Craig L. Glennie, Ph.D., *Quanergy Systems, Inc.*, v. *Velodyne Lidar, Inc.*, No. 5:16-cv-05251-EJD (N.D. Cal.) (Jun. 27, 2017), 6 pages. (IPR Nos. '255 and '256 Exhibit 2016).
Velodyne Acoustics, Inc., Motor Specification, Merlin Project, Rev. E1 Initial Engineering Release (Apr. 29, 2009), 1 page. (IPR Nos. '255 and '256 Exhibit 2020).
Velodyne Lidar, Cad Drawing of MotorStat3in, HDL-64E(2018), 1 page. (IPR Nos. '255 and '256 Exhibit 2021).
Velodyne Acoustics, Inc., Motor Winding Specs., P2.0 , E2 Changed Material (Mar. 10, 2010), 1 page. (IPR Nos. '255 and '256 Exhibit 2022).
Velodyne Lidar, Inc., Production Worksheet, Item #30-AD230CER2 in Production, APD, 230UM, Ceramic Submount (Jan. 17, 2018), 1 pages. (IPR Nos. '255 and '256 Exhibit 2023).
Velodyne Lidar, Inc., Production Worksheet Detector, Item #24-AD5009 in Production, AD500-9 NIR Photodiode (Jan. 18, 2018), 1 page. (IPR Nos. '255 and '256 Exhibit 2024).
Velodyne Lidar, Cad Drawing of Rotor, HDL-64E (2018), 1 page. (IPR Nos. '255 and '256 Exhibit 2026).
Velodyne Lidar, Cad Drawing of RotorAI, HDL-64E (2018), 1 page. (IPR Nos. '255 and '256 Exhibit 2027).
Velodyne Lidar Products, PowerPoint (Jan. 18, 2017), 9 pages. (IPR Nos. '255 and '256 Exhibit 2031).
Velodyne Lidar, Ultra Puck™ VLP-32 Data Sheet (2014), 2 pages. (IPR Nos. '255 and '256 Exhibit 2032).
Velodyne Lidar, Excerpts of VLP-32C User Manual, 63-9325 Rev. B (2018), 26 pages. (IPR Nos. '255 and '256 Exhibit 2034).
Velodyne Lidar, First Sensor Annual Report (2016), pp. 1-143. (IPR Nos. '255 and '256 Exhibit 2038).
Overton, First Sensor expands supply agreement for APDs used in Velodyne lidar systems, Laser Focus World (Feb. 15, 2017), 2 pages. (IPR Nos. '255 and '256 Exhibit 2039).
Ohnsman, How A 34-Year-Old Audio Equipment Company is Leading the Self-Driving Car Revolution, Forbes (Aug. 8, 2017), 7 pages. (IPR Nos. '255 and '256 Exhibit 2040).
ROS-DRIVERS—Error in packet rate for the VLP-32C #142, GitHub Forum (Jan. 29, 2018), 1 page. (IPR Nos. '255 and '256 Exhibit 2041).
Velodyne Lidar, HDL-32E Data Sheet (2017), 2 pages. (IPR Nos. '255 and '256 Exhibit 2042).
Velodyne Lidar, HDL-32E Envelope Drawing (2018), 1 page. (IPR Nos. '255 and '256 Exhibit 2043).
Velodyne Lidar, HDL-32E User's Manual and Programing Guide (Aug. 2016), 29 pages. (IPR Nos. '255 and '256 Exhibit 2044).
Doyle, Velodyne HDL-64E Laser Rangefinder (LIDAR) Pseudo-Disassembled, Hizook (Jan. 4, 2009), 7 pages. (IPR Nos. '255 and '256 Exhibit 2046).
Velodyne Lidar, HDL-64E S2 Datasheet (Mar. 2010), 2 pages. (IPR Nos. '255 and '256 Exhibit 2047).
Velodyne Lidar, HDL-64E S3 Data Sheet (2016), 2 pages. (IPR Nos. '255 and '256 Exhibit 2048).
Velodyne Lidar, HDL-64E S2 and S2.1 User's Manual and Programming Guide (Nov. 2012), 43 pages. (IPR Nos. '255 and '256 Exhibit 2050).
Velodyne Lidar, HDL-64E S3 User's Manual and Programming Guide (May 2013), 54 pages. (IPR Nos. '255 and '256 Exhibit 2051).
Velodyne Lidar, HDL-64E User's Manual (Mar. 2008), 21 pages. (IPR Nos. '255 and '256 Exhibit 2052).
Velodyne Lidar, HDL-32E Supported Sensors, Poly Synch Docs 2.3.2, http://docs.polysync.io/sensors/velodyne-hdl-32e/ (2018), 7 pages. (IPR Nos. '255 and '256 Exhibit 2055).
Glennie et al., Temporal Stability of the Velodyne HDL-64E S2 Scanner for High Accuracy Scanning Applications, MDPI Remote Sensing (Mar. 14, 2011), 15 pages. (IPR Nos. '255 and '256 Exhibit 2057).
Velodyne Lidar, Product Guide (2018), 1 page. (IPR Nos. '255 and '256 Exhibit 2058).
Velodyne Lidar, White Paper, Velodyne's HDL-64E: A High Definition Lidar Sensor for 3-D Applications (Oct. 2007), 7 pages. (IPR Nos. '255 and '256 Exhibit 2059).
Velodyne Lidar, Puck, Real-time 3D LiDAR Sensor, VLP-16 Data Sheet (2017), 2 pages. (IPR Nos. '255 and '256 Exhibit 2060).
Velodyne Lidar, Envelope Hi Res VLP-16 Drawings, Rev. A (Jun. 30, 2016), 4 pages. (IPR Nos. '255 and '256 Exhibit 2061).
Velodyne Lidar, VLP-16 User's Manual and Programming Guide (Mar. 2016), 49 pages. (IPR Nos. '255 and '256 Exhibit 2062).
Velodyne Lidar, Cad Drawing of MotorStat-38in, HDL-64E (2018), 1 page. (IPR Nos. '255 and '256 Exhibit 2063).

(56) References Cited

OTHER PUBLICATIONS

Ramsey et al., Use Scenarios to Plan for Autonomous Vehicle Adoption, Gartner (Jun. 26, 2017), 17 pages. (IPR Nos. '255 and '256 Exhibit 2064).
Ford Media Center, Ford Tripling Autonomous Vehicle Development Fleet, Accelerating on-road Testing of Sensors and Software (Jan. 5, 2016), 4 pages. (IPR Nos. '255 and '256 Exhibit 2066).
Velodyne Lidar, HDL-64E Data Sheet (2018), 2 pages. (IPR Nos. '255 and '256 Exhibit 2069).
Velodyne Lidar, It Began With a Race . . . 16 Years of Velodyne LiDAR, Velodyne Lidar Blog, available at http://velodynelidar.com/blog/it-began-with-a-race/ (2018), 8 pages. (IPR Nos. '255 and '256 Exhibit 2070).
Inter Parties Review, Quanergy M8 Lidar Sensor Datasheet, 2 pages. (IPR Nos. '255 and '256 Exhibit 2071).
D'Allegro, Meet the Inventor Trying to Bring LiDAR to the Masses, The Drive http://www.thedrive.com/sheetmetal/15567/meet-the-inventor-trying-to-bring-lidar-to-the-masses (Oct. 28, 2017), 5 pages. (IPR Nos. '255 and '256 Exhibit 2072).
Williams, Driverless cars yield to reality: It's a long road ahead, PC World (Jul. 8, 2013), 6 pages. (IPR Nos. '255 and '256 Exhibit 2073).
Cameron, An Introduction to LIDAR: The Key Self-Driving Car Sensor, Voyage https://news.voyage.auto/an-introduction-to-lidar-the-key-self-drivingcar-sensor-a7e405590cff (May 9, 2017), 14 pages. (IPR Nos. '255 and '256 Exhibit 2074).
Chellapilla, Lidar: The Smartest Sensor on a Self Driving Car, LinkedIn.com https://www.linkedin.com/pulse/lidar-smartest-sensor-self-driving-carkumar-chellapill (Jul. 31, 2017), 8 pages. (IPR Nos. '255 and '256 Exhibit 2075).
Popper, Guiding Light, The Billion-Dollar Widget Steering the Driverless Car Industry, The Verge (Oct. 18, 2017), 17 pages. (IPR Nos. '255 and '256 Exhibit 2076).
Fast Company, The World's 50 Most Innovative Companies 2017, https://www.fastcompany.com/most-innovative-companies/2017 (last visited Feb. 26, 2018), 5 pages. (IPR Nos. '255 and '256 Exhibit 2077).
Velodyne Lidar, Velodyne Donates LiDAR and Robotic Artifacts to Smithsonian, Point of Engineering, Point of Beginning (May 23, 2011), 2 pages. (IPR Nos. '255 and '256 Exhibit 2078).
Informed Infrastructure, Velodyne LiDAR Division Announces Agreement with Caterpillar for Laser Imaging Technology, Informed Infrastructure http://informedinfrastructure.com/25630/velodynes-lidar-divisionannounces-agreement-with-caterpillar-for-laser-imaging-technology-2/ (Aug. 8, 2012), 3 pages. (IPR Nos. '255 and '256 Exhibit 2079).
Inter Parties Review, Defendant Velodyne's Answer and Counterclaim, *Quanergy Systems, Inc.*, v. *Velodyne Lidar, Inc.*, No. 5:16-cv-05251-EJD (N.D. Cal.) ECF No. 36 (Dec. 5, 2016), 56 pages. (IPR Nos. '255 and '256 Exhibit 2080).
Gargiulo, Velodyne Lidar Tops Winning Urban Challenge Vehicles, Business Wire (Nov. 6, 2007), 2 pages. (IPR Nos. '255 and '256 Exhibit 2082).
Strawa et al., The Measurement of Aerosol Optical Properties Using Continuous Wave Cavity Ring-Down Techniques, 20 Journal of Atmospheric and Oceanic Technology 454 (Apr. 2003), pp. 454-465. (IPR Nos. '255 and '256 Exhibit 2090).
Cheung, Spinning laser maker is the real winner of the Urban Challenge, Tech Guru Daily, available at http://www.tgdaily.com/trendwatch-features/34750-spinning-laser-maker-is-the-real-winner (Nov. 7, 2007), 7 pages. (IPR Nos. '255 and '256 Exhibit 2091).
Velodyne Acoustics, Inc., Outline Drawing HDL-64E S3 Envelope Drawing, Rev. A (Apr. 21, 2015), 1 page. (IPR Nos. '255 and '256 Exhibit 2094).
Businesswire, Velodyne LiDar Awarded "Industry Choice Company of the Year" at TU-Automotive Detroit Conference, Businesswire, https://www.businesswire.com/news/home/20180608005700/en/Velodyne-LiDAR-Awarded-%E2%80%9CIndustry-Choice-Company-Year%E2%80%9D (Jun. 8, 2018), 1 page. (IPR Nos. '255 and '256 Exhibit 2096).
Businesswire, Velodyne Displays Solid State, Highest Performing LiDAR for ADAS, Businesswire https://www.businesswire.com/news/home/20180107005088/en/Velodyne-Displays-Solid-State-Highest-Performing-LiDAR (Jan. 7, 2018), 2 pages. (IPR Nos. '255 and '256 Exhibit 2097).
Brustein et al., How a Billion-Dollar Autonomous Vehicle Startup Lost Its Way, Bloomberg https://www.bloomberg.com/news/features/2018-08-13/how-a-billiondollar-autonomous-vehicle-startup-lost-its-way (Aug. 13, 2018), 7 pages. (IPR Nos. '255 and '256 Exhibit 2098).
Automotive Lidar, Market Presentation titled "Robotic Cars LiDAR Market in Million Dollars" (Apr. 2018), 86 pages. (IPR Nos. '255 and '256 Exhibit 2113).
Velodyne Lidar, VLP-32C User Manual, 63-9325 Rev. B. (Feb. 2, 2018), 136 pages. (IPR Nos. '255 and '256 Exhibit 2114).
Inter Parties Review, Declaration of J. Gary Eden, Ph.D. in Support of Patent Owner's Responses and Motions to Amend (Public Version—Redacted) (Sep. 27, 2018), 202 pages. (IPR Nos. '255 and '256 Exhibit 2115).
Inter Parties Review, Transcript of Sep. 13, 2018 Conference Call, *Quanergy Systems, Inc.* v. *Velodyne Lidar, Inc.*, Nos. IPR2018-00255 and IPR2018-00256 (Sep. 13, 2018), 21 pages. (IPR Nos. '255 and '256 Exhibit 2116).
Hamamatsu, Position Sensitive Detectors ("PSDs") Webpage, One-dimensional and Two-dimensional (Mar. 17, 2006), 1 page. (IPR Nos. '255 and '256 Exhibit 2117).
Hamamatsu, One-dimensional PSD Plastic package, 1-D PSD with plastic package Datasheet ("1-D PSD Datasheet") (2004), 5 pages. (IPR Nos. '255 and '256 Exhibit 2118).
Hamamatsu, One-Dimensional PSD Webpage, One-dimensional (Mar. 17, 2006), 1 page. (IPR Nos. '255 and '256 Exhibit 2119).
Hamamatsu, Two-dimensional PSDs S1200, S1300, S1880, S1881, S2044—Non-discrete position sensor utilizing photodiode surface resistance Datasheet (2003), 6 pages. (IPR Nos. '255 and '256 Exhibit 2120).
Hamamatsu, Two-dimensional PSD S1300 Datasheet (Dec. 19, 2005), 1 page. (IPR Nos. '255 and '256 Exhibit 2121).
Hamamatsu, Two-dimensional PSDs Webpage (Mar. 17, 2006), 1 page. (IPR Nos. '255 and '256 Exhibit 2122).
Hamamatsu, CCD area image sensor S7030/S7031 Series Back-thinned FFT-CCD Datasheet (2006), 8 pages. (IPR Nos. '255 and '256 Exhibit 2123).
Hamamatsu, CCD Image Sensors Webpage ("CCD Image Sensors") (Feb. 2, 2006), 1 page. (IPR Nos. '255 and '256 Exhibit 2124).
Williams, Bias Voltage and Current Sense Circuits for Avalanche Photodiodes—Feeding and Reading the APD, Linear Technology AN92-1 (Nov. 2012), 32 pages. (IPR Nos. '255 and '256 Exhibit 2125).
Hamamatsu, Technical Information, SD-25—Characteristics and use of FFT-CCD area image sensor (Aug. 2003), 27 pages. (IPR Nos. '255 and '256 Exhibit 2126).
Hamamatsu, Technical Information, SD-28—Characteristics and use of Si APD (Avalanche Photodiode) (Aug. 2001), 12 pages. (IPR Nos. '255 and '256 Exhibit 2127).
Hamamatsu, Image Sensor Selection guide (Dec. 2003), 20 pages. (IPR Nos. '255 and '256 Exhibit 2128).
Hamamatsu, Photodiode Technical Information, 18 pages. (IPR Nos. '255 and '256 Exhibit 2129).
Hamamatsu, Silicon Photodiode Array Webpage (Feb. 2, 2006), 1 page. (IPR Nos. '255 and '256 Exhibit 2130).
Piatek, Presentation entitled 'LiDAR and Other Techniques—Measuring Distance with Light for Automotive Industry', authored by Slawomir Piatek, Technical Consultant, Hamamatsu Corp. (Dec. 6, 2017), 66 pages. (IPR Nos. '255 and '256 Exhibit 2131).
Piatek, Measuring distance with light, Hamamatsu.com, https://hub.hamamatsu.com/us/en/application-note/measuringdistance-with-light/index.html (Apr. 2, 2015), 18 pages. (IPR Nos. '255 and '256 Exhibit 2132).
Hergert et al., The WITS$ guide to selecting a photodetector, Hamamatsu.com, https://hub.hamamatsu.com/us/en/technical-note/

(56) References Cited

OTHER PUBLICATIONS

WITS-guide-detectorselection/index.html (Jul. 2015), 16 pages. (IPR Nos. '255 and '256 Exhibit 2133).
Hamamatsu, Si photodiode array—S4111/S4114 series 16, 35, 46 element Si photodiode array for UV to NIR Datasheet (Jul. 2004), 4 pages. (IPR Nos. '255 and '256 Exhibit 2134).
Hamamatsu, S4111-46Q Si Photodiode Array Webpage (Oct. 22, 2005), 1 page. (IPR Nos. '255 and '256 Exhibit 2135).
Piatek et al., LiDAR: A photonics guide to autonomous vehicle market, Hamamatsu.com, https://hub.hamamatsu.com/us/en/application-note/LiDAR-competingtechnologies-automotive/index.html (Nov. 18, 2017), 6 pages. (IPR Nos. '255 and '256 Exhibit 2136).
Engineering Toolbox, The Engineering Toolbox Copper Tubes—ASTM B88 Datasheet (last accessed Jul. 10, 2018), 4 pages. (IPR Nos. '255 and '256 Exhibit 2137).
The American Society of Mechanical Engineers, Welded and Seamless Wrought Steel Pipe, ASME B36.10M-2004 (Oct. 25, 2004), 26 pages. (IPR Nos. '255 and '256 Exhibit 2138).
Copper Development Association Inc., Copper Tube Handbook—Industry Standard Guide for the Design and Installation of Copper Piping Systems, CDA Publication A4015-14.17: Copper Tube Handbook (2016), 96 pages. (IPR Nos. '255 and '256 Exhibit 2139).
Aufrere, et al., Perception for collision avoidance and autonomous driving, The Robots Institute, Carnegie Mellon University (2003), 14 pages (IPR Nos. '255 and '256 Exhibit 2140).
Blais, NRC-CNRC, Review of 20 Years of Range Sensor Development, National Research Council Canada (Jan. 2004), pp. 231-243 (IPR Nos. '255 and '256 Exhibit 2141).
Darpa, Grand Challenge '05—Frequently Asked Questions, DARPA.com, http://archive.darpa.mil/grandchallenge05/qa.html) (2005), 3 pages. (IPR Nos. '255 and '256 Exhibit 2143).
Darpa, Urban Challenge, DARPA.com, http://archive.darpa.mil/grandchallenge/ ("DARPA Archive") (2007), 4 pages. (IPR Nos. '255 and '256 Exhibit 2144).
Garmin, How the LIDAR-Lite v3/v3HP works with reflective surfaces, GARMIN.com, https://support.garmin.com/en-US/?faq=IVeHYIKwChAY0qCVhQiJ67 (last visited Aug. 24, 2018), 2 pages. (IPR Nos. '255 and '256 Exhibit 2145).
Weber, Where to? A History of Autonomous Vehicles, Computer History Museum, https://support.garmin.com/en-US/?faq=IVeHYIKwChAY0qCVhQiJ67 (May 8, 2014), 23 pages. (IPR Nos. '255 and '256 Exhibit 2146).
Turk, et al., VITS -A Vision System for Autonomous Land Vehicle Navigation, 10 IEEE No. 3 (May 1988), pp. 342-361. (IPR Nos. '255 and '256 Exhibit 2147).
Amann, Laser ranging: a critical review of usual techniques for distance measurement, 40(1) Society of Photo-Optical Instrumentation Engineers (Jan. 2001), pp. 10-19. (IPR Nos. '255 and '256 Exhibit 2148).
Omron, Technical Explanation for Displacement Sensors and Measurement Sensors, CSM_Displacemente_LineWidth_TG_E_2_1 (2018), 8 pages. (IPR Nos. '255 and '256 Exhibit 2149).
Kaufmann, Choosing Your Detector, OE Magazine (Mar. 2005), 3 pages. (IPR Nos. '255 and '256 Exhibit 2150).
Kaufmann, Light Levels and Noise—Guide Detector Choices, Photonics Spectra 149 (Jul. 2000), 4 pages. (IPR Nos. '255 and '256 Exhibit 2151).
Kilpela, Pulsed Time-of-Flight Laser Range Finder Techniques for Fast, High Precision Measurement Applications (Academic dissertation, University of Oulu) (2004), 98 pages. (IPR Nos. '255 and '256 Exhibit 2152).
Makynen, Position-Sensitive Devices and Sensor System for Optical Tracking and Displacement Sensing Applications (Academic Dissertation, University of Oulu (2000), 121 pages. (IPR Nos. '255 and '256 Exhibit 2153).
MTI Instruments Inc., An Introduction to Laser Triangulation Sensors, https://www.azosensors.com/article.aspx?ArticleID=523 (Aug. 28, 2014), 9 pages. (IPR Nos. '255 and '256 Exhibit 2154).
Panasonic, Measurement Sensors: *Specular* vs *Diffuse*, Panasonic Blog, https://na.industrial.panasonic.com/blog/measurement-sensorsspecular-vs-diffuse (Dec. 7, 2011), 2 pages. (IPR Nos. '255 and '256 Exhibit 2155).
Inter Parties Review, Deposition of James F. Brennan, III, *Quanergy Systems, Inc.* v. *Velodyne Lidar, Inc.*, Nos. IPR2018-00255 and IPR2018-00256 (Aug. 23, 2018), 241 pages. (IPR Nos. '255 and '256 Exhibit 2156).
Uwinnipeg, Centripetal Acceleration, Uwinnipeg.ca, http://theory.uwinnipeg.ca/physics/circ/node6.html (1997), 2 pages. (IPR Nos. '255 and '256 Exhibit 2157).
Accetta et al., Active Electro-Optical Systems, The Infrared and Electro-Optical Systems Handbook (1993, ed. by Clifton Fox), pp. 3-76. (IPR Nos. '255 and '256 Exhibit 2158).
Hamamatsu, Image Sensors Webpage (Mar. 17, 2006), 1 page. (IPR Nos. '255 and '256 Exhibit 2160).
Maatta et al., A High-Precision Time-to-Digital Converter for Pulsed Time-of-Flight Laser Radar Applications, 47 IEEE No. 2, 521 (Apr. 1998), pp. 521-536. (IPR Nos. '255 and '256 Exhibit 2161).
English, et al., The Complementary Nature of triangulation and ladar technologies, 5791 Proceedings of SPIE (May 19, 2005), pp. 29-41. (IPR Nos. '255 and '256 Exhibit 2162).
Reymann et al., Improving LiDAR Point Cloud Classification using Intensities and Multiple Echoes, IEE/RSJ International Conference on Intelligent Robots and Systems (Sep. 2015), 8 pages. (IPR Nos. '255 and '256 Exhibit 2167).
Haran et al., Infrared Reflectivy of Pedestrian Mannequin for Autonomous Emergency Braking Testing, IEEE 19th International Conference on Intelligent Transportation Systems (ITSC) (2016), 6 pages. (IPR Nos. '255 and '256 Exhibit 2168).
Song et al., Assessing the Possibility of Land-Cover Classification Using LiDAR Intensity Data, Commission III, PCV02 (2002), 4 pages. (IPR Nos. '255 and '256 Exhibit 2169).
Ibeo, Ibeo Automobile Sensor GmbH—Scanner Technology webpage (Brennan Deposition Exhibit 1) (Mar. 23, 2004), 1 page. (IPR Nos. '255 and '256 Exhibit 2171).
Ibeo, Ibeo Automobile Sensor GmbH—The ALASCA project webpage (Brennan Deposition Exhibit 2) (Oct. 6, 2003), 1 page. (IPR Nos. '255 and '256 Exhibit 2172).
Sick LMS200/211/221/291 Laser Measurement Systems—Technical Description (Brennan Deposition Exhibit 3) (2006), 48 pages. (IPR Nos. '255 and '256 Exhibit 2173).
Sick LMS 200/ LMS 211/ LMS 220 / LMS 221/ LMS 291 Laser Measurement Systems—Technical Description (Brennan Deposition Exhibit 4) (Jun. 2003), 40 pages. (IPR Nos. '255 and '256 Exhibit 2174).
Strang, Drawing of cross-section of I-beam by Jonathan Strang (Brennan Deposition Exhibit 5), (2018) 1 page. (IPR Nos. '255 and '256 Exhibit 2175).
Sick Laser Triangulation Sensors Product Information (Brennan Deposition Exhibit 6) (Jun. 25, 2018), 76 pages. (IPR Nos. '255 and '256 Exhibit 2176).
Thin Lens Equation, http://hyperphysics.phyastr.gsu.edu/hbase/geoopt/lenseq.html (last visited Dec. 30, 2018) (Brennan Deposition Exhibit 7), 4 pages. (IPR Nos. '255 and '256 Exhibit 2177).
Inter Parties Review, Images of Generator Rotors (Brennan Deposition Exhibit 8) (2018), 2 pages. (IPR Nos. '255 and '256 Exhibit 2178).
Sick DME 2000 Operating Instructions (Excerpt) (Brennan Deposition Exhibit 9) (May 2002), 42 pages. (IPR Nos. '255 and '256 Exhibit 2179).
Sick Sensick Measuring Distance with Light—Distance Sensors Product Overview (Brennan Deposition Exhibit 10) (2004), 12 pages. (IPR Nos. '255 and '256 Exhibit 2180).
Acuity, Acuity Short Range Sensors Product Information webpage (Brennan Deposition Exhibit 11) (last visited Dec. 30, 2018), 3 pages. (IPR Nos. '255 and '256 Exhibit 2181).
Acuity, Acuity Drill Pipe Runout Product Information webpage (Brennan Deposition Exhibit 12) (last visited Dec. 28, 2018), 2 pages. (IPR Nos. '255 and '256 Exhibit 2182).

(56) References Cited

OTHER PUBLICATIONS

Acuity, Acuity AR700 Laser Displacement Sensor Product Information webpage (Brennan Deposition Exhibit 13) (last visited Dec. 28, 2018), 9 pages. (IPR Nos. '255 and '256 Exhibit 2183).
Acuity, Acuity Aluminum Billet Scalping Production Information webpage (Brennan Deposition Exhibit 14) (last visited Dec. 28, 2018), 2 pages. (IPR Nos. '255 and '256 Exhibit 2184).
Kilpela, Excerpt of Pulsed Time-of-Flight Laser Range Finder Techniques for Fast, High Precision Measurement Applications, at Fig. 24 (Academic dissertation, University of Oulu (Brennan Deposition Exhibit 15) (2004), 1 page. (IPR Nos. '255 and '256 Exhibit 2185).
Brennan, Drawing of I-beam by Dr. Brennan (Brennan Deposition Exhibit 16), (Jan. 4, 2019), 1 page. (IPR Nos. '255 and '256 Exhibit 2186).
Yu et al., A New 3D Map Reconstruction Based Mobile Robot Navigation, IEEE (2006), 4 pages. (IPR Nos. '255 and '256 Exhibit 2189).
Furstenberg, et al., New Sensor for 360 Vehicle Surveillance—Innovative Approach to Stop & Go, Lane Assistance and Pedestrian Recognition (May 2001), 5 pages. (IPR Nos. '255 and '256 Exhibit 2190).
Ewald et al., Object Detection with Laser Scanners for Automotive Applications, IFAC Control in Transportation Systems (2000), pp. 369-372. (IPR Nos. '255 and '256 Exhibit 2191).
Fuerstenberg, et al., Pedestrian Recognition and Tracking of Vehicles using a vehicle based Multilayer Laserscanner, IEEE (2002), 12 pages. (IPR Nos. '255 and '256 Exhibit 2192).
Langheim, et al., Sensing of Car Environment at Low Speed Driving, CARSENSE (2002), 14 pages. (IPR Nos. '255 and '256 Exhibit 2193).
Inter Parties Review, Deposition of James F. Brennan, III, *Quanergy Systems, Inc.* v. *Velodyne Lidar, Inc.*, Nos. IPR2018-00255 and IPR2018-00256 (Jan. 4, 2019), 267 pages. (IPR Nos. '255 and '256 Exhibit 2194).
Kluge, Laserscanner for Automotive Applications (May 2001), 5 pages. (IPR Nos. '255 and '256 Exhibit 2196).
Kaempchen, Feature-Level Fusion of Laser Scanner and Video Data for Advanced Drive Assistance Systems (Ph.D. Dissertation, Ulm University) (2007), 248 pages. (IPR Nos. '255 and '256 Exhibit 2198).
Heenan, et al., Feature-Level Map Building and Object Recognition for Intersection Safety Applications, in Advanced Microsystems for Automotive Applications (Jurgen Valldorf and Wolfgang Gessner eds.) (2005), pp. 505-519. (IPR Nos. '255 and '256 Exhibit 2199).
Lages, Laserscanner for Obstacle Detection in Advanced Microsystems for Automotive Applications Yearbook (S. Kruger et al. eds.) (2002), pp. 136-140. (IPR Nos. '255 and '256 Exhibit 2200).
Inter Parties Review, Declaration of J. Gary Eden, Ph.D. in Support of Patent Owner's Reply in Support of Its Motion to Amend (Jan. 16, 2019), 71 pages. (IPR Nos. '255 and '256 Exhibit 2202).
Inter Parties Review, PTAB Conference Call, *Quanergy Systems, Inc.* v. *Velodyne Lidar, Inc.*, Nos. IPR2018-00255 and 2018-00256 (Jan. 11, 2019), 27 pages. (IPR Nos. '255 and '256 Exhibit 2204).
Macadam, Understanding and Modeling the Human Driver, 40 Vehicle System Dynamics, Nos. 1-3 (2003), pp. 101-134. (IPR Nos. '255 and '256 Exhibit 2205).
Taranovich, Are processor algorithms key to safe self-driving cars? EDN ASIA, https://www.ednasia.com/news/article/are-processor-algorithms-key-tosafe-self-driving-cars (Jul. 7, 2016), 11 pages. (IPR Nos. '255 and '256 Exhibit 2206).
IPO Education Foundation, Inventor of the Year Award, https://www.ipoef.org/inventor-of-the-year/(2018), 5 pages. (IPR Nos. '255 and '256 Exhibit 2207).
Inter Parties Review, Petition for Inter Partes Review of U.S. Pat. No. 7,969,558 (Claims 16-19 and 23-25) (IPR No. 2018-00256, *Quanergy Systems, Inc.* v. *Velodyne Lidar, Inc.*) (Nov. 29, 2017), 73 pages. (IPR No. 2018-00256).

Inter Parties Review, Replacement Petition for Inter Partes Review of U.S. Pat. No. 7,969,558 (Claims 16-19 and 23-25) (2018) 76 pages. (IPR No. 2018-00256).
Inter Parties Review, Patent Owner's Preliminary Response (Public Version—Redacted) (Mar. 7, 2018), 73 pages. (IPR No. 2018-00256).
Inter Parties Review, Decision: Institution of Inter Partes Review (May 25, 2018), 12 pages. (IPR No. 2018-00256).
Inter Parties Review, Petitioner's Motion to Submit Supplemental Information Pursuant to 37 C.F.R. § 42.123(b) (Aug. 6, 2018), 16 pages. (IPR No. 2018-00256).
Inter Parties Review, Decision: Petitioner's Motion to Submit Supplemental Information Pursuant to 37 C.F.R. § 42.123(b) (Aug. 8, 2018), 4 pages. (IPR No. 2018-00256).
Inter Parties Review, Patent Owner's Response (Public Version—Redacted) (Sep. 28, 2018), 92 pages. (IPR No. 2018-00256).
Inter Parties Review, Patent Owner's Contingent Motion to Amend (Public Version—Redacted) (Sep. 28, 2018), 57 pages. (IPR No. 2018-00256).
Inter Parties Review, Petitioner's Unopposed Motion to Submit Replacement Petition and Supplemental Declaration (Nov. 5, 2018), 9 pages. (IPR No. 2018-00256).
Inter Parties Review, Petitioner's Reply to Patent Owner's Response (Dec. 21, 2018), 37 pages. (IPR No. 2018-00256).
Inter Parties Review, Petitioner Quanergy's Opposition to Patent Owner's Contingent Motion to Amend (Dec. 21, 2018), 35 pages. (IPR No. 2018-00256).
Inter Parties Review, Patent Owner's Surreply (Jan. 16, 2019), 50 pages. (IPR No. 2018- 00256).
Inter Parties Review, Patent Owner's Reply in Support of Its Contingent Motion to Amend (Jan. 16, 2019), 33 pages. (IPR No. 2018-00256).
Inter Parties Review, Petitioner's Updated Exhibit List (Jan. 30, 2019), 15 pages. (IPR No. 2018-00256).
Inter Parties Review, Petitioner Quanergy's Sur-Surreply (Jan. 30, 2019), 9 pages. (IPR No. 2018-00256).
Inter Parties Review, Petitioner Quanergy's Surreply to Patent Owner's Contingent Motion to Amend (Jan. 30, 2019), 17 pages. (IPR No. 2018-00256).
Inter Parties Review, Patent Owner's Updated Exhibit List (Feb. 11, 2019), 20 pages. (IPR No. 2018-00256).
Inter Parties Review, Final Written Decision (May 23, 2019), 41 pages. (IPR No. 2018- 00256).
Inter Parties Review, Petitioner's Request for Rehearing (Jun. 24, 2019), 20 pages. (IPR No. 2018-00256).
Inter Parties Review, Decision Denying Petitioner's Request for Rehearing (May 21, 2020), 26 pages. (IPR No. 2018-00256).
Besl, Active, Optical Range Imaging Sensors Machine Visions and Applications (1988), Springer-Verlag New York Inc., pp. 1:127-152 (IPR Nos. '255 and '256 Exhibit 1015).
Carson, N. "Defending GPS against the Spoofing Threat using Network Based Detection and 3, 15,20 Successive Interference Cancellation". Auburn University. Nov. 2015, 35 pages.
Excelitas Technologies, "Avalanche Photodiode. A User Guide", 2011 Excelitas Technologies Corp., pp. 1-8.
Hall, et al., Team DAD Technical Paper, DARPA Grand Challenge 2005, XP-002543336, Aug. 26, 2005, pp. 1-12. (IPR Nos. '255 and '256 Exhibit 1081).
U.S. Patent Office, Information Disclosure Statement, U.S. Appl. No. 10/391,383 (U.S. Pat. No. 7130672, Pewzner) (Aug. 3, 2005), 8 pages.
U.S. Patent Office, Information Disclosure Statement, U.S. Appl. No. 10/508,232 (U.S. Pat. No. 7,313,424, Mayevsky) (Apr. 21, 2006), 17 pages.
PCT International Search Report and Written Opinion, App. No. PCT/US2018/059452, Jan. 16, 2019, 12 pages.
Juberts, et al., "Status report on next generation LADAR for driving unmanned ground vehicles" Mobile Robots XVII, edited by Douglas W. Gage, Proceedings of SPIE, vol. 5609, 2004, pp. 1-12.
Kawata, "Development of ultra-small lightweight optical range sensor system", 2005 IEEE/RSJ International Conference on Intelligent Robots and Systems, Edmonton, AB, Canada, Aug. 2-6, 2005, pp. 58-63 (IPR Nos. '255 and '256 Exhibit 1033).

(56) References Cited

OTHER PUBLICATIONS

Laser Components Produkte, Laser Components IG, Inc., 2004, 1 page.
Laser Components, "High Power Pulsed Laser Diodes 905D3J08-Series", Laser Components IG, Inc., 2004, 6 pages.
Liu, et al., "Coupling Study of a Rotary Capacitive Power Transfer System" Industrial Technology, 2009. ICIT 2009. IEEE International Conference, IEEE, Piscataway, NJ, USA, Feb. 10, 2009, pp. 1-6.
Manandhar, "Auto-Extraction of Urban Features from Vehicle-Borne Laser Data", Centre for Spatial Information Science, The University of Tokyo, Japan; Symposium on Geospatial Theory, Processing Applications, Ottawa (2002) 6 pages. (IPR Nos. '255 and '256 Exhibit 1017).
Morsy et al., "Multispectral LiDAR Data for Land Cover Classification of Urban Areas," Sensors 17(5), 958 (2017), 21 pages.
Office of the Federal Register National Archives and Records Administration, "Code of Federal Regulations, 21, Parts 800 to 1299, Revised as of Apr. 1, 2005, Food and Drugs", Apr. 1, 2005, pp. 1-23.
Saleh, "Fundamentals of Photonics" vol. 2, Wiley-Interscience Publication, 1991, pp. 342-383, 494-541, and 592-695. (IPR Nos. '255 and '256 Exhibit 1008).
Skolnik, "Radar Handbook" Second Edition, McGraw-Hill Publishing Company, 1990, pp. 1-1191.
The Laser Institute of America, "American National Standard of Safe Use of Lasers" ANSI Z136.1-2000, Revision of Ansi Z136.1-1993, Second Printing 2003, 32 pages.
Westinghouse, "AN/TPS-43 E Tactical Radar System" (1999), pp. 1-14.
PCT International Search Report and Written Opinion, App. No. PCT/US2018/025395, dated Jun. 25, 2018, 14 pages.
PCT International Search Report and Written Opinion, App. No. PCT/US2017/015874, dated May 23, 2017, 12 pages.
PCT International Search Report and Written Opinion, App. No. PCT/US2017/015877, dated Apr. 13, 2017, 13 pages.
PCT International Search Report and Written Opinion, App. No. PCT/US2017/023261, dated May 26, 2017, 11 pages.
PCT International Search Report and Written Opinion, App. No. PCT/US2018/051497, dated Nov. 28, 2018, 11 pages.
PCT International Search Report and Written Opinion, App. No. PCT/US2019/046422, dated Dec. 3, 2019, 9 pages.
PCT International Search Report and Written Opinion, App. No. PCT/US2018/023283, dated Jun. 1, 2018, 9 pages.
PCT International Search Report and Written Opinion, App. No. PCT/US2017/023259, dated May 31, 2017, 10 pages.
PCT International Search Report and Written Opinion, App. No. PCT/US2017/015869, Apr. 10, 2017, 12 pages.
PCT International Search Report and Written Opinion, App. No. PCT/US2018/050934, Nov. 20, 2018, 10 pages.
PCT International Search Report and Written Opinion, App. No. PCT/US2010/037129, Jul. 27, 2010, 6 pages.
PCT International Search Report and Written Opinion, App. No. PCT/US2017/036865, Sep. 26, 2017, 10 pages.
PCT International Search Report and Written Opinion, App. No. PCT/US2017/023262, Jun. 5, 2017, 9 pages.
PCT International Search Report and Written Opinion, App. No. PCT/US2017/047543, Nov. 27, 2017, 11 pages.
PCT International Search Report and Written Opinion, App. No. PCT/US2018/059062, Jan. 16, 2019, 6 pages.
PCT International Search Report and Written Opinion, App. No. PCT/US2019/046573, Nov. 15, 2019, 9 pages.
PCT International Search Report and Written Opinion, App. No. PCT/US2019/016259, Apr. 26, 2019, 6 pages.
PCT International Search Report and Written Opinion, App. No. PCT/US2019/051729, Nov. 20, 2019, 7 pages.
Jelalian, "Laser Radar Systems" (1992), 1 page.
Code of Federal Regulations, Food and Drugs Rule—Performance Standards for Light-Emitting Products, 21 C.F.R. § 1040.10 (2005).
Singh, "Cyclone: A Laser Scanner for Mobile Robot Navigation" (Sep. 1991), pp. 1-18.
Bornstein, "Where am I? Sensors and Methods for Mobile Robot Positioning" (1996), pp. 95-112.
Nagappan, "Adaptive Cruise Control: Laser Diodes as an Alternative to Millimeter Wave Radars" (Sep. 2005), pp. 1-5.
Hancock, "Laser Intensity Based Obstacle Detecting and Tracking" (Jan. 1999), pp. 45-65.
Reutebuch, "LiDAR: an Emerging Tool for Multiple Resource Inventory," Journal of Forestry (Sep. 2005) 7 pages.
Zheng, "The Technique of Land 3D Laser Scanning and Imaging Surveying," Railway Aerial Survey, vol. 2 (2003), 3 pages.
Qing, "Method of 3D visualization using laser radar on board of mobile robot," Journal of Jilin University (Information Science Ed.), vol. 22 (Jul. 2004), 4 pages.
Widmann, "Development of Collision Avoidance Systems at Delphi Automotive Systems" (1998), pp. 353-358.
Fischer, "Rapid Measurement and Mapping of Tracer Gas Concentrations in a Large Indoor Space" (May 2000), 27 pages.
Marino, "Jigsaw: A Foliage-Penetrating 3D Imaging Laser Radar System" (2005), pp. 23-36.
Thrun, "Probabilistic Terrain Analysis for High-Speed Desert Driving" (Oct. 2005), 7 pages.
Oshkosh, "Team Terramax: DARPA Grand Challenge 2005" (Oct. 2005), pp. 1-14.
Glennie, Reign of Point Clouds: A Kinematic Terrestrial LiDAR Scanning System (2007), pp. 22-31.
Ullrich, et al., "High-performance 3D-imaging laser sensor," Proceedings of SPIE vol. 3707 (Jun. 1999), pp. 658-664. (IPR Nos. '255 and '256 Exhibit 1014).
Ozguner, "Team TerraMax and the DARPA Grand Challenge: a General Overview," IEEE Intelligent Vehicles Symposium (2004), 6 pages.
Laser Components, https://web.archive.org/web/20041205172904/http:www.lasercomponents.com (2004), 1 page. (IPR Nos. '255 and '256 Exhibit 1023).
*Quanergy Systems, Inc. v. Velodyne LiDAR, Inc.* (N.D. Cal.), Case No. 5:16-cv-05251, "Plaintiff Quanergy Systems, Inc.'s Invalidity Contentions and Production of Documents Pursuant to Patent Local Rules 3-3 and 3-4," Mar. 27, 2017, 24 pages.
*Quanergy Systems, Inc. v. Velodyne LiDAR, Inc.* (N.D. Cal.), Case No. 5:16-cv-05251, "Plaintiff Quanergy Systems, Inc.'s Amended Invalidity Contentions Pursuant to Patent Local Rule 3-3," May 23, 2017, 238 pages.
*Quanergy Systems, Inc. v. Velodyne LiDAR, Inc.* (N.D. Cal.), Complaint, Case No. 5:16-cv-05251 (Sep. 13, 2016), 21 pages.
*Quanergy Systems, Inc. v. Velodyne LiDAR, Inc.* (N.D. Cal.), Case No. 5:16-cv-05251, Amended Complaint, Nov. 18, 2016, 6 pages.
*Quanergy Systems, Inc. v. Velodyne LiDAR, Inc.* (N.D. Cal.), Case No. 5:16-cv-05251, Defendant Velodyne's Answer and Counterclaim, Dec. 5, 2016, 20 pages.
*Quanergy Systems, Inc. v. Velodyne LiDAR, Inc.* (N.D. Cal.), Case No. 5:16-cv-05251, Answer to Counterclaim, (Jan. 16, 2017) 9 pages.
*Velodyne Lidar, Inc. v. Hesai Photonics Technology Co., Ltd.* (N.D. Cal.), Complaint, Case No. 5:19-cv-04742 (Aug. 13, 2019), 13 pages.
*Velodyne Lidar, Inc. v. Sunteng Innovation Technology Co., Ltd.* ("Robosense") (N.D. Cal.), Complaint, Case No. 5:19-cv-04746 (Aug. 13, 2019), 13 pages.
Mercotac Model 305, Electrical Slip Rings, https://web.archive.org/web/20060210065251 9/www.mercotac.com/html/305.htm (Feb. 2006), 3 pages.
Mercotac, 3-Conductor Rotary Electrical Connectors https://web.archive.org/web/20060317120209/http://www.mercotac.com:80/html/threeconductor.html (Mar. 2006), 1 page.
McManamon, "Optical Phased Array Technology," Proceedings of the IEEE, vol. 84, No. 2 (Feb. 1996), pp. 268-298.
Chapman, "Introduction to Laser Safety" (Sep. 10, 2007), 19 pages.
Wulf, "2D Mapping of Cluttered Indoor Environments by Means of 3D Perception," Proceedings of the 2004 IEEE International Conference on Robotics & Automation (Apr. 2004), pp. 4204-4209.
Riegl, "Riegl LMS-Z210" (2003), 8 pages.

(56) References Cited

OTHER PUBLICATIONS

Spies, "Extended Eyes—Sense and Avoid," Presented at the 2006 International Aerospace Exhibition, Berlin (May 2006), 22 pages.
Ibeo, "Ibeo multilayer tech" (2004), 1 page.
Ibeo, "Ibeo Time of Flight" (2004), 1 page.
Ibeo, "Ibeo products," https://web.archive.org/web/20040606115118/http/:www.ibeoas.de:80/html/prod/prod.html (2004), 1 page.
Ibeo, "Ibeo multitarget capability," https://web.archive.org/web/20040323030746/, http/:www.ibeoas.de:80/html/knho/knho-senstech-mlc.html (2004), 1 page.
Ibeo, "Ibeo about," https://web.archive.org/web/20040606111631/http/:www.ibeoas.de:80/html/about/about (2004).
Ibeo, "Ibeo history," https://web.archive.org/web/20040807161657/, http/:www.ibeoas.de:80/html/about/ab_history.html (2004), 1 page.
Ibeo, "Ibeo roadmap," https://web.archive.org/web/20041209032449/http/:www.ibeoas.de:80/html/prod/prod_roadmap.html (2004), 1 page.
Ibeo, "Ibeo data and prices," https://web.archive.org/web/20041209025137/ http://www.ibeoas.de:80/html/prod/prod_dataprices.html (2004), 2 pages.
Ibeo, "Ibeo products," https://web.archive.org/web/20041011011528/http://www.ibeoas.de:80/html/prod/prod.html (2004), 1 page.
Ibeo, "Ibeo publications," https://web.archive.org/web/20031208175052/ http://www.ibeoas.de:80/html/public/public.html (2003), 2 pages.
Ibeo, "Ibeo Motiv sensor," https://web.archive.org/web/20040113062910/, http://www.ibeoas.de:80/html/rd/rd_rs_motiv.htm (1997-2000), 1 page.
Ibeo, "Ibeo LD Multilayer data sheet," https://web.archive.org/web/20031003201743/ http://www.ibeoas.de:80/html/prod/prod_ld_multi.html (2003), 1 page.
Fox, "Active electro-optical systems," The infrared and electro-optical systems handbook, vol. 6 (1993), pp. 1-80.
Gustavson, "Diode-laser radar for low-cost weapon guidance," SPIE vol. 1633, Laser radar VII (1992), pp. 1-12.
Skolnik, "Introduction to radar systems," Second edition, McGraw-Hill book company (1980), pp. 1-3.
Trepagnier, "Team gray technical paper," DARPA grand challenge 2005 (Aug. 28, 2005), 14 pages.
Riegl LMS-Q120, http://web.archive.org/web/20050113054822/ http:/www.riegl.com/industrial_scanners_/lms_q120_/q120_all_.htm (2005), 4 pages.
Glennie, Performance analysis of a kinematic terrestrial LiDAR scanning system, MAPPS/ASPRS 2006 fall conference (Nov. 6-10, 2006), 9 pages.
Albota, "Three-dimensional imaging laser RADAR with a photon-counting avalanche photodiode array and microchip laser," Applied optics, vol. 41, No. 36 (Dec. 20, 2002), 8 pages.
Marino, "A compact 3D imaging laser RADAR system using Geiger-mode APD arrays: system and measurements," Proceedings of SPIE—The international society for optical engineering (Aug. 2003), 16 pages.
Zhao, "A vehicle-borne urban 3-D acquisition system using single-row laser range scanners," IEEE transactions on systems, man, and cybernetics, vol. 33, No. 4 (Aug. 2003), pp. 658-666.
Fuerstenberg, Pedestrian detection and classification by laserscanners, (2003), 8 pages.
Kohanbash, "LiDAR fundamentals—robots for roboticists" (May 5, 2014), 6 pages.
Sensick, "DME 2000 / DME 3000: Precise non-contact distance determination," Sensick Catalogue (2006), pp. 450-457. (IPR Nos. '255 and '256 Exhibit 1073).
Lamon, "The SmarTer for ELROB 2006—a vehicle for fully autonomous navigation and mapping in outdoor environments" (2005), 14 pages.
Urmson, "High speed navigation of unrehearsed terrain: red team technology for grand challenge 2004" (Jun. 1, 2004), 47 pages.
Ohr, "War raises stakes of next DARPA bot race," EDN (Aug. 15, 2005), 3 pages.
Cravotta, "Operating alone," EDN (Dec. 5, 2005), 6 pages.

International Electrotechnical Commission, "Safety of laser products—part 1: equipment classification and requirements," International Standard IEC 60825-1, edition 1.2 (Aug. 2001), 122 pages.
International Electrotechnical Commission, "Safety of laser products—part 1: equipment classification and requirements," International Standard IEC 60825-1, edition 2.0 (2007), 104 pages.
Stone, "Performance analysis of next-generation LADAR for manufacturing, construction, and mobility" (May 2004), 198 pages.
U.S. International Trade Commission, Investigation No. 337-TA-1173, "Respondent Hesai Photonics Technology Co., Ltd.'s Notice of Prior Art," Nov. 13, 2019, 35 pages.
U.S. International Trade Commission, Investigation No. 337-TA-1173, "Respondent Robosense's Notice of Prior Art," Nov. 13, 2019, 34 pages.
Aiestaran et al. "A Fluorescent Linear Optical Fiber Position Sensor" Elsevier B.V. May 21, 2008 (4 pages).
European Patent Office, Office Action, App. No. EP 11166432.2 (dated Oct. 7, 2019), 6 pages.
Canadian Patent Office, Office Action, App. No. CA 3,012,003 (dated Aug. 28, 2019), 3 pages.
Canadian Patent Office, Office Action, App. No. CA 3,017,735 (dated Aug. 28, 2019), 3 pages.
Canadian Patent Office, Office Action, App. No. CA 3,017,811 (dated Aug. 28, 2019), 3 pages.
European Patent Office, Office Action, App. No. EP 07840406.8 (dated Mar. 15, 2011) 7 pages.
European Patent Office, Office Action, App. No. EP 11166432.2 (dated Jan. 29, 2019), 3 pages.
European Patent Office, Office Action, App. No. EP 11166432.2 (dated Oct. 14, 2016), 4 pages.
European Patent Office, Office Action, App. No. EP 11166432.2 (dated Oct. 5, 2015), 4 pages.
PCT Search Report and Written Opinion (Corrected), App. No. PCT/US2020/026925, dated May 12, 2020, 5 pages.
PCT Search Report and Written Opinion, App. No. PCT/US2020/012633, dated Jun. 2, 2020, 13 pages.
PCT Search Report and Written Opinion, App. No. PCT/US2020/012635, dated Jun. 4, 2020, 10 pages.
Search Report and Opinion, EP App. No. 07840406.8, dated Sep. 8, 2009, 6 pages.
Search Report and Opinion, EP App. No. 11166432.2, dated Jul. 28, 2011, 7 pages.
Search Report and Opinion, EP App. No. 17745112.7, dated Aug. 27, 2019, 8 pages.
Search Report and Opinion, EP App. No. 17770748.6, dated Oct. 22, 2019, 10 pages.
Search Report and Opinion, EP App. No. 17770926.8, dated Oct. 29, 2019, 11 pages.
Search Report and Opinion, EP App. No. 17770928.4, dated Oct. 29, 2019, 10 pages.
Search Report and Opinion, EP App. No. 17807474.6, dated Dec. 9, 2019, 9 pages.
Darpa, Grand Challenge Media—Frequently Asked Questions (Media),DARPA.com, http://archive.darpa.mil/grandchallenge04/media_faq.htm (2004), 3 pages.
PCT International Search Report and Written Opinion, App. No. PCT/US2018/031682, dated Sep. 17, 2018, 2 pages Aug. 25, 2020.
PCT International Search Report and Written Opinion, App. No. PCT/US2017/035427, dated Aug. 29, 201, 10 pages.
U.S. Appl. No. 15/941,302, filed Mar. 30, 2018, Hall et al.
U.S. Appl. No. 16/510,680, filed Jul. 12, 2019, Hall et al.
U.S. Appl. No. 16/510,749, filed Jul. 12, 2019, Hall et al.
U.S. Appl. No. 15/420,384, filed Jan. 31, 2017, Hall et al.
U.S. Appl. No. 16/030,780, filed Jul. 9, 2018, Hall et al.
U.S. Appl. No. 11/777,802, filed Jul. 13, 2007, Hall.
U.S. Appl. No. 13/109,901, filed May 17, 2011, Hall et al.
U.S. Appl. No. 15/180,580, filed Jun. 13, 2016, Hall et al.
U.S. Appl. No. 15/700,543, filed Sep. 11, 2017, Hall et al.
U.S. Appl. No. 15/700,558, filed Sep. 11, 2017, Hall et al.
U.S. Appl. No. 15/700,571, filed Sep. 11, 2017, Hall et al.
U.S. Appl. No. 15/700,836, filed Sep. 11, 2017, Hall et al.
U.S. Appl. No. 15/700,844, filed Sep. 11, 2017, Hall et al.
U.S. Appl. No. 15/700,959, filed Sep. 11, 2017, Hall et al.

(56) References Cited

OTHER PUBLICATIONS

U.S. Appl. No. 15/700,965, filed Sep. 11, 2017, Hall et al.
U.S. Appl. No. 16/912,648, filed Jun. 25, 2020, Hall et al.
U.S. Appl. No. 15/926,095, filed Mar. 30, 2018, Hall et al.
U.S. Appl. No. 15/464,227, filed Mar. 30, 2017, Hall et al.
U.S. Appl. No. 15/464,221, filed Mar. 30, 2017, Hall et al.
U.S. Appl. No. 15/974,527, filed May 8, 2018, Hall et al.
U.S. Appl. No. 16/748,498, filed Jan. 21, 2020, Hall et al.
U.S. Appl. No. 15/610,975, filed Jun. 1, 2017, Hall et al.
U.S. Appl. No. 16/546,131, filed Aug. 20, 2019, Hall et al.
U.S. Appl. No. 16/842,491, filed Apr. 7, 2020, Hall et al.
U.S. Appl. No. 16/546,184, filed Aug. 20, 2019, Hall et al.
U.S. Appl. No. 16/546,206, filed Aug. 20, 2019, Hall et al.
U.S. Appl. No. 16/909,306, filed Jun. 23, 2020, Hall et al.
U.S. Appl. No. 15/339,790, filed Oct. 31, 2016, Hall et al.
U.S. Appl. No. 16/854,755, filed Apr. 21, 2020, Hall et al.
U.S. Appl. No. 16/905,843, filed Jun. 18, 2020, Hall et al.
U.S. Appl. No. 16/905,849, filed Jun. 18, 2020, Hall et al.
U.S. Appl. No. 16/909,846, filed Jun. 23, 2020, Hall et al.
U.S. Appl. No. 15/835,983, filed Dec. 8, 2017, Hall et al.
U.S. Appl. No. 16/459,557, filed Jul. 1, 2019, Rekow et al.
U.S. Appl. No. 16/841,506, filed Apr. 6, 2020, Rekow et al.
U.S. Appl. No. 16/112,273, filed Aug. 24, 2018, Avlas et al.
U.S. Appl. No. 16/181,523, filed Nov. 6, 2018, Pinto et al.
U.S. Appl. No. 16/241,849, filed Jan. 7, 2019, Hall et al.
U.S. Appl. No. 16/241,963, filed Jan. 7, 2019, Hall et al.
*Quanergy Systems, Inc. v. Velodyne Lidar, Inc.* (N.D. Cal.), filed Sep. 13, 2016.
*Velodyne Lidar, Inc. v. Hesai Photonics Technology Co., Ltd.* (N.D. Cal.), filed Aug. 13, 2019.
*Velodyne Lidar, Inc. v. Suteng Innovation Technology Co., Ltd.* (N.D. Cal.) filed Aug. 13, 2019.
In re Certain Systems Containing the Same (ITC), Investigation No. ITC-337-TA-1173, filed Aug. 15, 2019.
Petition for Inter Partes Review (USPTO Patent Trial and Appeal Board), Case No. IPR2018-00255. filed Nov. 29, 2017.
Petition for Inter Partes Review (USPTO Patent Trial and Appeal Board), Case No. IPR2018-000255, filed Nov. 29, 2017.
Canadian Patent Office, Office Action, App. No. CA 3,012,003 (dated Sep. 18, 2020), 4 pages.
Canadian Patent Office, Office Action, App. No. CA 3,024,510 (dated Oct. 16, 2020), 6 pages.
Darpa, Grand Challenge Media—Frequently Asked Questions (Media),DARPA.com, http://archive.darpa.mil/grandchallenge04/media_faq.htm (2004), 3 pages. (IPR Nos. '255 and '256 Exhibit 2142).
European Patent Office, Communication Pursuant to Rules 70(2) and 70a(2) EPC, App. No. 18771534.7 (dated Jan. 14, 2021), 1 page.
European Patent Office, Examination Report, Appl. No. 17745112.7 (dated Jul. 1, 2020), 6 pages.
European Patent Office, Office Action, App. No. 17770748.6 (dated Sep. 14, 2020), 10 pages.
European Patent Office, Office Action, App. No. 17770926.8 (dated Sep. 9, 2020), 5 pages.
European Patent Office, Office Action, App. No. 18886541.4 (dated Jun. 3, 2020), 3 pages.
Extended Search Report, EP App. No. 18774795.1, dated Nov. 11, 2020, 9 pages.
Extended Search Report, EP App. No. 18798447.1, dated Dec. 10, 2020, 7 pages.
Glennie, C., et al., "A Comparison of Laser Scanners for Mobile Mapping Applications," Abstract and slides for a presentation given in 2011, 22 pages.
Glennie, C., et al., "Static Calibration and Analysis of the Velodyne HDL-64E S2 for High Accuracy Mobile Scanning," Remote Sensing 2010, 2: pp. 1610-1624.
Japanese Patent Office, Notice of Reasons for Rejections, App. No. 2018-549918 (dated Jan. 26, 2021), 4 pages.

Japanese Patent Office, Office Action, App. No. 2019-500215 (dated Dec. 8, 2020), 5 pages.
Merriam-Webster, Aperture definition, https://web.archive.org/web/20170817144540/https://www.merriam-webster.com/dictionary/aperture (Aug. 17, 2017), 4 pages.
Milenkovic, "Introduction to LiDAR," NEWFOR2014 Summer School (Jul. 2014), 77 pages (IPR. Nos. '255 and '256, Exhibit 2166).
Neff, "The Laser That's Changing the World," Prometheus Books (2018), pp. 193-204 and 270- 271.
PCT International Search Report and Written Opinion, App. No. PCT/US2017/035427, dated Aug. 29, 2017, 10 pages.
PCT International Search Report and Written Opinion, App. No. PCT/US2018/031682, dated Sep. 17, 2018, 12 pages.
PCT International Search Report and Written Opinion, App. No. PCT/US2019/046412, dated Jun. 24, 2020, 10 pages.
PCT International Search Report and Written Opinion, App. No. PCT/US2019/046419, dated Oct. 29, 2019, 14 pages.
Russian Patent Office, Office Action, App. No. 2020121407 (dated Jul. 23, 2020), 5 pages.
Satterfield, B., et al., "Advancing Robotics: The Urban Challenge Effect," Journal of Aerospace Computing, Information, and Communication, vol. 5, Dec. 2008, pp. 530-542.
Sick, "Distance Sensors," https://web.archive.org/web/20041213053807/http:/www.Ipc-uk.com:80/sick/sickdist.htm (Dec. 13, 2004), 3 pages.
U.S. International Trade Commission, Investigation No. 337-TA-1173, Appendix B to Respondent's Response to the Complaint and Notice of Investigation, Oct. 21, 2019, pp. 1-4.
U.S. International Trade Commission, Investigation No. 337-TA-1173, "Complainant Velodyne and Respondent Hesai's Joint Notice," Jul. 9, 2020, 3 pages.
U.S. International Trade Commission, Investigation No. 337-TA-1173, "Complainant Velodyne Lidar Inc.'s Motion for Summary Determination," Public Version, Mar. 6, 2020, 168 pages.
U.S. International Trade Commission, Investigation No. 337-TA-1173, "Complainant Velodyne Lidar Inc.'s Opposition to Respondent Hesai's Motion for Summary Determination of Invalidity of U.S. Pat. No. 7,969,558," Public Version, Mar. 18, 2020, 184 pages.
U.S. International Trade Commission, Investigation No. 337-TA-1173, "Complainant Velodyne Lidar Inc.'s Opposition to Respondent Hesai's Motion to Amend," Public Version, Feb. 28, 2020, 108 pages.
U.S. International Trade Commission, Investigation No. 337-TA-1173, "Complainant Velodyne Lidar, Inc.'s Disclosure of Domestic Industry Products," Nov. 8, 2019, 3 pages.
U.S. International Trade Commission, Investigation No. 337-TA-1173, "Complainant Velodyne Lidar, Inc.'s Motion in Limine No. 3 to Exclude Evidence and Testimony that Krumes Discloses any Limitations of Claims 2 and 9 of the '558 Patent," Sep. 2, 2020, 26 pages.
U.S. International Trade Commission, Investigation No. 337-TA-1173, "Complainant Velodyne's Motion in Limine No. 1 to Limit the Testimony of Robosense's Expert, Jason Janet, PhD.," Public Version, Sep. 2, 2020, 34 pages.
U.S. International Trade Commission, Investigation No. 337-TA-1173, "Complainant Velodyne's Motion in Limine No. 2 to Exclude any Testimony from Dr. Janet Regarding an Alleged Motivation to Combine or Reasonable Expectation of Success," Public Version, Sep. 2, 2020, 22 pages.
U.S. International Trade Commission, Investigation No. 337-TA-1173, "Complainant Velodyne's Supplemental Motion for Summary Determination Regarding Inventorship," Public Version, Sep. 10, 2020, 26 pages.
U.S. International Trade Commission, Investigation No. 337-TA-1173, "Complaint of Velodyne Lidar, Inc. Under Section 337 of the Tariff Act of 1930, as Amended," Aug. 15, 2019, 45 pages.
U.S. International Trade Commission, Investigation No. 337-TA-1173, "Hesai's Motion for Leave to Amend Its Response to the Complaint and Notice of Investigation," Public Version, Feb. 18, 2020, 82 pages.
U.S. International Trade Commission, Investigation No. 337-TA-1173, "Hesai's Unopposed Motion for Leave to File a Reply in

(56) References Cited

OTHER PUBLICATIONS

Support of Its Motion to Amend Its Response to the Complaint and Notice of Investigation," Public Version, Mar. 6, 2020, 30 pages.

U.S. International Trade Commission, Investigation No. 337-TA-1173, "Initial Determination Granting Joint Motion for Termination of the Investigation as to Respondent Hesai Based on a Settlement and Request for Limited Service of Settlement Agreement under CFR §210.21(b)," Public Version, Jul. 13, 2020, 4 pages.

U.S. International Trade Commission, Investigation No. 337-TA-1173, "Joint Chart of Substantive Legal Issues Being Litigated," Sep. 17, 2020, 5 pages.

U.S. International Trade Commission, Investigation No. 337-TA-1173, "Joint Chart of Substantive Legal Issues Being Litigated," Sep. 8, 2020, 6 pages.

U.S. International Trade Commission, Investigation No. 337-TA-1173, "Joint Motion for and Memorandum in Support of Termination of the Investigation as to Respondent Hesai Based on a Settlement and Request for Limited Service of Settlement Agreement under 19 CFR §210.21(b)," Public Version, Jul. 8, 2020, 77 pages.

U.S. International Trade Commission, Investigation No. 337-TA-1173, "Order No. 26: Granting Hesai's Motion for Leave to Amend Its Response to the Complaint and Notice of Investigation," May 7, 2020, 6 pages.

U.S. International Trade Commission, Investigation No. 337-TA-1173, "Order No. 27: Denying without Prejudice Velodyne's Motion for Summary Determination," Public Version, May 12, 2020, 11 pages.

U.S. International Trade Commission, Investigation No. 337-TA-1173, "Respondent Hesai's Motion for Summary Determination of Invalidity of U.S. Pat. No. 7,969,558," Public Version, Mar. 6, 2020, 109 pages.

U.S. International Trade Commission, Investigation No. 337-TA-1173, "Respondent Robosense's Opposition to Complainant Velodyne's Motion in Limine No. 3 to Exclude Evidence and Testimony That Krumes Discloses Any Limitations of Claims 2 and 9 of the '558 Patent," Sep. 9, 2020, 10 pages.

U.S. International Trade Commission, Investigation No. 337-TA-1173, "Respondent Robosense's Response in Opposition to Complainant Velodyne Lidar, Inc.'s Motion in Limine No. 1," Sep. 9, 2020, 11 pages.

U.S. International Trade Commission, Investigation No. 337-TA-1173, "Respondent RoboSense's Response in Opposition to Complainant Velodyne Lidar, Inc.'s Renewed Motion for Summary Determination Regarding Inventorship," Public Version, Sep. 8, 2020, 12 pages.

U.S. International Trade Commission, Investigation No. 337-TA-1173, "Respondent Robosense's Response in Opposition to Complainant"'s Motion in Limine No. 2, Sep. 9, 2020, 13 pages.

U.S. International Trade Commission, Investigation No. 337-TA-1173, "Respondent Suteng Innovation Technology Co., Ltd.'s Response to the Complaint and Notice of Investigation," Public Version, Oct. 21, 2019, 31 pages.

U.S. International Trade Commission, Investigation No. 337-TA-1173, "Respondents' Memorandum in Opposition to Complainant Velodyne Lidar Inc.'s Motion for Summary Determination," Public Version, Mar. 18, 2020, 190 pages.

U.S. International Trade Commission, Investigation No. 337-TA-1173, "Respondents' Response to the Complaint and Notice of Investigation," Public Version, Oct. 21, 2019, 36 pages.

ULTRA Puck, VLP-32C Data Sheet (2018), 2 pages. (IPR Nos. '255 and '256 Exhibit 2093).

Velodyne Lidar, Excerpts of Business Records (2007-2012), 2 pages. (IPR Nos. '255 and '256 Exhibit 2084).

Wikipedia, "Cassegrain reflector," Dec. 12, 2014, 5 pages (downloaded from Internet Archive, Sep. 29, 2020).

\* cited by examiner

INTEGRATED LIDAR ILLUMINATION POWER CONTROL

CROSS-REFERENCE TO RELATED APPLICATION(S)

The present application for patent is a continuation of U.S. patent application Ser. No. 15/941,302, entitled "Integrated LIDAR Illumination Power Control," filed Mar. 30, 2018, which claims priority under 35 U.S.C. § 119 from U.S. provisional patent application Ser. No. 62/480,119, entitled "Integrated LIDAR Illumination Power Control," filed Mar. 31, 2017, the disclosures of which are incorporated herein by reference in their entireties.

TECHNICAL FIELD

The described embodiments relate to LIDAR based 3-D point cloud measuring systems.

BACKGROUND

LIDAR systems employ pulses of light to measure distance to an object based on the time of flight (TOF) of each pulse of light. A pulse of light emitted from a light source of a LIDAR system interacts with a distal object. A portion of the light reflects from the object and returns to a detector of the LIDAR system. Based on the time elapsed between emission of the pulse of light and detection of the returned pulse of light, a distance is estimated. In some examples, pulses of light are generated by a laser emitter. The light pulses are focused through a lens or lens assembly. The time it takes for a pulse of laser light to return to a detector mounted near the emitter is measured. A distance is derived from the time measurement with high accuracy.

Some LIDAR systems employ a single laser emitter/detector combination combined with a rotating mirror to effectively scan across a plane. Distance measurements performed by such a system are effectively two dimensional (i.e., planar), and the captured distance points are rendered as a 2-D (i.e. single plane) point cloud. In some examples, rotating mirrors are rotated at very fast speeds (e.g., thousands of revolutions per minute).

In many operational scenarios, a 3-D point cloud is required. A number of schemes have been employed to interrogate the surrounding environment in three dimensions. In some examples, a 2-D instrument is actuated up and down and/or back and forth, often on a gimbal. This is commonly known within the art as "winking" or "nodding" the sensor. Thus, a single beam LIDAR unit can be employed to capture an entire 3-D array of distance points, albeit one point at a time. In a related example, a prism is employed to "divide" the laser pulse into multiple layers, each having a slightly different vertical angle. This simulates the nodding effect described above, but without actuation of the sensor itself.

In all the above examples, the light path of a single laser emitter/detector combination is somehow altered to achieve a broader field of view than a single sensor. The number of pixels such devices can generate per unit time is inherently limited due to limitations on the pulse repetition rate of a single laser. Any alteration of the beam path, whether it is by mirror, prism, or actuation of the device that achieves a larger coverage area comes at a cost of decreased point cloud density.

As noted above, 3-D point cloud systems exist in several configurations. However, in many applications it is necessary to see over a broad field of view. For example, in an autonomous vehicle application, the vertical field of view should extend down as close as possible to see the ground in front of the vehicle. In addition, the vertical field of view should extend above the horizon, in the event the car enters a dip in the road. In addition, it is necessary to have a minimum of delay between the actions happening in the real world and the imaging of those actions. In some examples, it is desirable to provide a complete image update at least five times per second. To address these requirements, a 3-D LIDAR system has been developed that includes an array of multiple laser emitters and detectors. This system is described in U.S. Pat. No. 7,969,558 issued on Jun. 28, 2011, the subject matter of which is incorporated herein by reference in its entirety.

In many applications, a sequence of pulses is emitted. The direction of each pulse is sequentially varied in rapid succession. In these examples, a distance measurement associated with each individual pulse can be considered a pixel, and a collection of pixels emitted and captured in rapid succession (i.e., "point cloud") can be rendered as an image or analyzed for other reasons (e.g., detecting obstacles). In some examples, viewing software is employed to render the resulting point clouds as images that appear three dimensional to a user. Different schemes can be used to depict the distance measurements as 3-D images that appear as if they were captured by a live action camera.

Some existing LIDAR systems employ an illumination source and a detector that are not integrated together onto a common substrate (e.g., electrical mounting board). Furthermore, the illumination beam path and the collection beam path are separated within the LIDAR device. This leads to opto-mechanical design complexity and alignment difficulty.

In addition, mechanical devices employed to scan the illumination beams in different directions may be sensitive to mechanical vibrations, inertial forces, and general environmental conditions. Without proper design these mechanical devices may degrade leading to loss of performance or failure.

To measure a 3D environment with high resolution and high throughput, the measurement pulses must be very short. Current systems suffer from low resolution because they are limited in their ability to generate short duration pulses.

Saturation of the detector limits measurement capability as target reflectivity and proximity vary greatly in realistic operating environments. In addition, power consumption may cause overheating of the LIDAR system. Light devices, targets, circuits, and temperatures vary in actual systems. The variability of all of these elements limits system performance without proper calibration of the photon output of each LIDAR device.

Improvements in the illumination drive electronics and receiver electronics of LIDAR systems are desired to improve imaging resolution and range.

SUMMARY

Methods and systems for performing three dimensional LIDAR measurements with an integrated LIDAR measurement device are described herein.

In one aspect, an illumination driver of a LIDAR measurement device is a GaN based integrated circuit (IC) that selectively couples an illumination source to a source of electrical power to generate a measurement pulse of illumination light in response to a pulse trigger signal. The GaN based illumination driver includes field effect transistors (FETs) that offer higher current density than conventional silicon based complementary metal oxide on silicon (CMOS) devices. As a result the GaN based illumination driver is able to deliver relatively large currents to an illumination source with significantly less power loss.

In a further aspect, a return pulse receiver IC receives a pulse command signal from a master controller and communicates the pulse trigger signal to the illumination driver IC in response to the pulse command signal. The pulse trigger signal also triggers data acquisition of the return signal and associated time of flight calculation by the return pulse receiver IC. In this manner, the pulse trigger signal generated based on the internal clock of receiver IC is employed to trigger both pulse generation and return pulse data acquisition. This ensures precise synchronization of pulse generation and return pulse acquisition which enables precise time of flight calculations by time-to-digital conversion.

In another further aspect, the return pulse receiver IC measures time of flight based on the time elapsed between the detection of a pulse due to internal cross-talk between the illumination source and the photodetector of the integrated LIDAR measurement device and a valid return pulse. In this manner, systematic delays are eliminated from the estimation of time of flight.

In another aspect, the illumination driver IC includes a number of different FETs configured to control the current flow through the illumination source. Moreover, the number of FETs coupled to the illumination source is selectable based on a digital FET selection signal. In some embodiments, the FET selection signal is communicated from the return pulse receiver IC to the illumination driver IC.

In another aspect, the illumination driver IC includes a power save control module that modulates the power supplied to a portion of the circuitry of the illumination driver IC to reduce power consumption. In operation, the illumination driver IC spends a relatively short amount of time generating a measurement pulse and a relatively long amount of time waiting for a trigger signal to generate the next measurement pulse. During these idle periods, the illumination driver IC reduces or eliminates power supplied to circuit components that do not need to be active for the entire waiting period.

In another aspect, the illumination driver IC includes a pulse initiation signal generator that generates a pulse initiation signal based on the pulse trigger signal. In addition, the illumination driver IC includes a pulse termination signal generator that generates a pulse termination signal. Together, the pulse initiation signals and the pulse termination signals directly determine the timing of the pulse generated by the illumination driver IC. The illumination driver IC generates a pulse of programmable duration based on a value of an analog pulse width control signal received from the return pulse receiver IC. The illumination driver generates a pulse termination signal having a delay from the pulse initiation signal based on the value of the pulse width control signal.

In another aspect, the illumination driver IC generates a pulse of programmable amplitude based on a value of an analog amplitude control signal received from the return pulse receiver IC.

In another aspect, a master controller is configured to generate a plurality of pulse command signals, each communicated to a different integrated LIDAR measurement device. Each return pulse receiver IC generates a corresponding pulse trigger signal based on the received pulse command signal.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Figure 1:
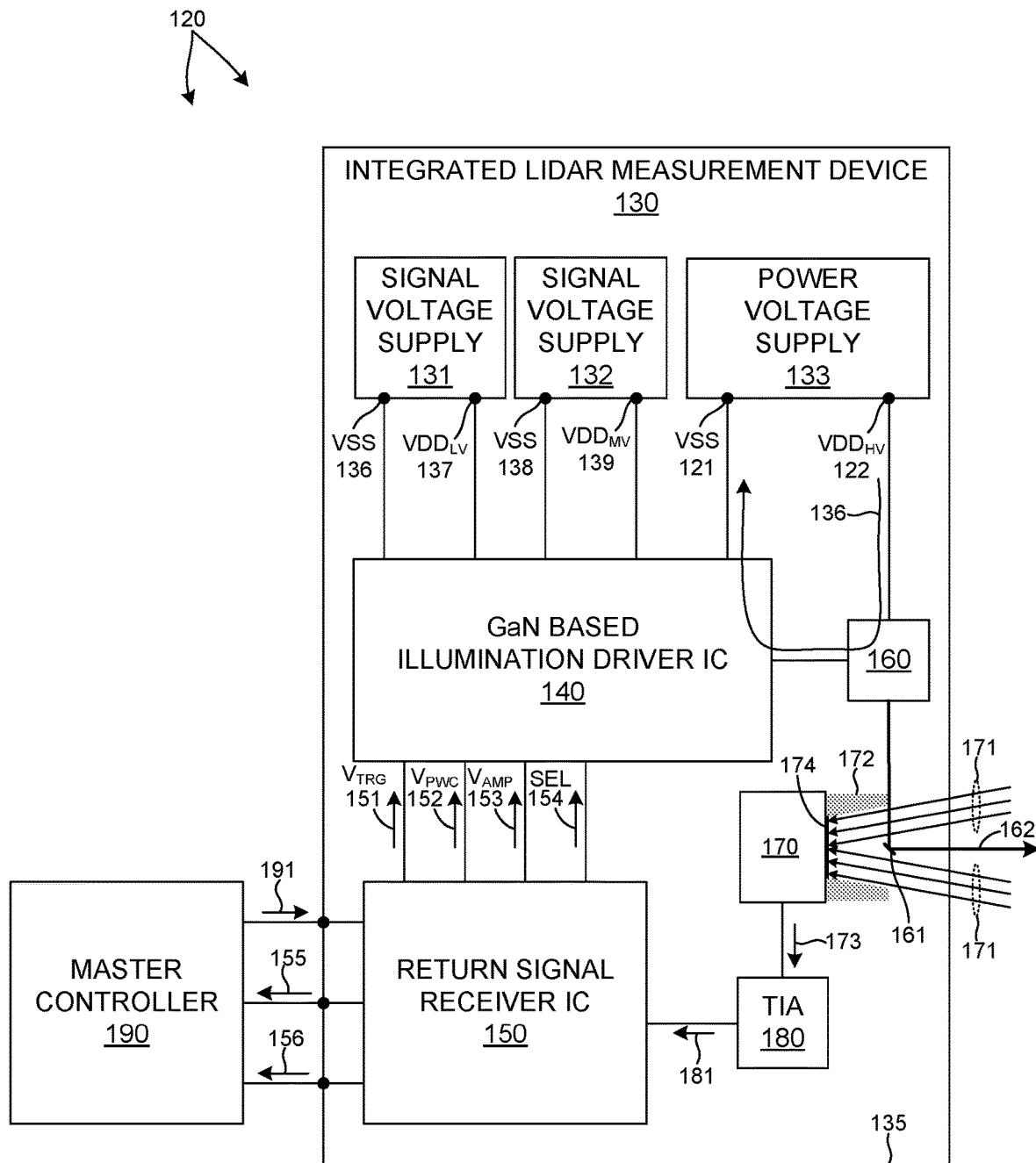
FIG. 1 is a simplified diagram illustrative of one embodiment of a LIDAR measurement system including at least one integrated LIDAR measurement device in at least one novel aspect.

FIG. 1 depicts an LIDAR measurement system 120 in one embodiment. LIDAR measurement system 120 includes a master controller 190 and one or more integrated LIDAR measurement devices 130. An integrated LIDAR measurement device 130 includes a return signal receiver integrated circuit (IC), a Gallium Nitride based illumination driver integrated circuit (IC) 140, an illumination source 160, a photodetector 170, and a trans-impedance amplifier (TIA) 180. Each of these elements is mounted to a common substrate 135 (e.g., printed circuit board) that provides mechanical support and electrical connectivity among the elements.

In addition, in some embodiments, an integrated LIDAR measurement device includes one or more voltage supplies that provide voltage to the electronic elements mounted to substrate 135 and electrical power to the illumination device 160. As depicted in FIG. 1, integrated LIDAR measurement device 130 includes a low signal voltage supply 131 configured to supply a relatively low voltage across nodes $VDD_{LV}$ 137 and VSS 136. In some embodiments, the voltage supplied by voltage supply 131 is approximately five volts. This voltage is selected to ensure that the voltage supplied at the gates of one or more of the transistors of illumination driver IC 140 does not exceed the damage threshold. In addition, integrated LIDAR measurement device 130 includes a medium signal voltage supply 132 configured to supply a voltage across nodes $VDD_{MV}$ 139 and VSS 138 that is higher than the voltage supplied by low voltage supply 131. In some embodiments, the voltage supplied by voltage supply 132 is approximately twelve volts. This voltage is selected to ensure fast switching transitions of one or more of the transistors of illumination driver IC 140. In addition, integrated LIDAR measurement device 130 includes a power voltage supply 133 configured to supply a voltage across nodes $VDD_{HV}$ 122 and VSS 121 that is higher than the voltage supplied by medium voltage supply 132. In some embodiments, the voltage supplied by voltage supply 133 is approximately fifteen to twenty volts. Voltage supply 133 is configured to supply high current 136 (e.g., one hundred amperes, or more) to illumination source 160 that causes illumination source 160 to emit a pulse of measurement light.

Although, preferred output voltages have been described herein, in general, supplies 131, 132, and 133 may be configured to supply any suitable voltage. In addition, the voltage supplies 131, 132, and 133 described with reference to FIG. 1 are mounted to substrate 135. However, in general, any of the power supplies described herein may be mounted to a separate substrate and electrically coupled to the various elements mounted to substrate 135 in any suitable manner. Although power supplies 131, 132, and 133 are described as voltage supplies with reference to FIG. 1, in general, any electrical power source described herein may be configured to supply electrical power specified as voltage or current. Hence, any electrical power source described herein as a voltage source or a current source may be contemplated as an equivalent current source or voltage source, respectively.

Illumination source 160 emits a measurement pulse of illumination light 162 in response to a pulse of electrical current 136. The illumination light 162 is focused and projected onto a particular location in the surrounding environment by one or more optical elements of the LIDAR system.

In some embodiments, the illumination source 160 is laser based (e.g., laser diode). In some embodiments, the illumination source is based on one or more light emitting diodes. In general, any suitable pulsed illumination source may be contemplated.

As depicted in FIG. 1, illumination light 162 emitted from integrated LIDAR measurement device 130 and corresponding return measurement light 171 directed toward integrated LIDAR measurement device share a common optical path. Integrated LIDAR measurement device 130 includes a photodetector 170 having an active sensor area 174. As depicted in FIG. 1, illumination source 160 is located outside the field of view of the active area 174 of the photodetector. As depicted in FIG. 1, an overmold lens 172 is mounted over the photodetector 170. The overmold lens 172 includes a conical cavity that corresponds with the ray acceptance cone of return light 171. Illumination light 162 from illumination source 160 is injected into the detector reception cone by a fiber waveguide. An optical coupler optically couples illumination source 160 with the fiber waveguide. At the end of the fiber waveguide, a mirror element 161 is oriented at a 45 degree angle with respect to the waveguide to inject the illumination light 162 into the cone of return light 171. In one embodiment, the end faces of fiber waveguide are cut at a 45 degree angle and the end faces are coated with a highly reflective dielectric coating to provide a mirror surface. In some embodiments, the waveguide includes a rectangular shaped glass core and a polymer cladding of lower index of refraction. In some embodiments, the entire optical assembly is encapsulated with a material having an index of refraction that closely matches the index of refraction of the polymer cladding. In this manner, the waveguide injects the illumination light 162 into the acceptance cone of return light 171 with minimal occlusion.

The placement of the waveguide within the acceptance cone of the return light 171 projected onto the active sensing area 174 of detector 170 is selected to ensure that the illumination spot and the detector field of view have maximum overlap in the far field.

As depicted in FIG. 1, return light 171 reflected from the surrounding environment is detected by photodetector 170. In some embodiments, photodetector 170 is an avalanche photodiode. Photodetector 170 generates an output signal 173 that is amplified by an analog trans-impedance amplifier (TIA) 180. However, in general, the amplification of output signal 173 may include multiple, amplifier stages. In this sense, an analog trans-impedance amplifier is provided by way of non-limiting example, as many other analog signal amplification schemes may be contemplated within the scope of this patent document. Although TIA 180 is depicted in FIG. 1 as a discrete device separate from the receiver IC 150, in general, TIA 180 may be integrated with receiver IC 150. In some embodiments, it is preferable to integrate TIA 180 with receiver IC 150 to save space and reduce signal contamination.

As depicted in FIG. 1, the amplified signal 181 is communicated to return signal receiver IC 150. Receiver IC 150 includes timing circuitry and a time-to-digital converter that estimates the time of flight of the measurement pulse from illumination source 160, to a reflective object in the three dimensional environment, and back to the photodetector 170. A signal 155 indicative of the estimated time of flight is communicated to master controller 190 for further processing and communication to a user of the LIDAR measurement system 120. In addition, return signal receiver IC 150 is configured to digitize segments of the return signal 181 that include peak values (i.e., return pulses), and communicate signals 156 indicative of the digitized segments to master controller 190. In some embodiments, master controller 190 processes these signal segments to identify properties of the detected object. In some embodiments, master controller 190 communicates signals 156 to a user of the LIDAR measurement system 120 for further processing.

Master controller 190 is configured to generate a pulse command signal 191 that is communicated to receiver IC 150 of integrated LIDAR measurement device 130. In general, a LIDAR measurement system includes a number of different integrated LIDAR measurement devices 130. In these embodiments, master controller 190 communicates a pulse command signal 191 to each different integrated LIDAR measurement device. In this manner, master controller 190 coordinates the timing of LIDAR measurements performed by any number of integrated LIDAR measurement devices.

Pulse command signal 191 is a digital signal generated by master controller 190. Thus, the timing of pulse command signal 191 is determined by a clock associated with master controller 190. In some embodiments, the pulse command signal 191 is directly used to trigger pulse generation by illumination driver IC 140 and data acquisition by receiver IC 150. However, illumination driver IC 140 and receiver IC 150 do not share the same clock as master controller 190. For this reason, precise estimation of time of flight becomes much more computationally tedious when the pulse command signal 191 is directly used to trigger pulse generation and data acquisition.

In one aspect, receiver IC 150 receives pulse command signal 191 and generates a pulse trigger signal, $V_{TRG}$ 151, in response to the pulse command signal 191. Pulse trigger signal 151 is communicated to illumination driver IC 140 and directly triggers illumination driver IC 140 to electrically couple illumination source 160 to power supply 133 and generate a pulse of illumination light 162. In addition, pulse trigger signal 151 directly triggers data acquisition of return signal 181 and associated time of flight calculation. In this manner, pulse trigger signal 151 generated based on the internal clock of receiver IC 150 is employed to trigger both pulse generation and return pulse data acquisition. This ensures precise synchronization of pulse generation and return pulse acquisition which enables precise time of flight calculations by time-to-digital conversion.

Figure 2:
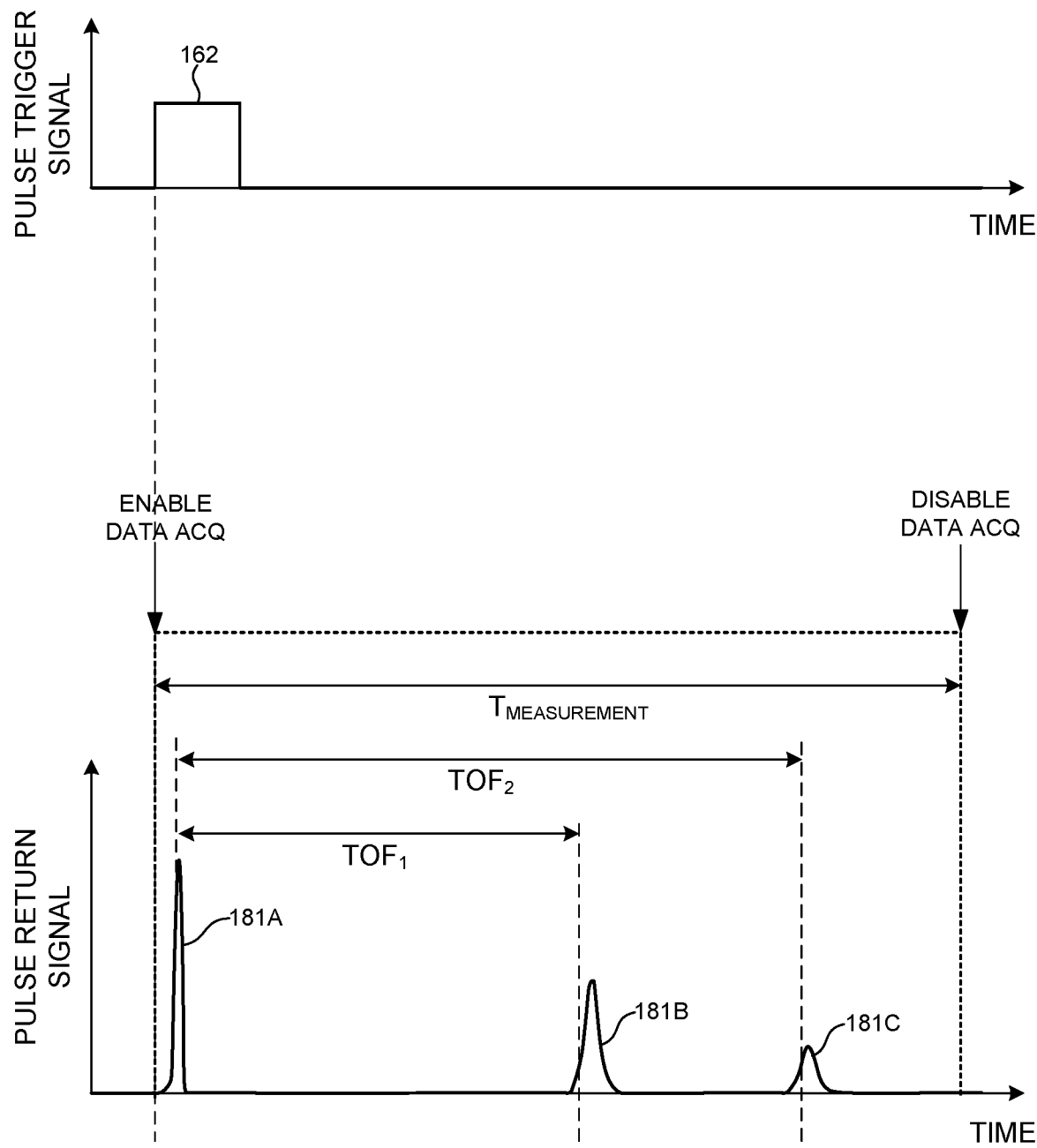
FIG. 2 depicts an illustration of the timing associated with the emission of a measurement pulse from an integrated LIDAR measurement device 130 and capture of the returning measurement pulse.

FIG. 2 depicts an illustration of the timing associated with the emission of a measurement pulse from an integrated LIDAR measurement device 130 and capture of the returning measurement pulse. As depicted in FIG. 2, a measurement is initiated by the rising edge of pulse trigger signal 162 generated by receiver IC 150. As depicted in FIGS. 1 and 2, an amplified, return signal 181 is received by receiver IC 150. As described hereinbefore, a measurement window (i.e., a period of time over which collected return signal data is associated with a particular measurement pulse) is initiated by enabling data acquisition at the rising edge of pulse trigger signal 162. Receiver IC 150 controls the duration of the measurement window, $T_{measurement}$, to correspond with the window of time when a return signal is expected in response to the emission of a measurement pulse sequence. In some examples, the measurement window is enabled at the rising edge of pulse trigger signal 162 and is disabled at a time corresponding to the time of flight of light over a distance that is approximately twice the range of the LIDAR system. In this manner, the measurement window is open to collect return light from objects adjacent to the LIDAR system (i.e., negligible time of flight) to objects that are located at the maximum range of the LIDAR system. In this manner, all other light that cannot possibly contribute to useful return signal is rejected.

As depicted in FIG. 2, return signal 181 includes three return measurement pulses that correspond with the emitted measurement pulse. In general, signal detection is performed on all detected measurement pulses. Further signal analysis may be performed to identify the closest valid signal 181B (i.e., first valid instance of the return measurement pulse), the strongest signal, and the furthest valid signal 181C (i.e., last valid instance of the return measurement pulse in the measurement window). Any of these instances may be reported as potentially valid distance measurements by the LIDAR system.

Internal system delays associated with emission of light from the LIDAR system (e.g., signal communication delays and latency associated with the switching elements, energy storage elements, and pulsed light emitting device) and delays associated with collecting light and generating signals indicative of the collected light (e.g., amplifier latency, analog-digital conversion delay, etc.) contribute to errors in the estimation of the time of flight of a measurement pulse of light. Thus, measurement of time of flight based on the elapsed time between the rising edge of the pulse trigger signal 162 and each valid return pulse (i.e., 181B and 181C) introduces undesirable measurement error. In some embodiments, a calibrated, pre-determined delay time is employed to compensate for the electronic delays to arrive at a corrected estimate of the actual optical time of flight. However, the accuracy of a static correction to dynamically changing electronic delays is limited. Although, frequent re-calibrations may be employed, this comes at a cost of computational complexity and may interfere with system up-time.

In another aspect, receiver IC 150 measures time of flight based on the time elapsed between the detection of a detected pulse 181A due to internal cross-talk between the illumination source 160 and photodetector 170 and a valid return pulse (e.g., 181B and 181C). In this manner, systematic delays are eliminated from the estimation of time of flight. Pulse 181A is generated by internal cross-talk with effectively no distance of light propagation. Thus, the delay in time from the rising edge of the pulse trigger signal and the instance of detection of pulse 181A captures all of the systematic delays associated with illumination and signal detection. By measuring the time of flight of valid return pulses (e.g., return pulses 181B and 181C) with reference to detected pulse 181A, all of the systematic delays associated with illumination and signal detection due to internal cross-talk are eliminated. As depicted in FIG. 2, receiver IC 150 estimates the time of flight, $TOF_1$, associated with return pulse 181B and the time of flight, $TOF_2$, associated with return pulse 181C with reference to return pulse 181A.

In some embodiments, the signal analysis is performed by receiver IC 150, entirely. In these embodiments, signals 155 communicated from integrated LIDAR measurement device 130 include an indication of the time of flight determined by receiver IC 150. In some embodiments, signals 156 include digitized segments of return signal 181 generated by receiver IC 150. These raw measurement signal segments are processed further by one or more processors located on board the 3-D LIDAR system, or external to the 3-D LIDAR system to arrive at another estimate of distance, an estimate of one of more physical properties of the detected object, or a combination thereof.

In one aspect, an illumination driver of a LIDAR measurement device is a GaN based IC that selectively couples an illumination source to a source of electrical power to generate a measurement pulse of illumination light in response to a pulse trigger signal. The GaN based illumination driver includes field effect transistors (FETs) that offer higher current density than conventional silicon based complementary metal oxide on silicon (CMOS) devices. As a result the GaN based illumination driver is able to deliver relatively large currents to an illumination source with significantly less power loss than a silicon based driver.

As depicted in FIG. 1, illumination driver IC 140 is coupled to a voltage node 121 of power voltage supply 133 and a node of illumination source 160. Another node of illumination source 160 is coupled to voltage node 122 of power voltage supply 133. In response to pulse trigger signal 151, a field effect transistor (FET) of illumination driver IC 140 becomes substantially conductive, and effectively couples illumination source 160 to node 121. This induces a high current flow 136 through illumination source 160, which stimulates the emission of a measurement pulse of illumination light 162.

Figure 3:
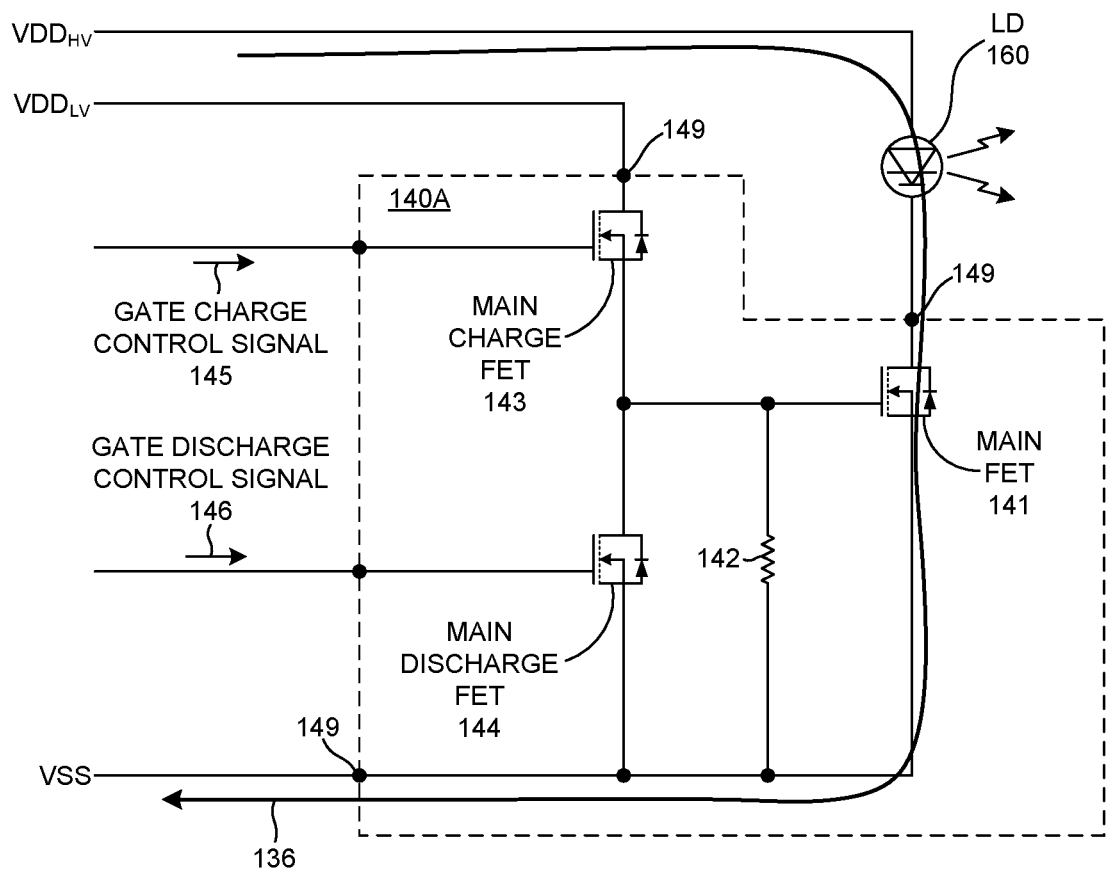
FIG. 3 depicts a simplified diagram illustrative of an illumination driver IC in one embodiment.

FIG. 3 depicts an embodiment 140A of illumination driver IC 140. In a further aspect, GaN based illumination driver IC 140A includes three FETs 141, 143, and 144 integrated onto a common GaN based IC. Main FET 141 controls the flow of current through illumination source 160 (e.g., laser diode 160). But, two additional transistors, main charge FET 143 and main discharge FET 144 control the gate voltage to main FET 141 to accelerate the transitions and minimize power losses.

As depicted in FIG. 3, the drain of main charge FET 143 is coupled to voltage node 137 of low voltage supply 131 depicted in FIG. 1. The source of main charge FET 143 is coupled to the drain of main discharge FET 144 and to the gate of main FET 141. The source of main discharge FET 144 is coupled to voltage node 136 of low voltage supply 131. In addition, a resistor is coupled between the gate of main FET 141 and voltage node 136 of low voltage supply 131. A gate charge control signal 145 is provided at the gate of main charge FET 143, and a gate discharge control signal 146 is provided at the gate of main discharge FET 144. In this manner, gate charge control signal 145 and gate discharge control signal 144 determine the charge at the gate of main FET 141, and thus the conductive state of main FET 141. In one example, the gate charge control signal is the pulse trigger signal 151 and the gate discharge control signal is the inverse of pulse trigger signal 151.

The embodiment 140A of illumination driver IC 140 depicted in FIG. 3 includes a single main FET 141 that determines the current flow through illumination source 160. In another aspect, illumination driver IC 140 includes a number of different FETs configured to control the current flow through illumination source 160. Moreover, the number of FETs coupled to the illumination source is programmable. This enables a programmable maximum current flow through illumination source 160, and thus a programmable maximum illumination pulse amplitude.

Figure 4:
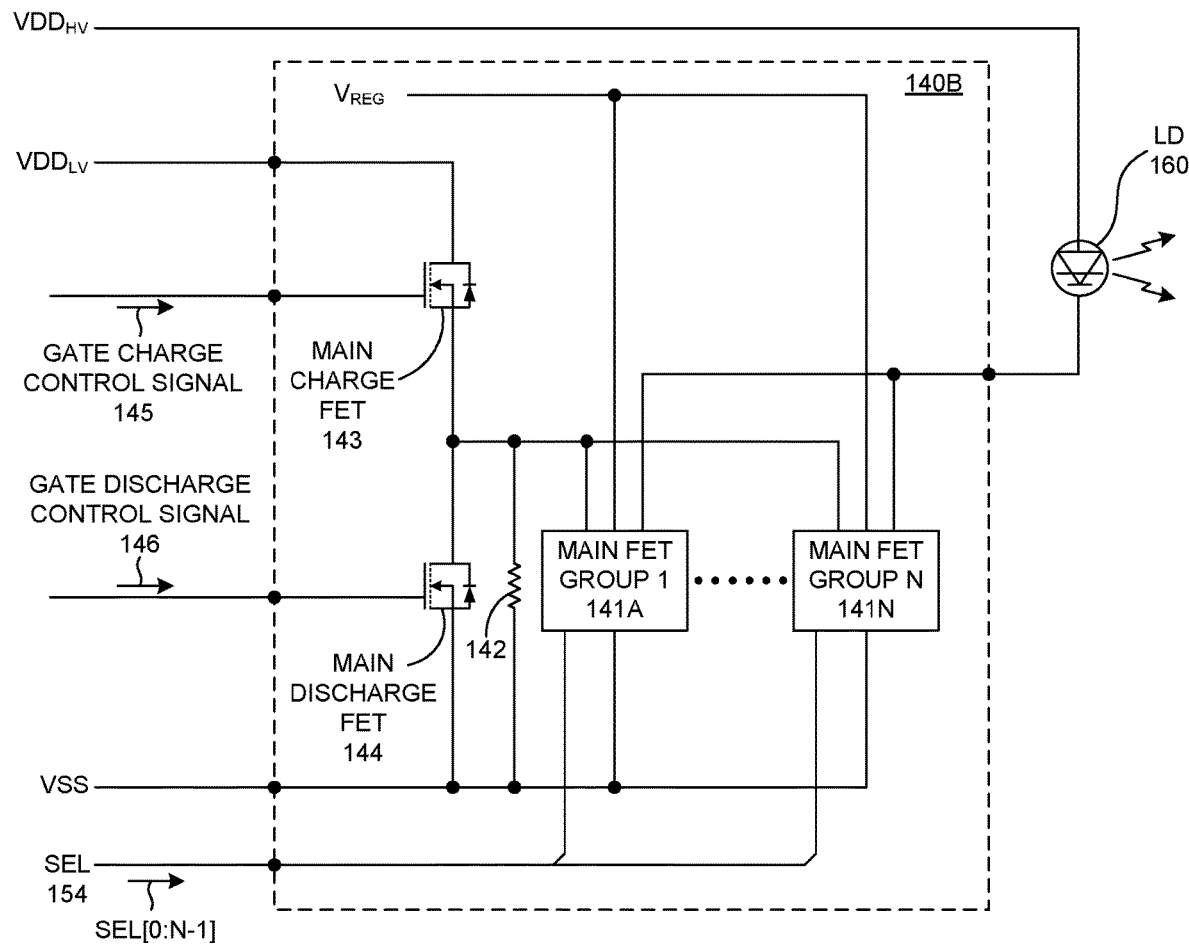
FIG. 4 depicts a simplified diagram illustrative of an illumination driver IC in another embodiment.

FIG. 4 depicts an embodiment 140B of illumination driver IC 140. Like numbered elements are described with reference to FIG. 3. As depicted in FIG. 4, N groups of one or more FETs are coupled in parallel with illumination source 160, where N is any positive, integer number. A drain of each main FET of each FET group 141A-141N is coupled to a node of illumination source 160. Similarly, a source of each main FET of each FET group 141A-141N is coupled to node 121 of power voltage supply 133. The gates of each main FET of each FET group 141A-141N are selectively coupled to the source of main charge FET 143 and the drain of main discharge FET 144. Whether each main FET of a particular group of FETs is electrically coupled to the source of main charge FET 143 and the drain of main discharge FET 144 is determined by the state of selection signal, SEL, 154 received from receiver IC 150. In the example depicted in FIG. 4, SEL is an N-bit word. Each bit corresponds with a particular main FET group. If a particular bit is in a high state, each main FET associated with the corresponding main FET group is coupled to the source of main charge FET 143 and the drain of main discharge FET 144. In this state, gate charge control signal 145 and gate discharge control signal 144 determine the charge at the gate of each main FET of the corresponding main FET group. In this manner, the state of each bit of the N-bit word determines which main FET groups will participate in pulse generation by illumination source 160.

Receiver IC 150 determines which FET groups should participate in the next measurement pulse by generating and communicating the SEL signal to illumination driver IC 140. In some examples, the determination is based on the return signal received from the prior measurement pulse. For example, if the received return signal is saturated, receiver IC 150 generates and communicates a selection signal, SEL, to illumination driver 140 with a larger number of zero valued bits to reduce the number of participating main FET groups. In this manner, the number of photons emitted in the next illumination pulse is reduced.

In some embodiments, the number of FETS in each main FET group is different. In this manner, different combinations of FET groups can be activated to achieve a wide range of participating FETs with uniform resolution.

Figure 5:
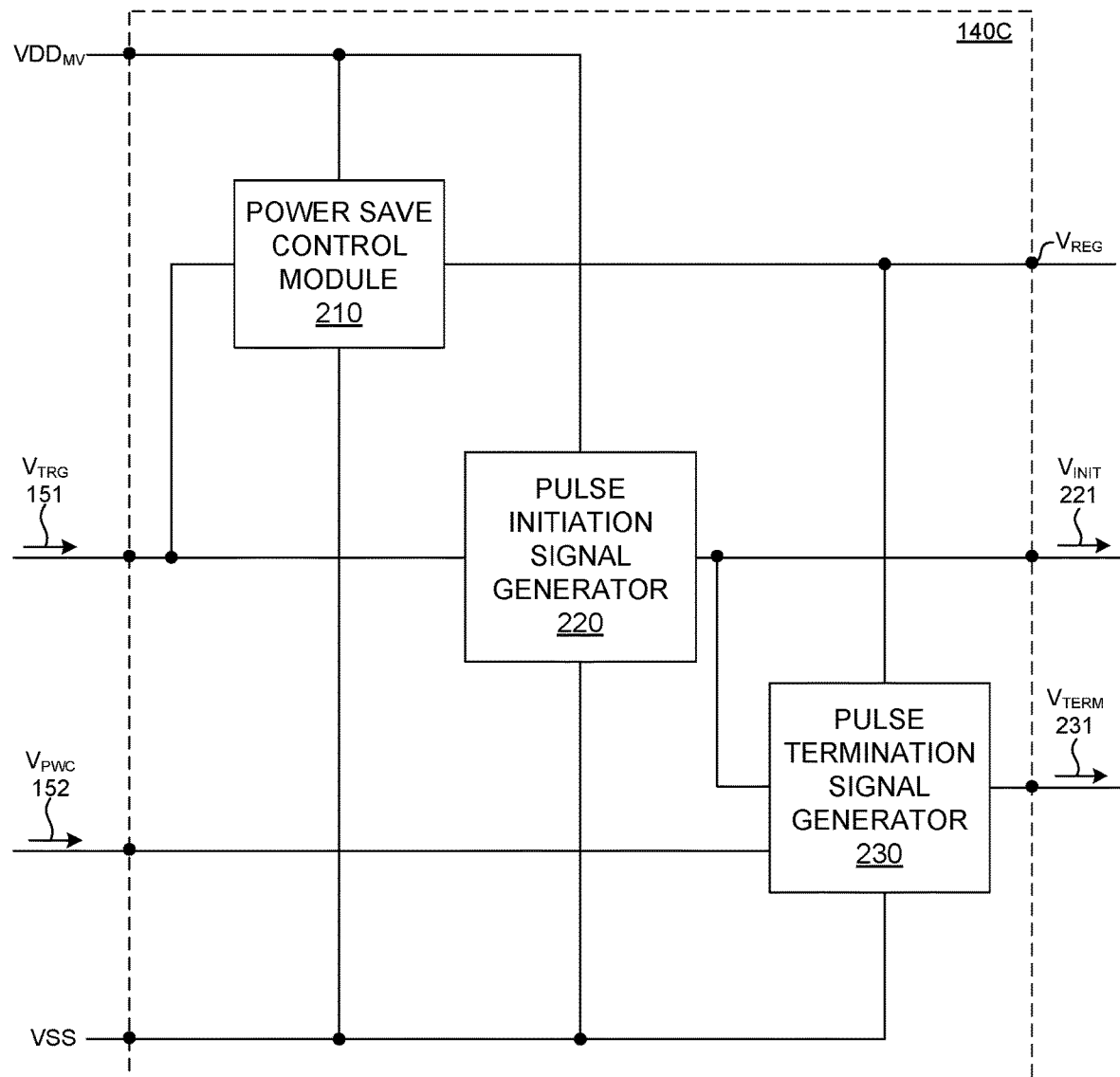
FIG. 5 depicts a simplified diagram illustrative of one embodiment of a portion of an illumination driver IC including a power save control module, a pulse initiation signal generator, and a pulse termination signal generator.

FIG. 5 depicts one embodiment 140C of a portion of illumination driver IC 140. As depicted in FIG. 5, illumination driver IC 140C includes a power save control module 210, a pulse initiation signal generator 220, and a pulse termination signal generator 230.

In another aspect, illumination driver IC 140 includes a power save control module that modulates the power supplied to a portion of the circuitry of illumination driver IC 140 to reduce power consumption. In operation, the illumination driver IC 140 spends a relatively short amount of time generating a measurement pulse and a relatively long amount of time waiting for a trigger signal to generate the next measurement pulse. During these idle periods, it is desirable to reduce or eliminate power supplied to circuit components that do not need to be active for the entire waiting period. As depicted in FIG. 5, power save control module 210 is coupled between voltage nodes $VDD_{MV}$ and VSS of signal voltage supply 132 depicted in FIG. 1. In addition, power save control module 210 receives pulse trigger signal 151 from receiver IC 150 and, in response, generates a regulated voltage, $V_{reg}$, that is supplied to various portion of illumination driver IC 140. For example, $V_{reg}$ is provided to the main FET groups 141A-141N depicted in FIG. 4, pulse amplitude control circuit 250 depicted in FIG. 9, and pulse termination signal generator 230 depicted in FIG. 5.

Figure 6:
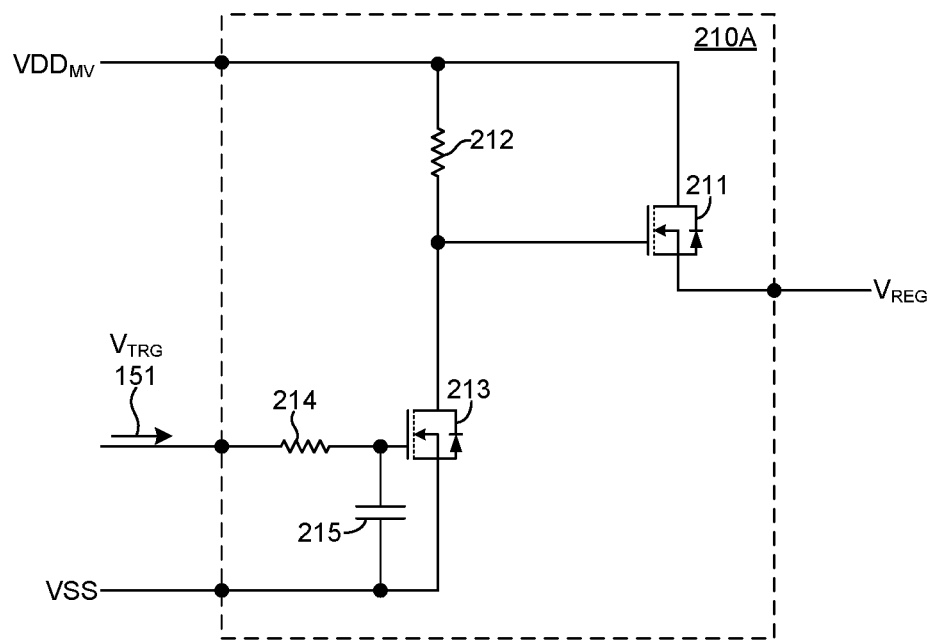
FIG. 6 depicts an embodiment of a power save control module in further detail.

FIG. 6 depicts an embodiment 210A of power save control module 210. Power save control module 210A includes a resistor 214. Pulse trigger signal 151 is provided on a first node of resistor 214. A second node of resistor 214 is coupled to a first node of capacitor 215. The other node of capacitor 215 is coupled to node 138 of signal voltage supply 132 depicted in FIG. 1. Power save control module 210A also includes a FET 213 having a source coupled to node 138 of signal voltage supply 132, a gate coupled to the second node of resistor 214, and a drain coupled to that gate of FET 211. The drain of FET 211 is coupled to a node 139 of signal voltage supply 132, and the regulated voltage, $V_{reg}$, is provided at the source of FET 211. Resistor 214 and capacitor 215 create an RC network that introduces a delay at the gate of FET 213. This introduces a delay ($T_{D-SLEEP}$ depicted in FIG. 10) between the rising edge of $V_{TRG}$ and the time when $V_{REG}$ drops to VSS during sleep mode.

Figure 10:
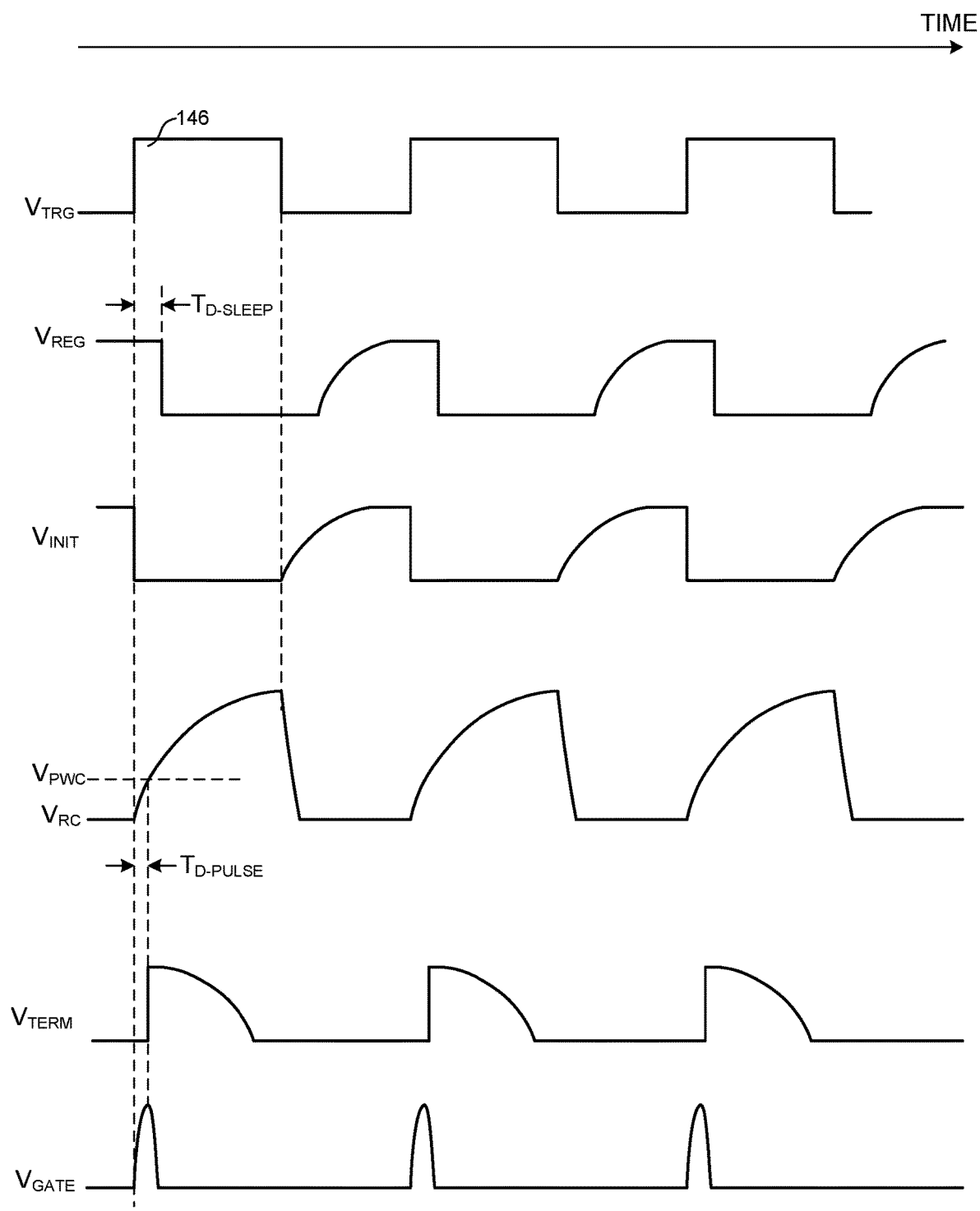
FIG. 10 depicts a simplified illustration of the changes in the regulated voltage, VREG, generated by a power save control module in response to the pulse trigger signal.

FIG. 10 depicts a simplified illustration of the changes in the regulated voltage, $V_{REG}$, generated by the power save control module 210 in response to the pulse trigger signal, $V_{TRG}$. As depicted in FIG. 10, at the rising edge of the pulse trigger signal, the regulated voltage remains high for a period of time, $T_{D-SLEEP}$. This length of time is determined by the values of resistor 214 and capacitor 215. After this period of time, the $V_{REG}$ drops quickly. At the falling edge of $V_{TRG}$, the regulated voltage remains low for a period of time and then ramps up to a relatively high voltage value, so that the illumination driver IC 140 is ready to generate a measurement pulse in response to the subsequent rising edge of $V_{TRG}$.

In another aspect, illumination driver IC 140 includes a pulse initiation signal generator 220 that generates a pulse initiation signal, $V_{INIT}$, to a portion of the GaN based illumination driver IC based on the pulse trigger signal. In addition, illumination driver IC 140 includes a pulse termination signal generator 230 that generates a pulse termination signal, $V_{term}$, to a portion of the GaN based illumination driver IC based on the pulse initiation signal. Together, the pulse initiation signals and the pulse termination signals directly determine the timing of the pulse generated by illumination driver IC 140. In other words, in some embodiments, rather than having the pulse trigger signal 151 directly determine the timing of the pulse generated by illumination driver IC 140, the pulse trigger signal 151 is employed to trigger the generation of the pulse initiation signal. The pulse initiation signal, in turn, directly initiates the pulse generation, and also initiates the generation of the pulse termination signal. The pulse termination signal, in turn, directly terminates the pulse generation.

Figure 7:
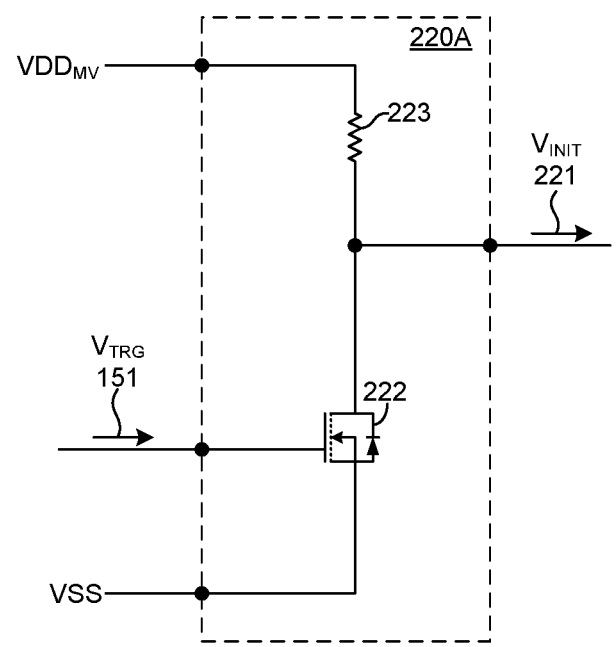
FIG. 7 depicts an embodiment of a pulse initiation signal generator in further detail.

FIG. 7 depicts an embodiment 220A of pulse initiation signal generator 220. Pulse initiation signal generator 220A includes a FET 222 and a resistor 223. Pulse trigger signal 151 is provided on the gate of FET 222. The source of FET 222 is coupled to node 138 of signal voltage supply 132 depicted in FIG. 1. A first node of resistor 223 is coupled to node 139 of signal voltage supply 132 and a second node of resistor 223 is coupled to the drain of FET 222. Pulse initiation signal 221 is provided at the drain of FET 222.

FIG. 10 depicts a simplified illustration of the changes in the pulse initiation signal, $V_{INIT}$, generated by the pulse initiation signal generator 220 in response to the pulse trigger signal, $V_{TRG}$. As depicted in FIG. 10, at the rising edge of the pulse trigger signal, $V_{INIT}$, drops to a low voltage value, VSS, very quickly. At the falling edge of $V_{TRG}$, $V_{INIT}$ ramps up to the value of $VDD_{MV}$, so that the illumination driver IC 140 is ready to generate a pulse initiation signal in response to the subsequent rising edge of $V_{TRG}$.

In another aspect, pulse termination signal generator 230 is configured to generate a pulse of programmable duration based on a value of an analog input signal. As depicted in FIG. 1, receiver IC 150 generates an analog pulse width control signal, $V_{PWC}$ 152, and communicates $V_{PWC}$ to illumination driver IC 140. In response, illumination driver IC 140 changes the pulse duration based on the received value of $V_{PWC}$. In the embodiment depicted in FIG. 5, pulse termination signal generator 230 receives $V_{PWC}$ and $V_{INIT}$ and generates a pulse termination signal, $V_{TERM}$, having a delay from $V_{INIT}$ programmed in accordance with a value of $V_{PWC}$.

Figure 8:
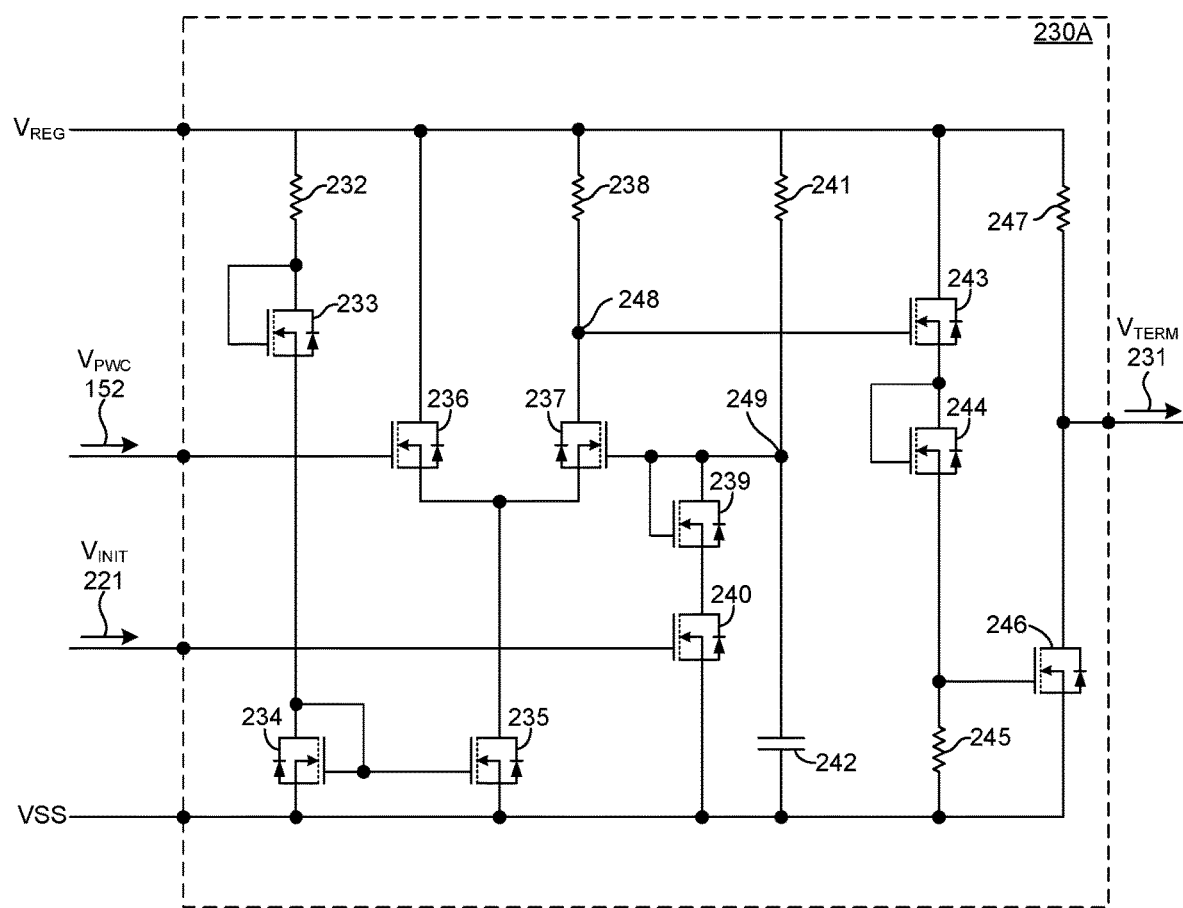
FIG. 8 depicts an embodiment of a pulse termination signal generator in further detail.

FIG. 8 depicts an embodiment 230A of pulse termination signal generator 230. Pulse termination signal generator 230 includes resistor 238 and FETs 236-237 configured as an operational amplifier. The output of the operational amplifier is coupled to the gate of FET 243. The operational amplifier receives $V_{PWC}$ as input at the gate of FET 236. In addition, the operational amplifier receives an input voltage 249 at the gate of FET 237. When the input voltage 249 exceeds the value of $V_{PWC}$, the value of output voltage 248 transitions to a low value. When the value of $V_{PWC}$ exceeds the value of input voltage 249, the value of output voltage 248 transitions to a high value. Input voltage 249 is the voltage of the RC circuit formed by resistor 241 and capacitor 242. $V_{INIT}$ is received at the gate of FET 240. When $V_{INIT}$ transitions to a low value (at the start of pulse), FET 240 effectively disconnects the RC circuit from VSS. This allows the RC circuit to begin to charge. FET 239 provides a nonzero starting voltage for the RC circuit. As the voltage of the RC circuit rises, eventually it exceeds the value of $V_{PWC}$, thus triggering the transition of output node 248. Since the voltage ramp rate of the RC circuit is constant, the delay until the transition of output voltage 248 is determined in part by the value of $V_{PWC}$. The larger the value of $V_{PWC}$, the longer the delay from pulse initiation before the generation of the termination signal, $V_{TERM}$. In this manner, the value of $V_{PWC}$ determines the pulse duration. Pulse termination signal generator 230 includes resistor 232 and FETs 233-235 configured as a current source for the operational amplifier structure. FETS 243 and 244 are configured to scale down the value of output voltage 248. Resistors 245 and 247 and FET 246 are configured to invert the scaled value of output voltage 248. The pulse termination signal, $V_{TERM}$, is provided at the drain of FET 246.

FIG. 10 depicts a simplified illustration of the changes in the pulse termination signal, $V_{TERM}$, generated by the pulse termination signal generator 230 in response to the pulse initiation signal, $V_{INIT}$ and the pulse width control signal, $V_{PWC}$. As depicted in FIG. 10, when $V_{INIT}$ goes low, the voltage of the RC circuit begins to ramp up. At the point in time when the voltage of the RC circuit exceeds $V_{PWC}$, $V_{TERM}$ goes high, holds for a period of time and then ramps down again. Note that the period of time, $T_{D-PULSE}$ between pulse initiation and the rising edge of $V_{TERM}$ determines the relative duration of the measurement pulse. At the falling edge of $V_{TRG}$, $V_{TERM}$ ramps down again so that the illumination driver IC 140 is ready to generate a pulse termination signal for the subsequent pulse. As depicted, in FIG. 10, the gate voltage, $V_{GATE}$, of main FET 141 is also depicted.

In another aspect, pulse termination signal generator 230 is configured to generate a pulse of programmable amplitude based on a value of an analog input signal. As depicted in FIG. 1, receiver IC 150 generates an analog amplitude control signal, $V_{AMP}$ 153, and communicates $V_{AMP}$ to illumination driver IC 140. In response, illumination driver IC 140 changes the pulse amplitude based on the received value of $V_{AMP}$.

Figure 9:
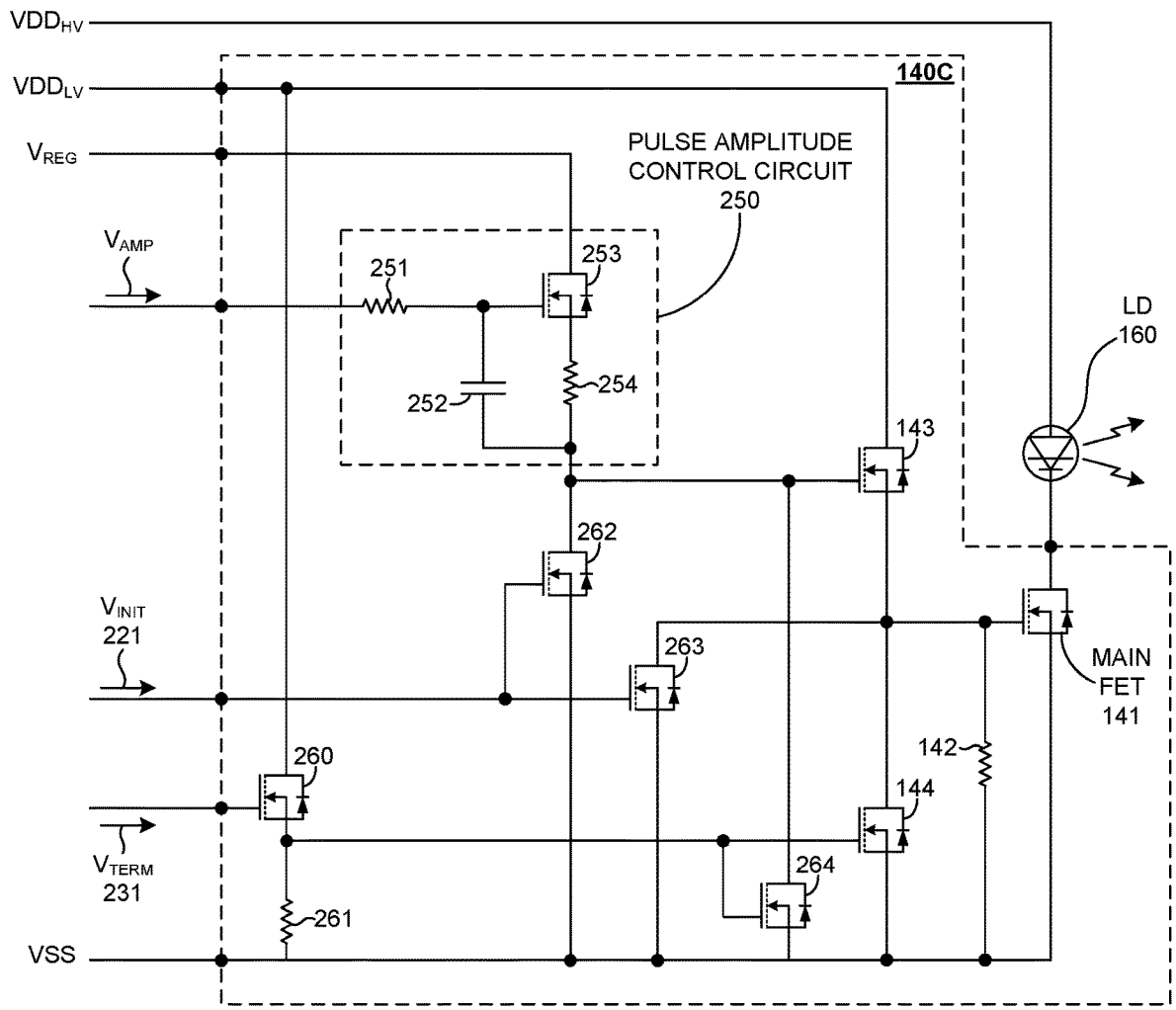
FIG. 9 depicts an embodiment of a pulse amplitude control circuit in further detail.

In the embodiment 140C of portions of illumination driver IC 140 depicted in FIG. 9, pulse amplitude control circuit 250 receives $V_{AMP}$, that controls the amplitude of the pulse generated by illumination source 160.

When $V_{INIT}$ goes low (signaling the start of a measurement pulse), FET 262 quickly releases the gate of main charge FET 143 from VSS, allowing main charge FET 143 to quickly charge. Similarly, FET 263 quickly releases the gate of main FET 141 from VSS, allowing main FET 141 to charge.

When $V_{TERM}$ goes high (signaling the end of a measurement pulse), FET 264 shorts the gate of charge FET 143 to VSS. Similarly, main discharge FET 144 shorts the gate of main FET 141 to VSS as quickly as possible to shut off current flow through illumination source 160.

FET 260 and resistor 261 provide a quick turn-on of main discharge FET 144 and discharge FET 264.

In addition, pulse amplitude control circuit 250 includes resistors 251 and 254, capacitor 252, and FET 253. Pulse amplitude control signal, $V_{AMP}$, is received on a first node of resistor 251. The second node of resistor 251 is coupled to the gate of FET 253 and to a first node of capacitor 252.

The drain of FET 253 is coupled to the regulated voltage supply, VREG. The source of FET 253 is coupled to a first node of resistor 254. The second node of resistor 254 is coupled to the second node of capacitor 252, which is coupled to the gate of main charge FET 143. In this manner, the pulse amplitude control circuit 250 controls the charge at the gate of main charge FET 143.

As depicted in FIG. 9, the value of $V_{AMP}$ controls the ramp rate of the pulse amplitude control circuit 250. As $V_{AMP}$ increases, the rate of charge accumulation at the gate of FET 253 increases. In turn, this increases rate of charge accumulation on the gate of main charge FET 143. This, in turn, increases the rate of charge accumulation on the gate of main FET 141, which accelerates the ramp rate of the resulting illumination pulse generated by illumination source 160. In this manner, $V_{AMP}$ controls the peak amplitude of the illumination pulse for a given pulse duration.

In another aspect, a master controller is configured to generate a plurality of pulse command signals, each communicated to a different integrated LIDAR measurement device. Each return pulse receiver IC generates a corresponding pulse trigger signal based on the received pulse command signal.

Figure 11:
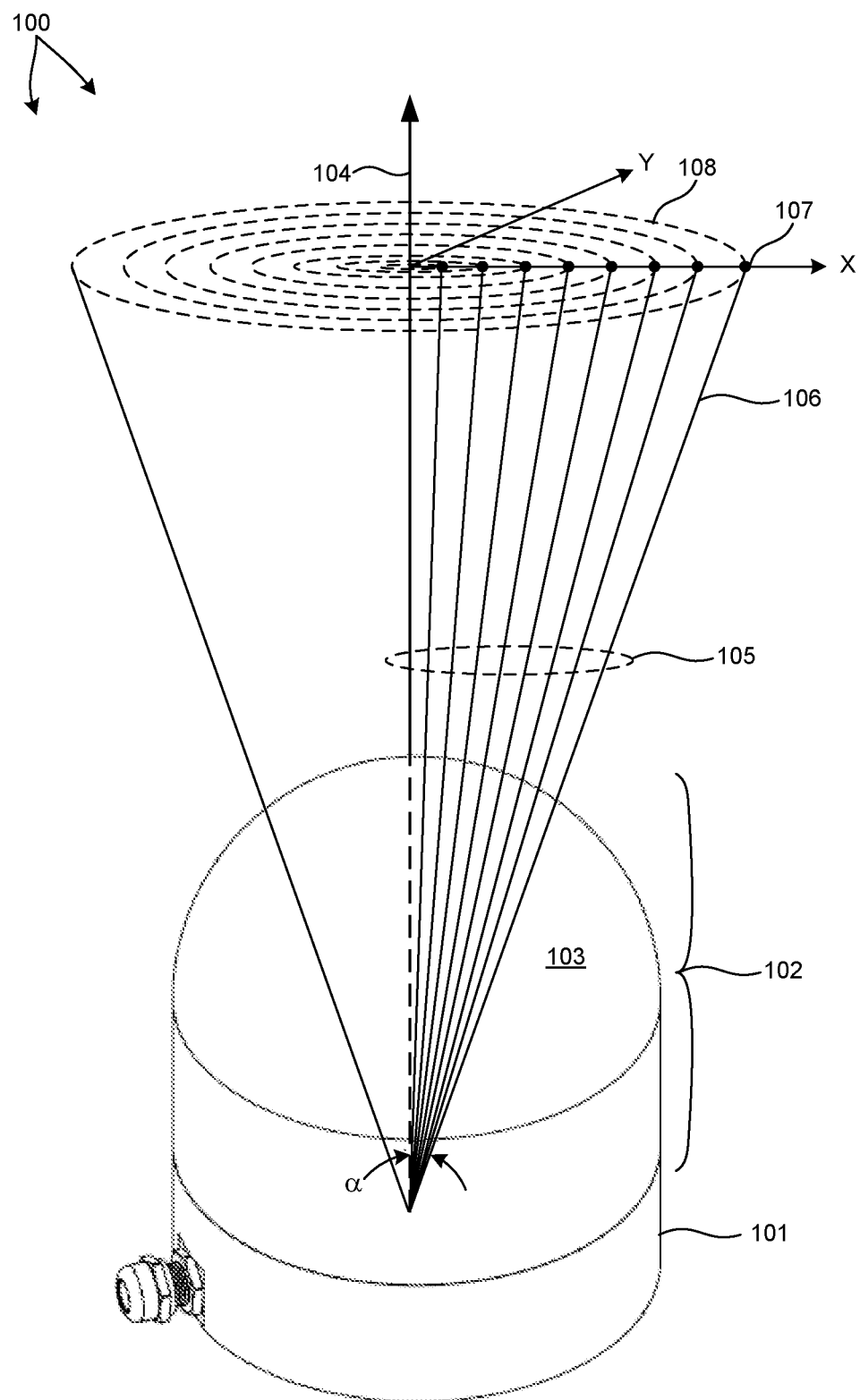
FIG. 11 is a diagram illustrative of an embodiment of a 3-D LIDAR system 100 in one exemplary operational scenario.
Figure 12:
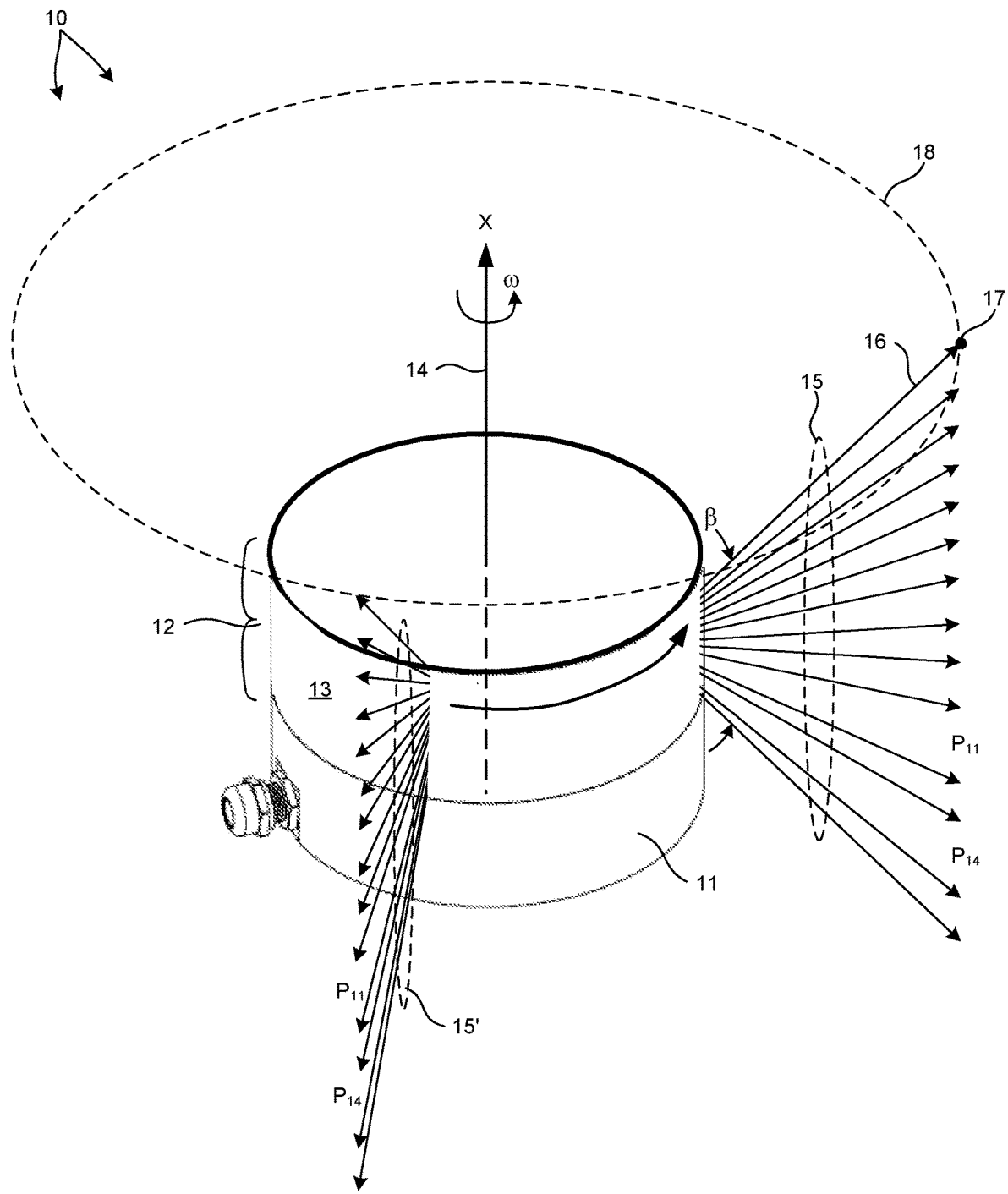
FIG. 12 is a diagram illustrative of another embodiment of a 3-D LIDAR system 10 in one exemplary operational scenario.
Figure 13:
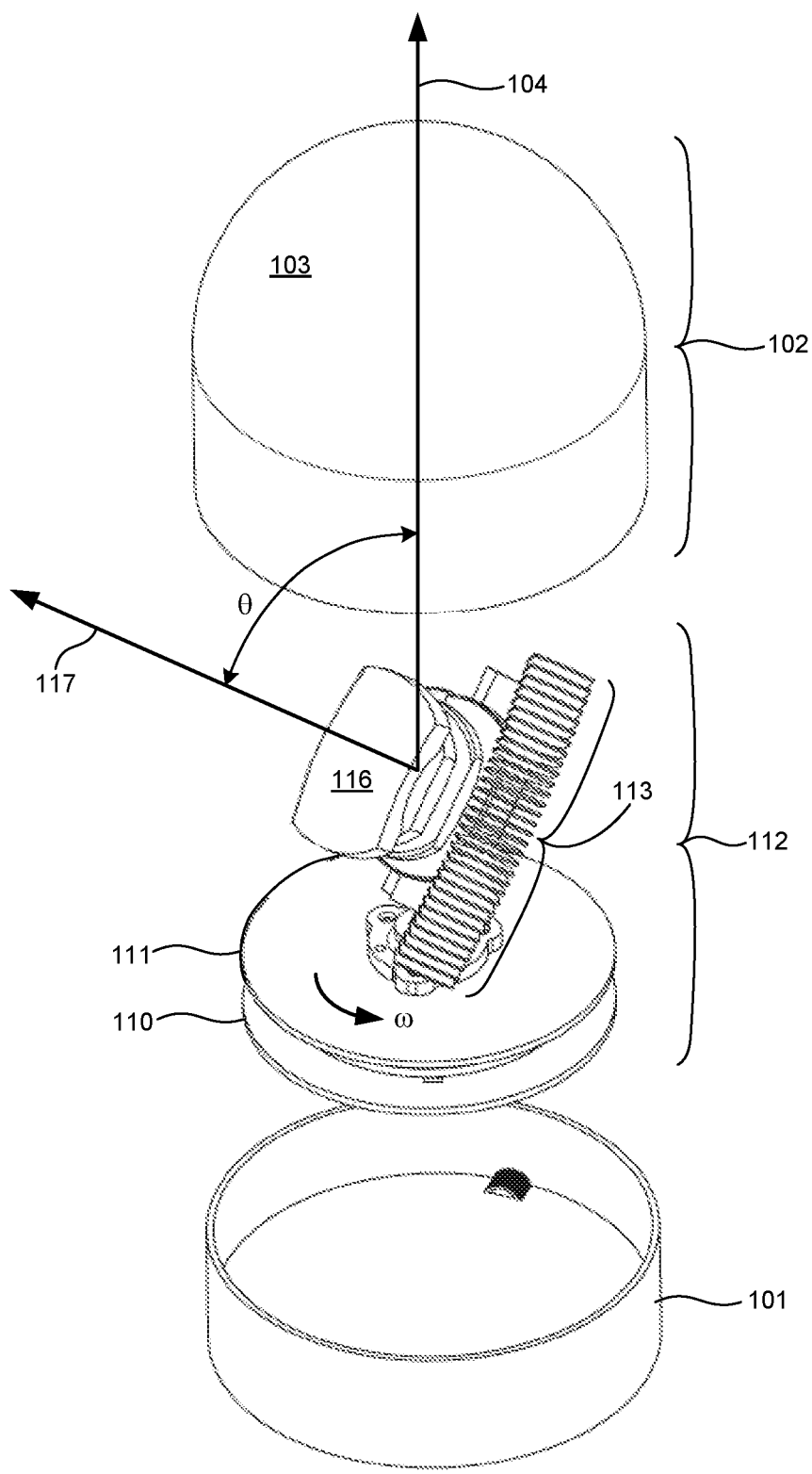
FIG. 13 depicts a diagram illustrative of an exploded view of 3-D LIDAR system 100 in one exemplary embodiment.

FIGS. 11-13 depict 3-D LIDAR systems that include multiple integrated LIDAR measurement devices. In some embodiments, a delay time is set between the firing of each integrated LIDAR measurement device. In some examples, the delay time is greater than the time of flight of the measurement pulse sequence to and from an object located at the maximum range of the LIDAR device. In this manner, there is no cross-talk among any of the integrated LIDAR measurement devices. In some other examples, a measurement pulse is emitted from one integrated LIDAR measurement device before a measurement pulse emitted from another integrated LIDAR measurement device has had time to return to the LIDAR device. In these embodiments, care is taken to ensure that there is sufficient spatial separation between the areas of the surrounding environment interrogated by each beam to avoid cross-talk.

FIG. 11 is a diagram illustrative of an embodiment of a 3-D LIDAR system 100 in one exemplary operational scenario. 3-D LIDAR system 100 includes a lower housing 101 and an upper housing 102 that includes a domed shell element 103 constructed from a material that is transparent to infrared light (e.g., light having a wavelength within the spectral range of 700 to 1,700 nanometers). In one example, domed shell element 103 is transparent to light having a wavelengths centered at 905 nanometers.

As depicted in FIG. 11, a plurality of beams of light 105 are emitted from 3-D LIDAR system 100 through domed shell element 103 over an angular range, a, measured from a central axis 104. In the embodiment depicted in FIG. 11, each beam of light is projected onto a plane defined by the x and y axes at a plurality of different locations spaced apart from one another. For example, beam 106 is projected onto the xy plane at location 107.

In the embodiment depicted in FIG. 11, 3-D LIDAR system 100 is configured to scan each of the plurality of beams of light 105 about central axis 104. Each beam of light projected onto the xy plane traces a circular pattern centered about the intersection point of the central axis 104 and the xy plane. For example, over time, beam 106 projected onto the xy plane traces out a circular trajectory 108 centered about central axis 104.

FIG. 12 is a diagram illustrative of another embodiment of a 3-D LIDAR system 10 in one exemplary operational scenario. 3-D LIDAR system 10 includes a lower housing 11 and an upper housing 12 that includes a cylindrical shell element 13 constructed from a material that is transparent to infrared light (e.g., light having a wavelength within the spectral range of 700 to 1,700 nanometers). In one example, cylindrical shell element 13 is transparent to light having a wavelengths centered at 905 nanometers.

As depicted in FIG. 12, a plurality of beams of light 15 are emitted from 3-D LIDAR system 10 through cylindrical shell element 13 over an angular range, β. In the embodiment depicted in FIG. 12, the chief ray of each beam of light is illustrated. Each beam of light is projected outward into the surrounding environment in a plurality of different directions. For example, beam 16 is projected onto location 17 in the surrounding environment. In some embodiments, each beam of light emitted from system 10 diverges slightly. In one example, a beam of light emitted from system 10 illuminates a spot size of 20 centimeters in diameter at a distance of 100 meters from system 10. In this manner, each beam of illumination light is a cone of illumination light emitted from system 10.

In the embodiment depicted in FIG. 12, 3-D LIDAR system 10 is configured to scan each of the plurality of beams of light 15 about central axis 14. For purposes of illustration, beams of light 15 are illustrated in one angular orientation relative to a non-rotating coordinate frame of 3-D LIDAR system 10 and beams of light 15' are illustrated in another angular orientation relative to the non-rotating coordinate frame. As the beams of light 15 rotate about central axis 14, each beam of light projected into the surrounding environment (e.g., each cone of illumination light associated with each beam) illuminates a volume of the environment corresponding the cone shaped illumination beam as it is swept around central axis 14.

FIG. 13 depicts an exploded view of 3-D LIDAR system 100 in one exemplary embodiment. 3-D LIDAR system 100 further includes a light emission/collection engine 112 that rotates about central axis 104. In the embodiment depicted in FIG. 13, a central optical axis 117 of light emission/collection engine 112 is tilted at an angle, θ, with respect to central axis 104. As depicted in FIG. 13, 3-D LIDAR system 100 includes a stationary electronics board 110 mounted in a fixed position with respect to lower housing 101. Rotating electronics board 111 is disposed above stationary electronics board 110 and is configured to rotate with respect to stationary electronics board 110 at a predetermined rotational velocity (e.g., more than 200 revolutions per minute). Electrical power signals and electronic signals are communicated between stationary electronics board 110 and rotating electronics board 111 over one or more transformer, capacitive, or optical elements, resulting in a contactless transmission of these signals. Light emission/collection engine 112 is fixedly positioned with respect to the rotating electronics board 111, and thus rotates about central axis 104 at the predetermined angular velocity, ω.

As depicted in FIG. 13, light emission/collection engine 112 includes an array of integrated LIDAR measurement devices 113. In one aspect, each integrated LIDAR measurement device includes a light emitting element, a light detecting element, and associated control and signal conditioning electronics integrated onto a common substrate (e.g., printed circuit board or other electrical circuit board).

Light emitted from each integrated LIDAR measurement device passes through a series of optical elements 116 that collimate the emitted light to generate a beam of illumination light projected from the 3-D LIDAR system into the environment. In this manner, an array of beams of light 105, each emitted from a different LIDAR measurement device are emitted from 3-D LIDAR system 100 as depicted in FIG. 11. In general, any number of LIDAR measurement devices can be arranged to simultaneously emit any number of light beams from 3-D LIDAR system 100. Light reflected from an object in the environment due to its illumination by a particular LIDAR measurement device is collected by optical elements 116. The collected light passes through optical elements 116 where it is focused onto the detecting element of the same, particular LIDAR measurement device. In this manner, collected light associated with the illumination of different portions of the environment by illumination generated by different LIDAR measurement devices is separately focused onto the detector of each corresponding LIDAR measurement device.

Figure 14:
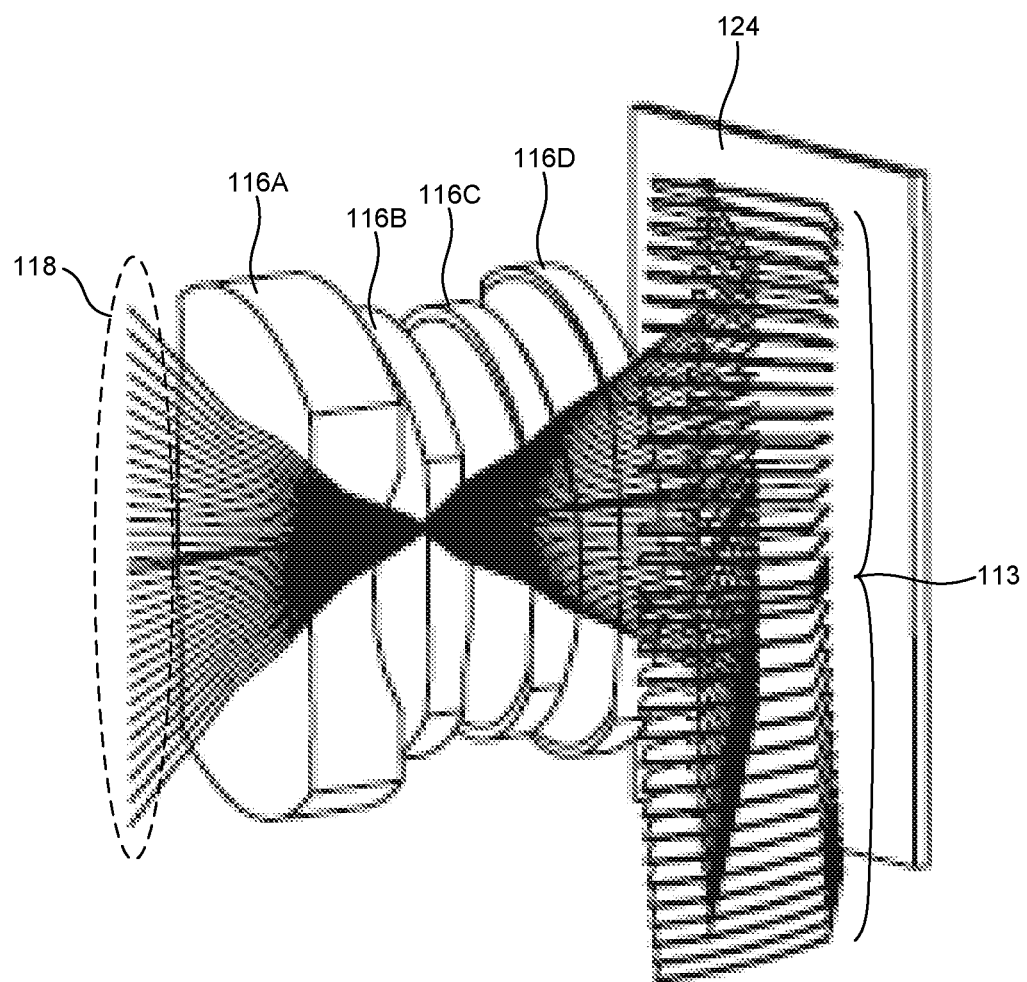
FIG. 14 depicts a view of optical elements 116 in greater detail.

FIG. 14 depicts a view of optical elements 116 in greater detail. As depicted in FIG. 14, optical elements 116 include four lens elements 116A-116D arranged to focus collected light 118 onto each detector of the array of integrated LIDAR measurement devices 113. In the embodiment depicted in FIG. 14, light passing through optics 116 is reflected from mirror 124 and is directed onto each detector of the array of integrated LIDAR measurement devices 113. In some embodiments, one or more of the optical elements 116 is constructed from one or more materials that absorb light outside of a predetermined wavelength range. The predetermined wavelength range includes the wavelengths of light emitted by the array of integrated LIDAR measurement devices 113. In one example, one or more of the lens elements are constructed from a plastic material that includes a colorant additive to absorb light having wavelengths less than infrared light generated by each of the array of integrated LIDAR measurement devices 113. In one example, the colorant is Epolight 7276A available from Aako BV (The Netherlands). In general, any number of different colorants can be added to any of the plastic lens elements of optics 116 to filter out undesired spectra.

Figure 15:
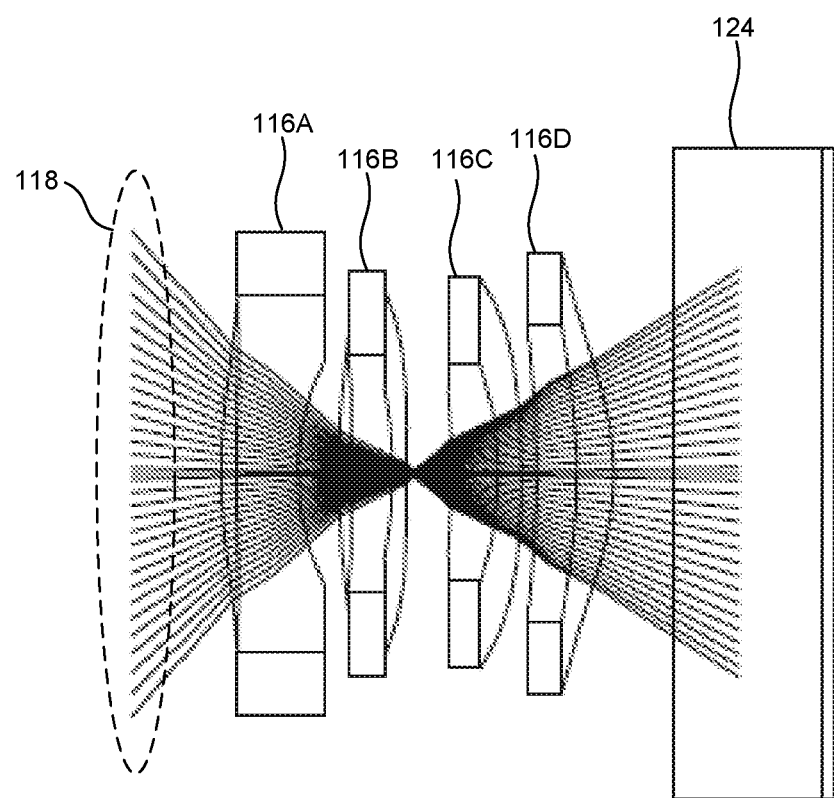
FIG. 15 depicts a cutaway view of optics 116 to illustrate the shaping of each beam of collected light 118.

FIG. 15 depicts a cutaway view of optics 116 to illustrate the shaping of each beam of collected light 118.

In this manner, a LIDAR system, such as 3-D LIDAR system 10 depicted in FIG. 2, and system 100, depicted in FIG. 11, includes a plurality of integrated LIDAR measurement devices each emitting a pulsed beam of illumination light from the LIDAR device into the surrounding environment and measuring return light reflected from objects in the surrounding environment.

In some embodiments, such as the embodiments described with reference to FIG. 11 and FIG. 12, an array of integrated LIDAR measurement devices is mounted to a rotating frame of the LIDAR device. This rotating frame rotates with respect to a base frame of the LIDAR device. However, in general, an array of integrated LIDAR measurement devices may be movable in any suitable manner (e.g., gimbal, pan/tilt, etc.) or fixed with respect to a base frame of the LIDAR device.

In some other embodiments, each integrated LIDAR measurement device includes a beam directing element (e.g., a scanning mirror, MEMS mirror etc.) that scans the illumination beam generated by the integrated LIDAR measurement device.

In some other embodiments, two or more integrated LIDAR measurement devices each emit a beam of illumination light toward a scanning mirror device (e.g., MEMS mirror) that reflects the beams into the surrounding environment in different directions.

In a further aspect, one or more integrated LIDAR measurement devices are in optical communication with an optical phase modulation device that directs the illumination beam(s) generated by the one or more integrated LIDAR measurement devices in different directions. The optical phase modulation device is an active device that receives a control signal that causes the optical phase modulation device to change state and thus change the direction of light diffracted from the optical phase modulation device. In this manner, the illumination beam(s) generated by the one or more integrated LIDAR devices are scanned through a number of different orientations and effectively interrogate the surrounding 3-D environment under measurement. The diffracted beams projected into the surrounding environment interact with objects in the environment. Each respective integrated LIDAR measurement device measures the distance between the LIDAR measurement system and the detected object based on return light collected from the object. The optical phase modulation device is disposed in the optical path between the integrated LIDAR measurement device and an object under measurement in the surrounding environment. Thus, both illumination light and corresponding return light pass through the optical phase modulation device.

Figure 16:
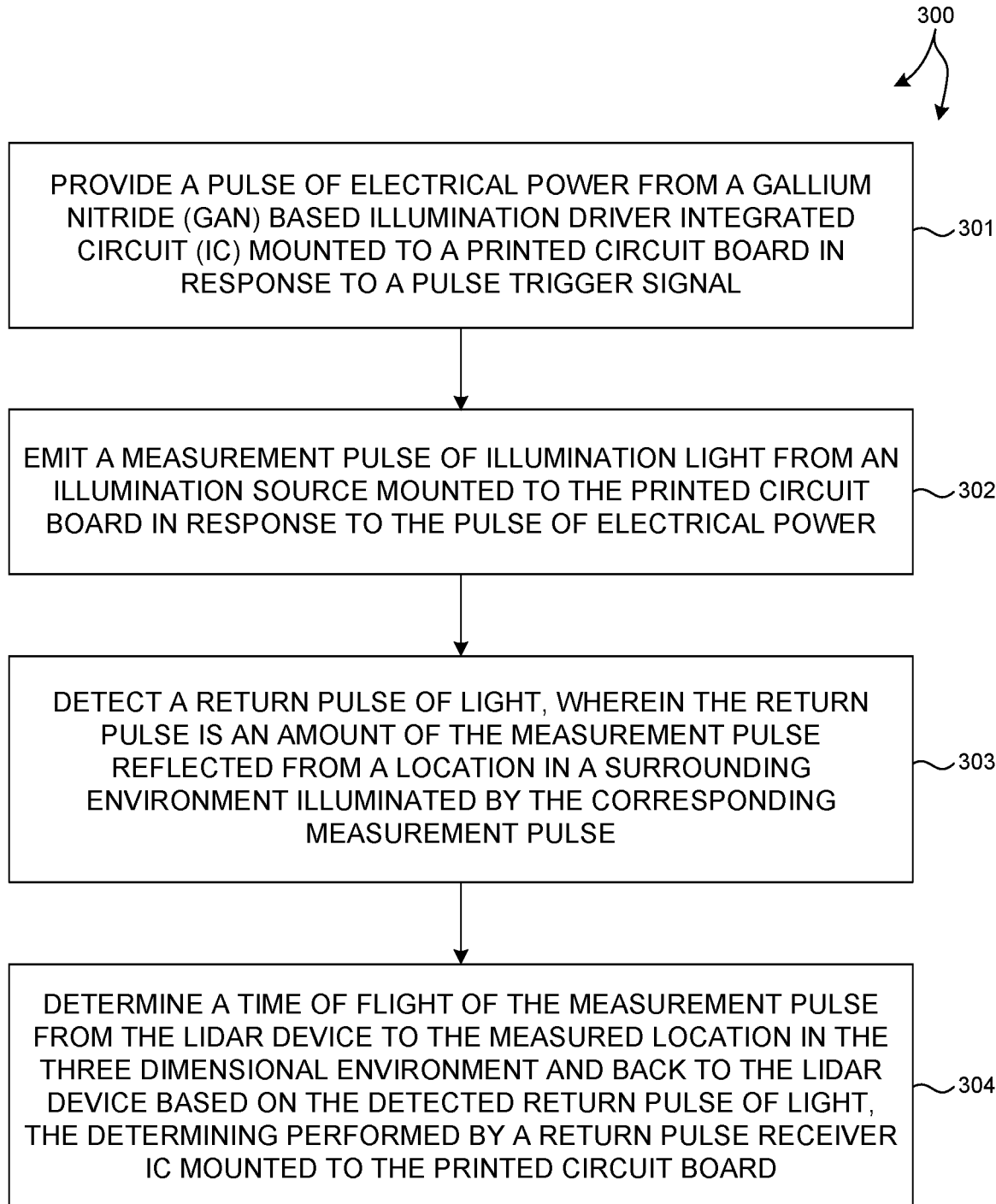
FIG. 16 depicts a flowchart illustrative of a method 300 of performing a LIDAR measurement by an integrated LIDAR measurement device in at least one novel aspect.

FIG. 16 illustrates a flowchart of a method 300 suitable for implementation by an integrated LIDAR measurement device as described herein. In some embodiments, integrated LIDAR measurement device 130 is operable in accordance with method 300 illustrated in FIG. 16. However, in general, the execution of method 300 is not limited to the embodiments of integrated LIDAR measurement device 130 described with reference to FIG. 1. These illustrations and corresponding explanation are provided by way of example as many other embodiments and operational examples may be contemplated.

In block 301, a pulse of electrical power is provided by a Gallium Nitride (GaN) based illumination driver integrated circuit (IC) mounted to a printed circuit board in response to a pulse trigger signal.

In block 302, a measurement pulse of illumination light is emitted in response to the pulse of electrical power from an illumination source mounted to the printed circuit board.

In block 303, a return pulse of light is detected. The return pulse is an amount of the measurement pulse reflected from a location in a surrounding environment illuminated by the corresponding measurement pulse.

In block 304, a time of flight of the measurement pulse from the LIDAR device to the measured location in the three dimensional environment and back to the LIDAR device is determined by return pulse receiver IC mounted to the printed circuit board based on the detected return pulse of light.

A computing system as described herein may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions implementing methods such as those described herein may be transmitted over a transmission medium such as a wire, cable, or wireless transmission link. Program instructions are stored in a computer readable medium. Exemplary computer-readable media include read-only memory, a random access memory, a magnetic or optical disk, or a magnetic tape.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A 3-D LIDAR system comprising:
   a board;
   one or more illumination sources mounted to the board, the one or more illumination sources configured to emit one or more beams of light over an angular range measured from a central axis through a transparent portion of a housing;
   an electrical power source mounted to the board; and
   one or more Gallium Nitride (GaN) based illumination driver integrated circuits (ICs) mounted to the board, each GaN based illumination driver IC electrically coupled to an illumination source via the board and to the electrical power source via the board;
   wherein each GaN based illumination driver IC comprises a power save control module, a GaN-based switch control circuit and a GaN-based switch, wherein the GaN-based switch control circuit is configured to control the GaN-based switch to selectively electrically couple an illumination source of the one or more illumination sources to the electrical power source in response to a pulse trigger signal, to cause the illumination source to emit a measurement pulse of illumination light, and wherein the power save control module is configured to supply a controlled amount of electrical power to the GaN-based switch control circuit based on the pulse trigger signal.

2. The LIDAR system of claim 1, wherein at least one GaN based illumination driver IC includes any of a pulse amplitude control circuit, a pulse termination generator, and a FET selection circuit.

3. The LIDAR system of claim 1, wherein at least one GaN based illumination driver IC includes a pulse initiation signal generator that generates a pulse initiation signal to the at least one GaN based illumination driver IC based on a pulse trigger signal.

4. The LIDAR system of claim 3, wherein at least one GaN based illumination driver IC includes a pulse termination signal generator that generates a pulse termination signal to the at least one GaN based illumination driver IC based on the pulse trigger signal, wherein a delay between the pulse initiation signal and the pulse termination signal is based on a pulse width control signal provided to the at least one GaN based illumination driver IC.

5. The LIDAR system of claim 3, wherein the at least one GaN based illumination driver IC includes a pulse amplitude control circuit that controls an amplitude of the measurement pulse of illumination light based on an amplitude control signal provided to the at least one GaN based illumination driver IC.

6. The LIDAR system of claim 1, further comprising:
   a photodetector mounted to the board, the photodetector configured to detect a return pulse of light and generate an output signal indicative of the detected return pulse, wherein the return pulse is reflected from a location in a surrounding environment illuminated by an amount of the measurement pulse; and
   a return pulse receiver mounted to the board, the return pulse receiver configured to determine a time of flight of the measurement pulse from the LIDAR device to the location in the surrounding environment and back to the LIDAR device based on the output signal, wherein the return pulse receiver generates the pulse trigger signal and communicates the pulse trigger signal to at least one GaN based illumination driver IC.

7. The LIDAR system of claim 6, further comprising a transimpedance amplifier, wherein the output signal is provided by the photodetector to the return pulse receiver via the transimpedance amplifier.

8. The LIDAR system of claim 1, wherein a spectral range of the illumination light corresponds to a range within infrared lights.

9. The LIDAR system of claim 8, wherein the spectral range includes light having wavelengths centred at 905 nanometers.

10. The LIDAR system of claim 9, further comprising the housing, the housing including:
    a lower housing; and
    an upper housing including the transparent portion, the transparent portion being transparent to the spectral range, wherein the transparent portion of the upper housing includes a dome shell element.

11. The LIDAR system of claim 10, wherein the transparent portion of the upper housing includes a cylindrical shell element.

12. A LIDAR measurement system, comprising:
    a plurality of integrated LIDAR measurement devices, each of said integrated LIDAR measurement devices comprising:
       an illumination source mounted to a printed circuit board;
       a Gallium Nitride (GaN) based illumination driver integrated circuit (IC) mounted to the printed circuit board, the GaN based illumination driver IC electrically coupled to the illumination source via the printed circuit board and to an electrical power source, wherein the GaN based illumination driver IC comprises a power save control module, a GaN-based switch control circuit and a GaN-based switch, wherein the GaN-based switch control circuit is configured to control the GaN-based switch to selectively couple the illumination source and the electrical power source in response to a pulse trigger signal, to cause the illumination source to emit a measurement pulse of illumination light, and wherein the power save control module is configured to supply a controlled amount of electrical power to the GaN-based switch control circuit based on the pulse trigger signal; and a return pulse receiver integrated circuit (IC) mounted to the printed circuit board, the return pulse receiver IC configured to determine a time of flight of the measurement pulse from the LIDAR device to a measured location in a multi-dimensional environment and back to the LIDAR device, wherein the return pulse receiver IC generates and communicates the pulse trigger signal to the GaN based illumination driver IC.

13. The LIDAR measurement system of claim 12, each of said integrated LIDAR measurement devices further comprising:

a master controller configured to generate a plurality of pulse command signals, each pulser command signal communicated to a different integrated LIDAR measurement device of the plurality of integrated LIDAR measurement devices, wherein each return pulse receiver IC generates the corresponding pulse trigger signal based on the respective pulse command signal.

14. The LIDAR measurement system of claim 12, further comprising a housing including:

a lower housing; and
an upper housing including a transparent portion transparent to a specific spectral range, the plurality of integrated LIDAR measurement devices being disposed within the housing.

15. A LIDAR measurement device, comprising:

an illumination source configured to provide a measurement pulse of illumination light;
a Gallium Nitride (GaN) based illumination driver integrated circuit (IC), the GaN based illumination driver IC electrically coupled to the illumination source via a printed circuit board, wherein the GaN based illumination driver IC comprises a power save control module, a GaN-based switch control circuit and a GaN-based switch, wherein the GaN-based switch control circuit is configured to control the GaN-based switch to cause the illumination source to provide the measurement pulse of illumination light in response to a pulse trigger signal, and wherein the power save control module is configured to supply a controlled amount of electrical power to the GaN-based switch control circuit based on the pulse trigger signal;
a photodetector configured to detect a first amount of the measurement pulse of illumination light due to crosstalk between the illumination source and the photodetector and to detect a valid return pulse of light reflected from a location in a surrounding environment illuminated by a second amount of the measurement pulse; and
a return pulse receiver circuit, the return pulse receiver circuit configured to measure directly a difference in time between (i) detection, by the photodetector, of the first amount of the measurement pulse due to crosstalk between the illumination source and the photodetector and (ii) detection, by the photodetector, of the valid return pulse of light.

16. The LIDAR measurement device of claim 15, further comprising a housing including:

a lower housing; and
an upper housing including a transparent portion transparent to a specific spectral range,
wherein the illumination source, the GaN based illumination driver IC, the photodetector, and the return pulse receiver circuit are disposed within the housing.

17. A LIDAR measurement device comprising:

an illumination source configured to provide a measurement pulse of illumination light;
a Gallium Nitride (GaN) based illumination driver integrated circuit (IC), the GaN based illumination driver IC electrically coupled to the illumination source, wherein the GaN based illumination driver IC comprises a power save control module, a GaN-based switch control circuit and a GaN-based switch, wherein the GaN-based switch control circuit is configured to control the GaN-based switch to cause the illumination source to provide the measurement pulse of illumination light in response to a pulse trigger signal, and wherein the power save control module is configured to supply a controlled amount of electrical power to the GaN-based switch control circuit based on the pulse trigger signal;
a photodetector configured to detect a first amount of the measurement pulse of illumination light due to crosstalk between the illumination source and the photodetector, and to detect a valid return pulse of light reflected from a location in a surrounding environment illuminated by a second amount of the measurement pulse; and
a return pulse receiver circuit, the return pulse receiver circuit configured to measure a difference in time between (i) detection, by the photodetector, of the first amount of the measurement pulse due to crosstalk between the illumination source and the photodetector and (ii) detection, by the photodetector, of the valid return pulse of light.

18. The LIDAR measurement device of claim 17, further comprising a housing including:

a lower housing; and
an upper housing including a transparent portion transparent to a specific spectral range,
wherein the illumination source, the GaN based illumination driver IC, the photodetector, and the return pulse receiver circuit are disposed within the housing.

19. A method comprising:

providing a printed circuit board;
mounting an illumination source to the printed circuit board;
mounting a Gallium Nitride (GaN) based illumination driver integrated circuit (IC) to the printed circuit board, wherein the GaN based illumination driver IC comprises a power save control module, a GaN-based switch control circuit and a GaN-based switch; and
coupling the GaN based illumination driver IC to the illumination source and an electrical power source, wherein the GaN-based switch control circuit is configured to control the GaN-based switch to selectively electrically couple the illumination source to the electrical power source in response to a pulse trigger signal, to cause the illumination source to emit a measurement pulse of illumination light, and wherein the power save control module is configured to supply a controlled amount of electrical power to the GaN-based switch control circuit based on the pulse trigger signal.

* * * * *